(12) United States Patent
Moslehi

(10) Patent No.: US 10,181,541 B2
(45) Date of Patent: Jan. 15, 2019

(54) SMART PHOTOVOLTAIC CELLS AND MODULES

(71) Applicant: Tesla, Inc., Palo Alto, CA (US)

(72) Inventor: Mehrdad M. Moslehi, Los Altos, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 14/426,921

(22) PCT Filed: Apr. 14, 2014

(86) PCT No.: PCT/US2014/034057
§ 371 (c)(1),
(2) Date: Mar. 9, 2015

(87) PCT Pub. No.: WO2014/169295
PCT Pub. Date: Oct. 16, 2014

(65) Prior Publication Data
US 2015/0236182 A1    Aug. 20, 2015

Related U.S. Application Data

(63) Continuation-in-part of application No. 14/072,759, filed on Nov. 5, 2013, now abandoned, and a
(Continued)

(51) Int. Cl.
*H01L 31/0475* (2014.01)
*H02S 40/36* (2014.01)
(Continued)

(52) U.S. Cl.
CPC ......... *H01L 31/0475* (2014.12); *H02S 40/34* (2014.12); *H02S 40/36* (2014.12);
(Continued)

(58) Field of Classification Search
CPC ......... H01L 31/0475; H01L 31/022441; H01L 31/0504; H01L 31/0725; H01L 31/02021;
(Continued)

(56) References Cited

U.S. PATENT DOCUMENTS 5,330,583 A    7/1994   Asai et al.
5,867,011 A    2/1999   Jo et al.
(Continued)

FOREIGN PATENT DOCUMENTS

DE          3005560 A1   8/1981
DE     102006052018 A1   5/2008
(Continued)

OTHER PUBLICATIONS

Kiefer, "High Efficiency n-type Emitter Wrap Through Silicon Solar cells", IEEE 2011.*
(Continued)

*Primary Examiner* — Matthew T Martin
(74) *Attorney, Agent, or Firm* — Howard IP Law Group

(57) ABSTRACT

A solar photovoltaic module laminate for electric power generation is provided. A plurality of solar cells are embedded within module laminate and arranged to form at least one string of electrically interconnected solar cells within said module laminate. A plurality of power optimizers are embedded within the module laminate and electrically interconnected to and powered with the plurality of solar cells. Each of the distributed power optimizers capable of operating in either pass-through mode without local maximum-power-point tracking (MPPT) or switching mode with local maximum-power-point tracking (MPPT) and having at least one associated bypass switch for distributed shade management.

33 Claims, 54 Drawing Sheets

Related U.S. Application Data continuation-in-part of application No. 13/682,674, filed on Nov. 20, 2012, now Pat. No. 9,293,619.

(60) Provisional application No. 61/811,736, filed on Apr. 13, 2013, provisional application No. 61/895,326, filed on Oct. 24, 2013, provisional application No. 61/722,620, filed on Nov. 5, 2012, provisional application No. 61/561,928, filed on Nov. 20, 2011.

(51) Int. Cl.
| | |
|---|---|
| *H02S 40/34* | (2014.01) |
| *H01L 31/02* | (2006.01) |
| *H01L 31/05* | (2014.01) |
| *H01L 31/0725* | (2012.01) |
| *H01L 31/0224* | (2006.01) |
| *H02S 40/32* | (2014.01) |

(52) U.S. Cl.
CPC ............ *H01L 31/02021* (2013.01); *H01L 31/022441* (2013.01); *H01L 31/0504* (2013.01); *H01L 31/0516* (2013.01); *H01L 31/0725* (2013.01); *H02S 40/32* (2014.12)

(58) Field of Classification Search
CPC ..... H01L 31/0516; H02S 40/34; H02S 40/36; H02S 40/32; Y02E 10/50
See application file for complete search history.

(56) References Cited

U.S. PATENT DOCUMENTS

| | | | |
|---|---|---|---|
| 5,972,732 A * | 10/1999 | Gee | H01L 31/048 |
| | | | 136/244 |
| 6,350,944 B1 | 2/2002 | Sherif et al. | |
| 7,759,158 B2 | 7/2010 | Bachrach et al. | |
| 7,839,022 B2 | 11/2010 | Wolfs | |
| 8,093,757 B2 | 1/2012 | Wolfs | |
| 8,427,009 B2 | 4/2013 | Shaver, II et al. | |
| 8,624,436 B2 | 1/2014 | Willis | |
| 8,922,061 B2 | 12/2014 | Arditi et al. | |
| 9,164,525 B2 * | 10/2015 | Erickson, Jr. | G05F 1/67 |
| 2003/0121514 A1 | 7/2003 | Davenport et al. | |
| 2004/0021445 A1 | 2/2004 | Harris | |
| 2005/0172995 A1 | 8/2005 | Rohrig et al. | |
| 2006/0290317 A1 | 12/2006 | McNulty et al. | |
| 2007/0113884 A1 * | 5/2007 | Kinsey | H01L 27/142 |
| | | | 136/252 |
| 2008/0121272 A1 | 5/2008 | Besser et al. | |
| 2008/0238195 A1 | 10/2008 | Shaver et al. | |
| 2008/0283115 A1 | 11/2008 | Fukawa et al. | |
| 2009/0014050 A1 * | 1/2009 | Haaf | H01L 31/02021 |
| | | | 136/244 |
| 2009/0078300 A1 | 3/2009 | Ang et al. | |
| 2010/0012172 A1 | 1/2010 | Meakin et al. | |
| 2010/0116325 A1 * | 5/2010 | Nikoonahad | H01L 27/1421 |
| | | | 136/251 |
| 2010/0224239 A1 | 9/2010 | Sharps et al. | |
| 2011/0068637 A1 | 3/2011 | Kiamilev et al. | |
| 2011/0308574 A1 * | 12/2011 | Vaidyanathan | H01L 31/0504 |
| | | | 136/246 |
| 2012/0062035 A1 | 3/2012 | Estibals et al. | |
| 2012/0085384 A1 | 4/2012 | Beitel et al. | |
| 2012/0098344 A1 * | 4/2012 | Bergveld | H01L 31/02021 |
| | | | 307/65 |
| 2012/0103402 A1 * | 5/2012 | Kline | H01L 31/02008 |
| | | | 136/252 |
| 2012/0152299 A1 | 6/2012 | Schultz-Wittmann et al. | |
| 2014/0060610 A1 | 3/2014 | Moslehi et al. | |

FOREIGN PATENT DOCUMENTS

| | | |
|---|---|---|
| JP | H05-160425 A | 6/1993 |
| JP | H07-302923 A | 11/1995 |
| JP | H11-65687 A | 3/1999 |
| JP | 2004-047585 A | 2/2004 |
| JP | 2005-268719 A | 9/2005 |
| JP | 2008-153429 A | 7/2008 |
| JP | 2011-096968 A | 5/2011 |
| WO | WO/2007/044385 | 4/2007 |
| WO | WO/2009/134939 | 11/2009 |
| WO | WO/2010/131204 | 11/2010 |
| WO | WO/2011/106902 | 9/2011 |
| WO | WO/2011/163437 | 12/2011 |
| WO | WO/2013/075144 | 5/2013 |
| WO | WO/2014/169295 | 10/2014 |

OTHER PUBLICATIONS

PCT International Search Report and Written Opinion dated Mar. 28, 2013 issued in PCT/US2012/066150.
PCT International Preliminary Report on Patentability dated May 20, 2014 issued in PCT/US2012/066150.
PCT International Search Report and Written Opinion dated Sep. 26, 2014 issued in PCT/US2014/034057.
PCT International Preliminary Report on Patentability dated Oct. 13, 2015 issued in PCT/US2014/034057.
EP Extended Search Report dated Jul. 15, 2015 issued in EP 12850632.6.

* cited by examiner

SMART PHOTOVOLTAIC CELLS AND MODULES

CROSS-REFERENCE TO RELATED APPLICATIONS

This application is the National Stage of International Application No. PCT/US14/34057 filed Apr. 14, 2014 which claims the benefit of U.S. Provisional Application Nos. 61/811,736 filed on Apr. 13, 2013 and 61/895,326 filed on Oct. 24, 2013 which are all hereby incorporated by reference in their entirety. This application is also a continuation in part of U.S. application Ser. No. 14/072,759 filed on Nov. 5, 2013 which claims the benefit of U.S. Provisional Application No. 61/722,620 filed Nov. 5, 2012 which are all hereby incorporated by reference in their entirety. This application is also a continuation in part of U.S. application Ser. No. 13/682,674 filed Nov. 20, 2012 which claims the benefit of U.S. Provisional Application No. 61/561,928 filed Nov. 20, 2011 which are all hereby incorporated by reference in their entirety.

FIELD OF THE INVENTION

The present disclosure relates in general to the fields of solar photovoltaic (PV) cells and modules, and more particularly on-cell electronics including power electronics for photovoltaic (PV) solar cells and modules.

BACKGROUND

Crystalline silicon photovoltaic (PV) modules currently, as of 2012, account for approximately over 85% of the overall global PV anneal demand market and cumulative installed capacity. The manufacturing process for crystalline silicon PV is based on the use of crystalline silicon solar cells, starting with mono-crystalline or multi-crystalline silicon wafers. Non-crystalline-silicon-based thin film PV modules (e.g., such as CdTe, CIGS, and amorphous silicon PV modules) may offer the potential for low cost manufacturing process, but typically provide much lower conversion efficiencies (in the range of single digit up to about 14%) for commercial thin-film PV modules compared to the mainstream crystalline silicon PV modules (which provide efficiencies in the typical range of 14% to over 20% for commercial crystalline silicon modules), and an unproven long-term track record of field reliability compared to the well-established crystalline silicon solar PV modules. The leading-edge crystalline silicon PV modules offer the best overall energy conversion performance, long-term field reliability, non-toxicity, and life cycle sustainability among various PV technologies. Moreover, recent progress and advancements have already driven the overall manufacturing cost of crystalline silicon PV modules to below $0.80/Wp. Disruptive monocrystalline silicon technologies—such as high-efficiency thin monocrystalline silicon solar cells fabricated based on the use of reusable crystalline silicon templates, thin (e.g., ≤50 µm) epitaxial silicon, thin silicon support using backplane lamination, and porous silicon lift-off technology—offer the promise of high-efficiency (with solar cell and/or module efficiencies of at least 20%) and PV module manufacturing cost at well below $0.50/Wp at mass manufacturing scale.

FIG. 1A is a schematic showing the equivalent circuit of a typical solar cell, such as a crystalline silicon solar cell or a compound semiconductor such as a GaAs solar cell. A solar cell may be represented as a current source, producing the photo-generation current shown as $I_L$ or also known as short circuit current Isc (the current that flows when the solar cell terminals are shorted), in parallel with a diode, also in parallel with a shunt resistance, and in series with a series resistance. The current produced by the current source depends on the level of sunlight irradiation power intensity on the solar cell. Undesirable dark current $I_D$ flows in the opposite direction of $I_L$ and is produced by recombination losses in the solar cell. Voltage across the solar cell when its terminals are open and not connected to any load is known as Voc or open-circuit voltage. A realistic solar cell equivalent circuit also includes the finite series resistance Rs and the finite shunt resistance $R_{SH}$, as shown in the circuit schematic of FIG. 1B. In an ideal solar cell, the series resistance $R_S$ is zero and the shunt resistance $R_{SH}$ is infinite. However, in actual realistic solar cells, the finite series resistance is due to the fact that a solar cell has parasitic series resistance components in its semiconductor and metallization (i.e., it is not a perfect conductor). Such parasitic resistance components, including semiconductor layer resistance and metallization resistance result in ohmic losses and power dissipation during the solar cell operation. The shunt resistance is caused by the undesirable leakage of current from one terminal to the other due to effects such as areal and edge shunting defects as well as other non-idealities in the solar cell. Again, an ideal solar cell would have a series resistance of zero and a shunt resistance of infinite resistance value.

FIG. 2A is again a schematic showing an equivalent circuit model of the solar cell, showing the current source, photo-generated current, and dark current (but not showing the parasitic series and shunt resistances), and FIG. 2B is a corresponding graph showing the typical current-voltage (IV) characteristics of a solar cell such as a crystalline silicon solar cell, with and without sunlight illumination on the cell. $I_L$ and $I_D$ are the desirable active photo-generated current and the undesirable dark current of the solar cell, respectively.

Solar cells used in PV modules are essentially photo-diodes—they directly convert the sunlight arriving at their surface to electrical power through photo-generated charge carriers in the semiconductor absorber. In a module with a plurality of solar cells, any shaded cells cannot produce the same amount of electrical power as the non-shaded cells within the PV module. Since all the cells in a typical PV module are usually connected in series strings, differences in power also cause differences in photo-generated electrical currents through the cells (shaded vs. non-shaded cells). If one attempts to drive the higher current of the series-connected non-shaded cells through a shaded (or partially shaded) cell which is also connected in series with the non-shaded cells, the voltage of the shaded cell (or partially shaded cell) actually becomes negative (i.e., the shaded cell effectively becomes reverse biased). Under this reverse bias condition the shaded cell is consuming or dissipating significant power instead of producing power. The power consumed and dissipated by the shaded or partially shaded cell will cause the cell to heat up, creating a localized hot spot where the shaded cell is located, and eventually possibly causing cell and module failure, hence creating major reliability failure problems in the field.

A standard (i.e., typically a PV module comprising 60 solar cells) crystalline silicon PV module is typically wired into three 20-cell series-connected strings within the module, each protected by an external bypass diode (typically either a pn junction diode or a Schottky diode) placed in an external junction box which are electrically connected in series to each other to form the final PV module assembly electrical interconnections and the output electrical leads of the series-connected module. As long as the PV module receives relatively uniform solar irradiation on its surface, the cells within the module will produce nearly equal amounts of power (and electrical current), with a cell maximum-power voltage or $V_{mp}$ on the order of approximately ~0.5 V to 0.6 V for most crystalline silicon PV modules. Hence, the maximum-power voltage or $V_{mp}$ across each strong of 20 cells connected in series will be approximately on the order of 10 to 12 V for a PV module using crystalline silicon cells. Under the uniform module illumination condition, each external bypass diode will have about −10 to −12 V reverse bias voltage across its terminals (while the module operates at its maximum-power point or MPP) and the bypass diode remains in the OFF state (hence, there no impact on the module power output by the reverse biased external bypass diodes in the junction box). In the case where a cell in a 20-cell string is partially or fully shaded, it produces less electrical power (and less current) than the non-shaded cells. Since the cells in the string are usually connected in series, the shaded solar cell becomes reverse biased and starts to dissipate electrical power, and therefore, would create localized hot spot at the location of the reverse-biased shaded cell, instead of producing power. Unless appropriate precautions are taken, the power dissipation and the resulting localized heating of the shaded cell may result in poor cell and module reliability due to various failure modes (such as failure of the reverse-biased shaded cell, failure of cell-to-cell interconnections, and/or failure of the module lamination materials such as the encapsulant and/or backsheet), as well as potential fire hazards in the installed PV systems.

Crystalline silicon modules often use external bypass diodes in order to eliminate the above-mentioned hot-spot effects caused by the partial or full shading of cells, and to prevent the resulting potential module reliability failures. Such hot-spot phenomena, which are caused by reverse biasing of the shaded cells, may permanently damage the affected PV cells and even cause fire hazards if the sunlight arriving at the surface of the PV cells in a PV module is not sufficiently uniform (for instance, due to full or even partial shading of one or more cells). Bypass diodes are usually placed on sub-strings of the PV module, typically one external bypass diode per sub-string of 20 solar cells in a standard 60-cell crystalline silicon solar module with three 20-cell sub-strings (this configuration may be one external bypass diode per sub-string of 24 solar cells in a 72-cell crystalline silicon solar module with three 24-cell sub-strings; many other configurations are possible for modules with any number of cells). This connection configuration with external bypass diodes across the series-connected cell strings prevents the reverse bias hot spots and enables the PV modules to operate with high reliability throughout their lifetime under various real life shading or partial shading and soling conditions. In the absence of cell shading, each cell in the string acts as a current source with relatively matched current values with the other cells in the strong, with the external bypass diode in the sub-string being reversed biased with the total voltage of the sub-string in the module (e.g., 20 cells in series create approximately about 10V to 12 volt reverse bias across the bypass diode in a crystalline silicon PV system). With shading of a cell in a strong, the shaded cell is reverse biased, turning on the bypass diode for the sub-string containing the shaded cell, thereby allowing the current from the good solar cells in the non-shaded sub-strings to flow in the external bypass circuit.

While the external bypass diodes (typically three external bypass diodes included in the standard mainstream 60-cell crystalline silicon PV module junction box) protect the PV module and cells in case of shading of the cells, they can also actually result in significant loss of power harvesting and energy yield for the installed PV systems.

FIGS. 3A and 3B are diagrams of representative 60-cell crystalline silicon solar module with three 20-cell sub-strings 2 (with 20 cells in each sub-string connected in series) connected in series, and three external bypass diodes 4 to protect the cells during shading or excessive partial shading of any cells in the module (FIG. 3A shows single-cell shading, shaded cell 6, and FIG. 3B shows multi-cell partial shading conditions, partially shaded row 8). As an example, FIG. 3A shows a 60-cell module with 1 shaded cell in the bottom row (one 20-cell sub-string affected by shading) and FIG. 3B shows a 60-cell module with 6 partially shaded cells in the bottom row (three 20-cell sub-strings affected by shading). If one or more cells are shaded (or partially shaded to a significant degree of shading) in a sub-string (as shown in FIG. 3A), the bypass diode for the sub-string with the shaded cell(s) is activated and shunts the entire sub-string, thus both protecting the shaded cell(s) by preventing the hot spots and also reducing the effective module power output by about ⅓ (if only one sub-string out of three is affected by shading). If at least one cell per sub-string is shaded (as shown in FIG. 3B), all three bypass diodes are activated and shunt the entire module, thus preventing extraction of any power from the module when there is at least one shaded cell in each of the three 20-cell sub-strings.

As an example, a typical external PV module junction box may house three external bypass diodes in a 60-cell crystalline silicon solar module. The external junction box and related external bypass diodes contribute to a portion of the overall PV module Bill of Materials (BOM) cost and may contribute about 10% of the PV module BOM cost (i.e., as a percentage of the PV Module BOM cost excluding the cost of solar cells). Moreover, the external junction box may also be a source of field reliability failures and fire hazards in the installed PV systems. While most current crystalline silicon PV modules predominantly use external junction boxes with external bypass diodes placed in the junction box, there have been some examples of PV modules with front-contact cells placing and laminating the three bypass diodes directly within the PV module assembly, but separate from the front-contact solar cells, during the module lamination process (however, still using one bypass diode per 20-cell sub-string of front-contact cells). This example still has the limitations of external bypass diodes, i.e., even when a single cell is shaded the bypass diode shunts the entire substring of cells with the shaded cell within the sub-string thus reducing the power harvesting and energy yield capability of the installed PV system.

One known method to minimize the reliability failure effects of shading on a module in a series string of modules is to use bypass diodes across modules connected in series, the effect of which is shown in FIGS. 4A and 4B and an example circuit is depicted in FIG. 5. This is in effect the same as the modules with external bypass diodes within each module junction box. FIG. 4A shows a non-shaded current path for a solar cell module series and FIG. 4B shows the same solar cell module series with one module shaded and a bypass diode providing an alternative current path. And FIG. 5 is a schematic circuit model diagram of series-connected solar cells with an external bypass diode used in a module sub-string or string (each solar cell shown with its equivalent circuit diagram). If none of the cells are shaded, the bypass diode remains in the reverse bias state and the solar cell string operates normally, contributing fully to the solar module power generation. If any of the cells are partially or fully shaded, the shaded cell is reverse biased and the bypass diode is forward biased, hence, minimizing the possibility of a hot spot or damage to the shaded cell. In other words, when a module becomes shaded its bypass diode becomes forward biased and conducts current preventing performance degradation and reliability problems in the series string of modules. The bypass diode holds the voltage of the entire shaded module (or a sub-string with at least one shaded cell) to a small negative voltage (e.g., −0.5V to 0.7V) limiting overall power reduction in the module string array output.

FIG. 6 is a graph showing the current-voltage (I-V) characteristics of a crystalline solar cell with and without a bypass diode (example shown with a pn junction bypass diode). The bypass diode limits the maximum reverse bias voltage applied across a shaded solar cell to no more than the turn-on forward bias voltage of the bypass diode.

FIG. 7 is a diagram showing an example of a crystalline silicon PV module similar to that of FIGS. 4 and 5 with one shaded cell per 20-cell sub-string within a 60-cell module (such as shaded cell 10, three cells are shaded total) wherein the three shaded cells in the three 20-cell sub-strings result in the elimination of solar PV power provided by the module since all three 20-cell sub-strings are shunted by the bypass diodes to protect the shaded cells. Using an arrangement of one external bypass diode per 20-cell sub-string, the result of having three shaded cells in the three 20-cell sub-strings is that the power extracted from the PV module drops to zero even though only 3/60 of the module (or 3 out of 60 cells) is affected by shading. Again, this type of known PV module arrangement with external bypass diodes results in significant energy yield and power harvesting penalty for the installed PV systems in the field.

In crystalline silicon PV system installations with multiple module strings, the module shading effects and their detrimental impact on power harvesting and energy yield may be much larger than the examples shown above with a single series string of modules. In PV systems with multiple parallel strings of series connected module strings, the parallel strings must produce approximately the same voltage as one another (i.e., the voltages of parallel strings must be matched). As a result, the electrical constraint of having all module strings connected in parallel operating at approximately the same voltage does not allow a shaded string to activate its bypass diodes. Therefore, in many cases, shade on PV modules in one of the strings may actually reduce the power produced by the entire string. As a representative example, consider one non-shaded PV module string and one PV module string that is shaded as described in the previous example above. A Maximum-Power-Point-Tracking (MPPT) capability will enable the production of full power from the first PV module string and the production of 70% of full power from the second PV module string. In this way, both strings reach the same voltage (the currents from the parallel strings are additive at the same module string voltage for the parallel connected strings of series-connected modules). Therefore, in this example and using a centralized DC-to-AC inverter with centralized MPPT, the power produced by the PV module array would be 85% of the maximum possible power without any module shading.

FIGS. 8 and 9 are diagrams showing two examples of PV system installations. FIG. 8 shows example of a 3×6 array of PV modules (each with 50 W output) with bypass diodes connected to produce 600 V, 900 W PV output. FIG. 9 shows a series connection of 3 PV modules with bypass diodes and a blocking diode along with a charging battery. In conventional modules, module strings connected in series and in parallel may typically use bypass and blocking diodes. However, similar to previously described examples, these representative PV module installations suffer from the power harvesting limitation and reduced energy yield of the installed PV system due to the problems outlined earlier.

Another representative example of the monolithic integration of a bypass diode with a front-contact, compound semiconductor (III-V), multi junction solar cell for Concentrator PV (or CPV) applications. FIG. 10 is a diagram showing an example of monolithic integration of a bypass diode with a multi junction compound semiconductor CPV cell. This example shows a compound semiconductor Schottky diode used as monolithically integrated bypass diode on the same germanium (Ge) substrate as a compound semiconductor, multi junction solar cell for CPV applications. In this example, the Schottky bypass diode and the compound semiconductor, multi junction solar cell are both on the same side (top side) of the solar cell, and have different material layer stacks, thereby making the solar cell fabrication process much more complicated and costly (hence, such embodiment only demonstrated for the CPV application in which the CPV cells are quite expensive). As a result of monolithic integration of the Schottky bypass diode with the solar cell on the same expensive germanium substrate, the overall process complexity and cost are substantially and further increased while incurring an effective solar cell and solar panel efficiency penalty due to the integration of the Schottky bypass diode on the same side as the active sunnyside of the cell. This monolithic integration of the bypass Schottky diode on a front-contact compound semiconductor multi junction solar cell requires different stacks of material layers in the solar cell and in the bypass switch, hence, substantially complicating the overall monolithic solar cell processing, increasing the number of solar cell fabrication process steps, and raising its manufacturing cost. While such significant added processing complexity and cost increase for fabrication of the solar cell may be acceptable in a CPV solar cell, it cannot be economically viable in a non-very high concentration-CPV solar cell such as in crystalline silicon solar cells. FIG. 11 is a diagram showing an example of monolithic integration of a bypass diode with a multi junction compound semiconductor CPV cell. This example shows a pn junction diode used as monolithically integrated bypass diode on the same germanium (Ge) substrate as a compound semiconductor, multi junction solar cell. In this example, the pn junction bypass diode and the compound semiconductor, multi junction solar cell are both on the same side (top side) of the solar cell, and have different material stacks thereby making the solar cell fabrication process much more complicated and costly (hence, such embodiment only demonstrated for the CPV application in which the CPV cells are quite expensive). As a result of monolithic integration of the pn junction bypass diode with the solar cell on the same expensive germanium substrate, the overall process complexity and cost are and further increased while incurring an effective solar cell and solar panel efficiency penalty due to the integration of the bypass diode on the same side as the active sunnyside of the cell. Again, this monolithic integration of the bypass pn junction diode on a front-contact compound semiconductor multi junction solar cell requires different stacks of material layers in the solar cell and in the bypass switch, hence, substantially complicating the overall monolithic solar cell processing, increasing the number of solar cell fabrication process steps, and raising its manufacturing cost. While such significant added processing complexity and cost increase for fabrication of the solar cell may be acceptable in a CPV solar cell, it cannot be economically viable in a non-very high concentration-CPV solar cell such as in crystalline silicon solar cells.

In general, while the monolithic integration of the bypass diode (Schottky diode or pn junction diode) as shown on an expensive multi junction solar cell for very high concentration CPV applications may be acceptable for that particular application despite the extra cost and added manufacturing process complexity of the monolithic integration with the solar cell, the approaches demonstrated for the expensive compound semiconductor multi junction solar cells would be prohibitively too expensive and not acceptable for mainstream flat-panel (non-concentrating or low to medium concentration) solar PV cells and modules. Also, as noted previously, because the method of monolithic integration of the bypass diode consumes area otherwise used by the solar cell it reduces the effective sunlight absorption and hence the effective cell efficiency due to loss of sunlight absorption area.

Various solutions have been attempted to provide power harvesting and energy yield enhancement capability as compared to the more conventional capabilities of module-level DC-to AC micro-inverter power optimizer or module-level DC-to-DC converter power optimizer. One such technology utilizes programmable interconnects between the cells within the module in order to increase the energy yield of the cell-based PV module, for example Adaptive Solar Module (ASM) technology from Emphasis Energy. In some instances, this may enable a higher level of PV energy harvesting in the case of module shading compared to more traditional MPPT power optimizers. However, this technology utilizes a module level/external converter box (micro-inverter or DC-to-DC converter) and associated interconnects technology which may cost around $30 to over $100 per PV module. The module level converter box provides energy conversion from DC to DC or from DC to AC and may be built into the PV module assembly to provide reconfigurable or programmable cell interconnections within the module. However, the module level converter box is not and cannot be integrated with the individual cells, such as on cell backsides, and assembled with the individual cells.

BRIEF SUMMARY OF THE INVENTION

Therefore, a need has arisen for back contact solar cells having electronics that provide increased power harvesting and energy yield improvements. In accordance with the disclosed subject matter, power harvesting systems are provided which substantially eliminates or reduces disadvantages associated with previously developed solar cell and module power harvesting systems.

According to one aspect of the disclosed subject matter, a solar photovoltaic module laminate for electric power generation is provided. A plurality of solar cells are embedded within module laminate and arranged to form at least one string of electrically interconnected solar cells within said module laminate. A plurality of power optimizers are embedded within the module laminate and electrically interconnected to and powered with the plurality of solar cells. Each of the distributed power optimizers capable of operating in either pass-through mode without local maximum-power-point tracking (MPPT) or switching mode with local maximum-power-point tracking (MPPT) and having at least one associated bypass switch for distributed shade management.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings in which like reference numerals indicate like features and wherein:

FIGS. 32A through 37A are cell level schematic circuit diagrams showing multiple embodiments relating to MPPT power optimizer, Inductor/Capacitor, and bypass switch components;

FIGS. 32B through 37B are module level schematic circuit diagrams of the cells of FIGS. 32A through 37A, respectively;

DETAILED DESCRIPTION

Figure 1B:
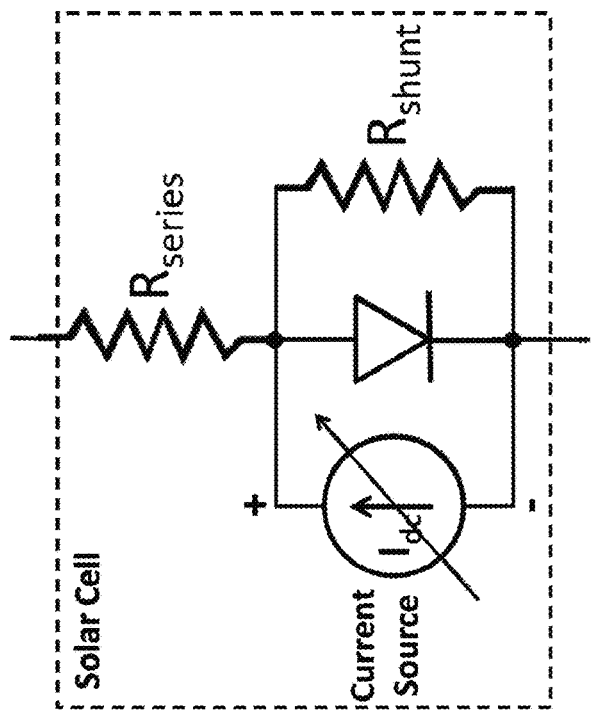
FIGS. 1A and 1B are circuit schematics showing the equivalent circuit diagram for a solar PV cell.
Figure 1A:
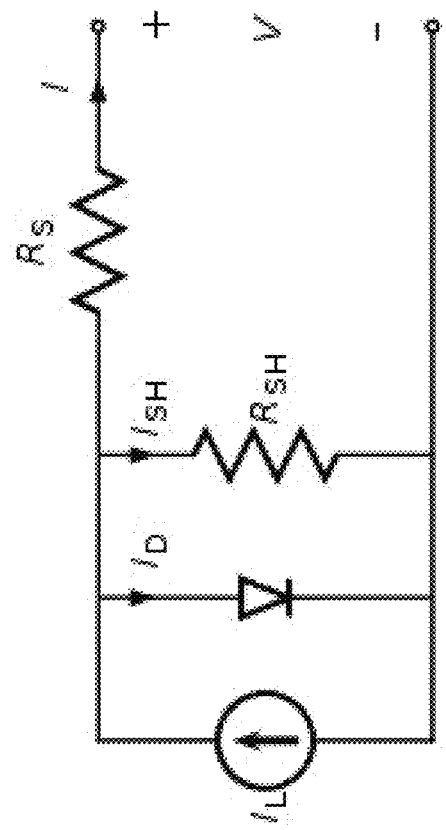
Figure 2B:
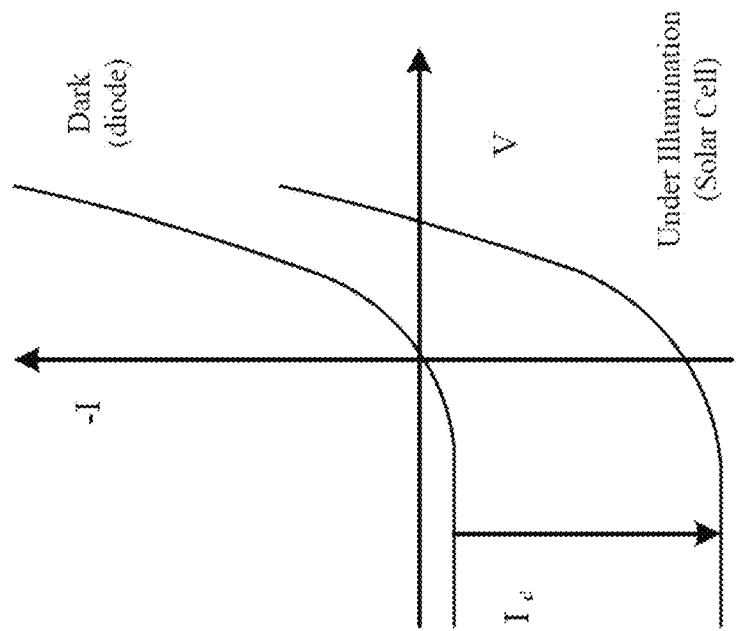
FIG. 2A is a schematic showing an equivalent circuit model of an ideal solar cell (no series or shunt resistances shown) and FIG. 2B is a corresponding graph showing the current-voltage (IV) characteristics of a solar cell under dark and sunlight illumination conditions.
Figure 2A:
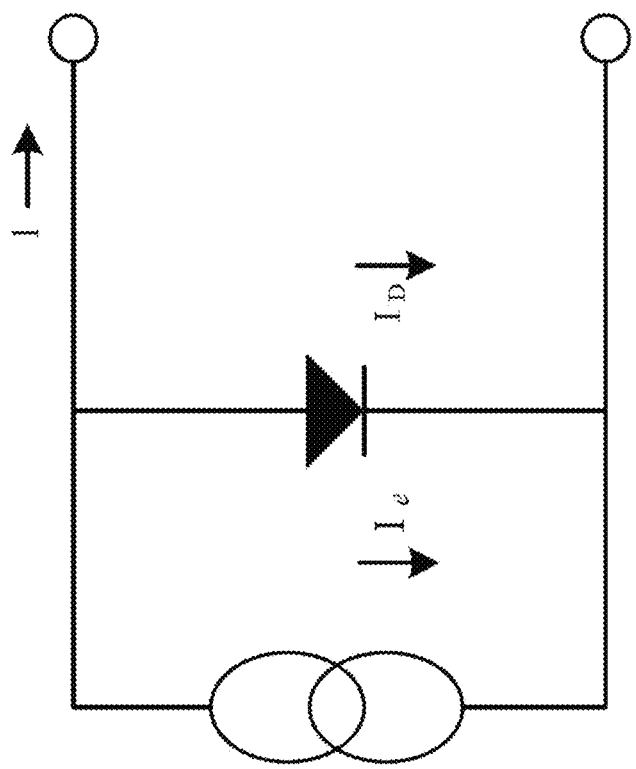
Figure 3B:
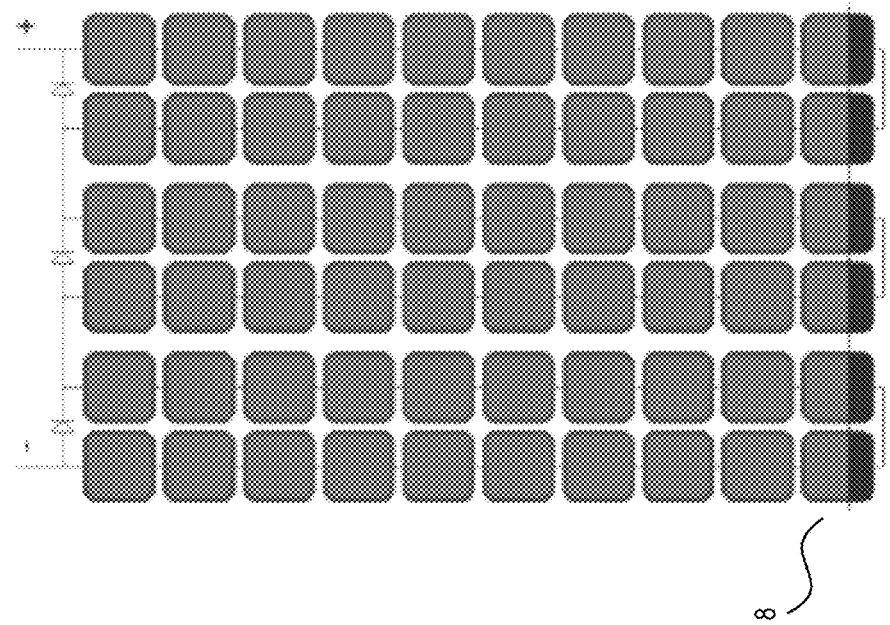
FIGS. 3A and 3B are diagrams of a typical 60-cell crystalline silicon solar module with one shaded and several partially shaded cells, respectively.
Figure 3A:
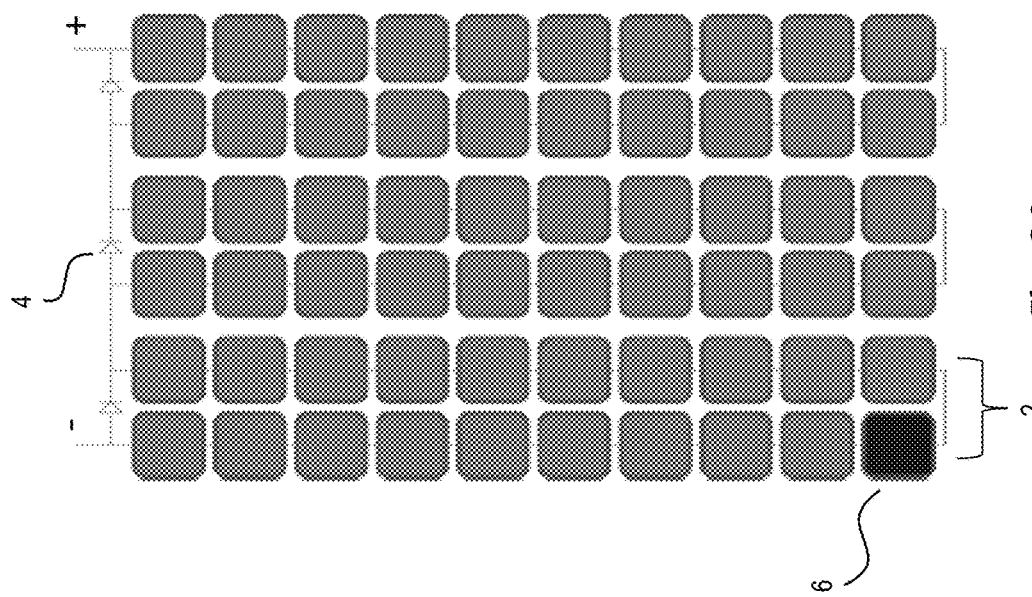
Figure 4B:
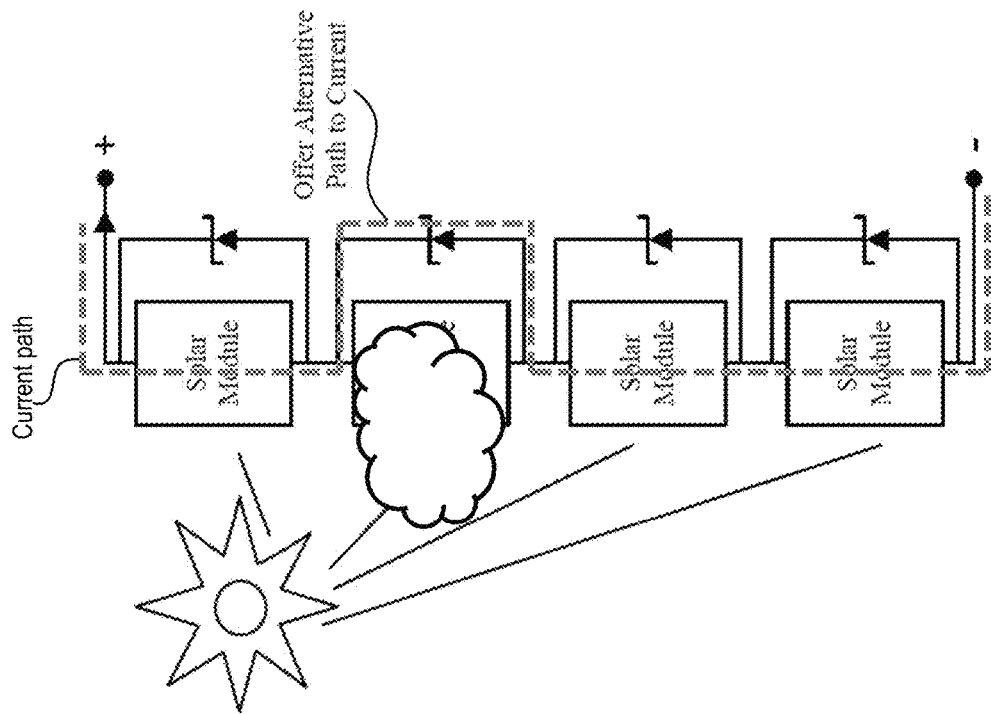
FIG. 4A is a diagram showing a non-shaded current path for a solar cell module series and FIG. 4B is a diagram showing the same solar cell module series with one module shaded and a bypass diode providing an alternative bypass current path.
Figure 4A:
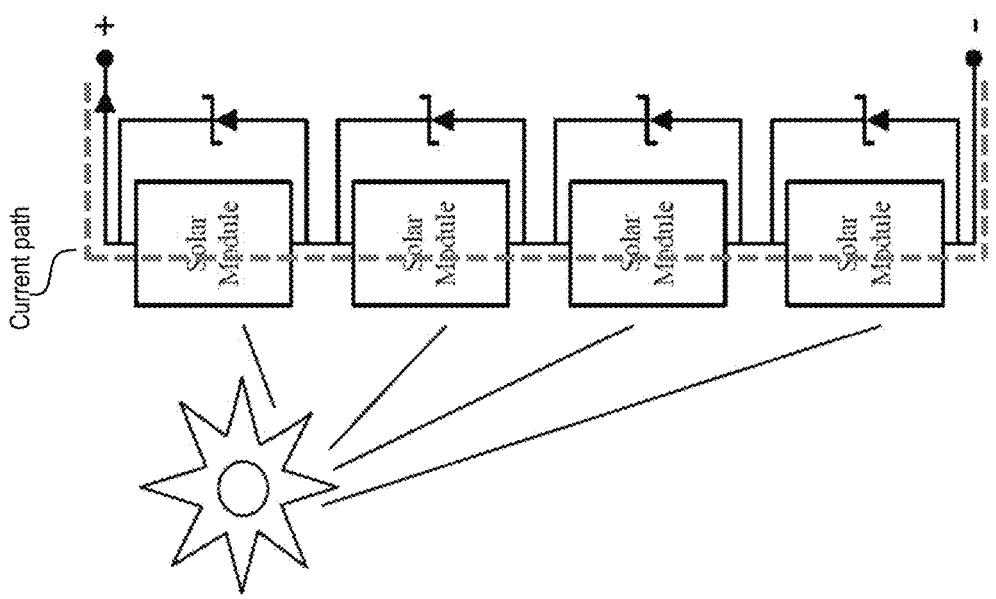

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

And although the present disclosure is described with reference to specific embodiments, such as back contact solar cells using monocrystalline silicon substrates and other described fabrication materials, one skilled in the art could apply the principles discussed herein to front contact cells, other materials including semiconductor materials (such as gallium arsenide, germanium, etc.), technical areas, and/or embodiments without undue experimentation.

As noted and described above, current state-of-the-art solar cell protection and hot spot prevention providing reliable module operation in presence of shading as well as maximum power extraction solutions in known crystalline silicon (or other cell-based) PV systems are often based on using one or a combination of the following: bypass diodes, most commonly one external bypass diode per one substring of series-connected solar cells in a PV module (typically three external bypass diodes are placed in an external module junction box per crystalline silicon PV module); maximum power point tracking (MPPT) at the module level using external one external micro-inverter (or alternatively one DC-to-DC converter) per PV module; and, programmable interconnect technology between the cells within the module in order to increase the energy yield of the cell-based PV module.

Figure 7:
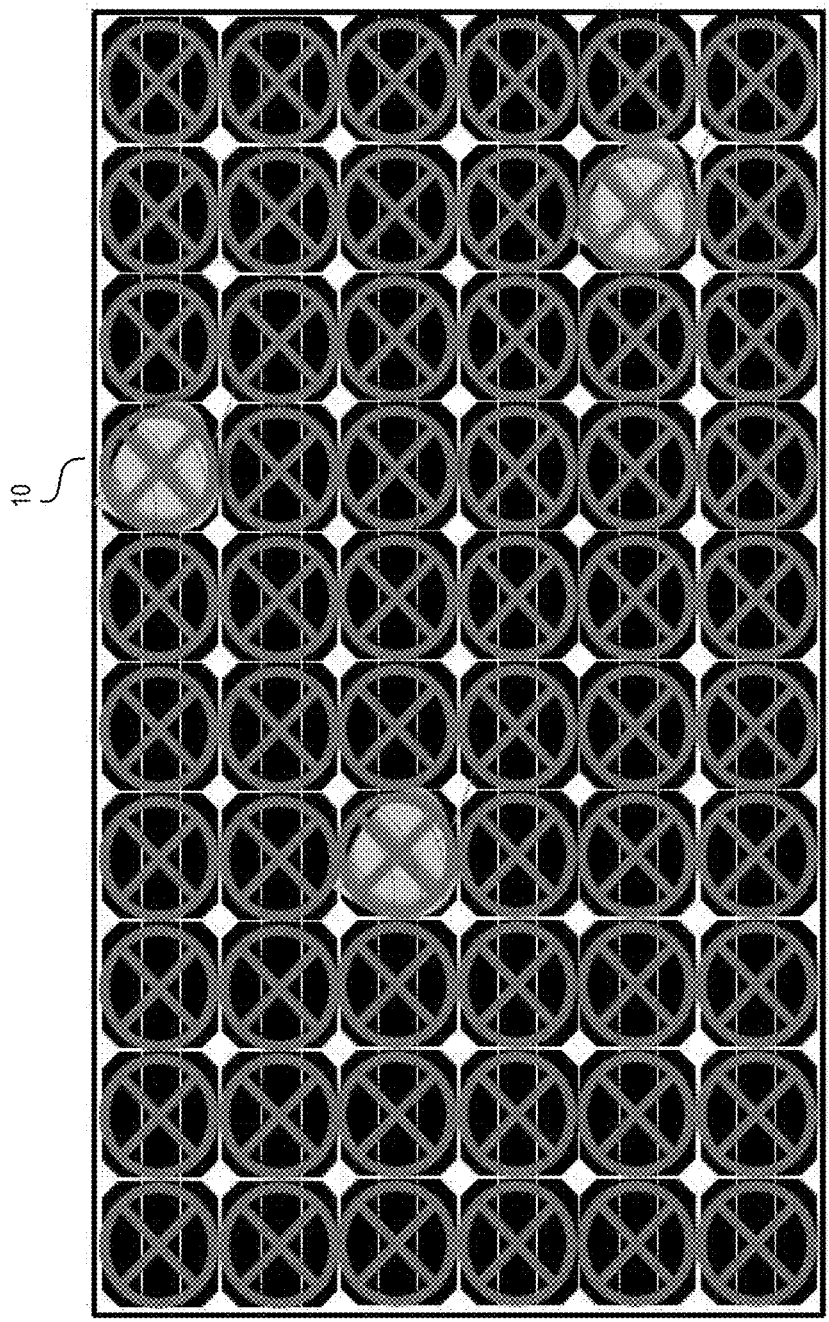
FIG. 7 is a diagram showing an example of a crystalline silicon PV module with three shaded cells on different sub-strings of the series-connected solar cells.
Figure 8:
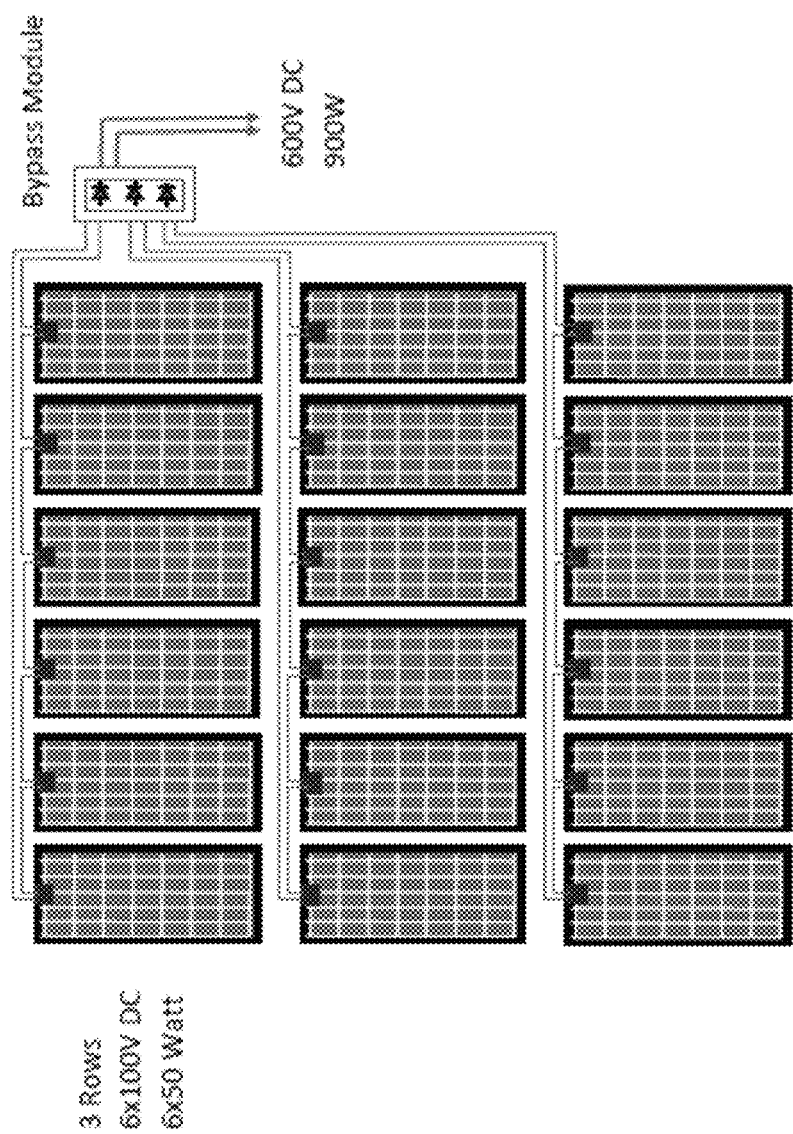
FIGS. 8 and 9 are diagrams showing two examples of PV system installations.
Figure 9:
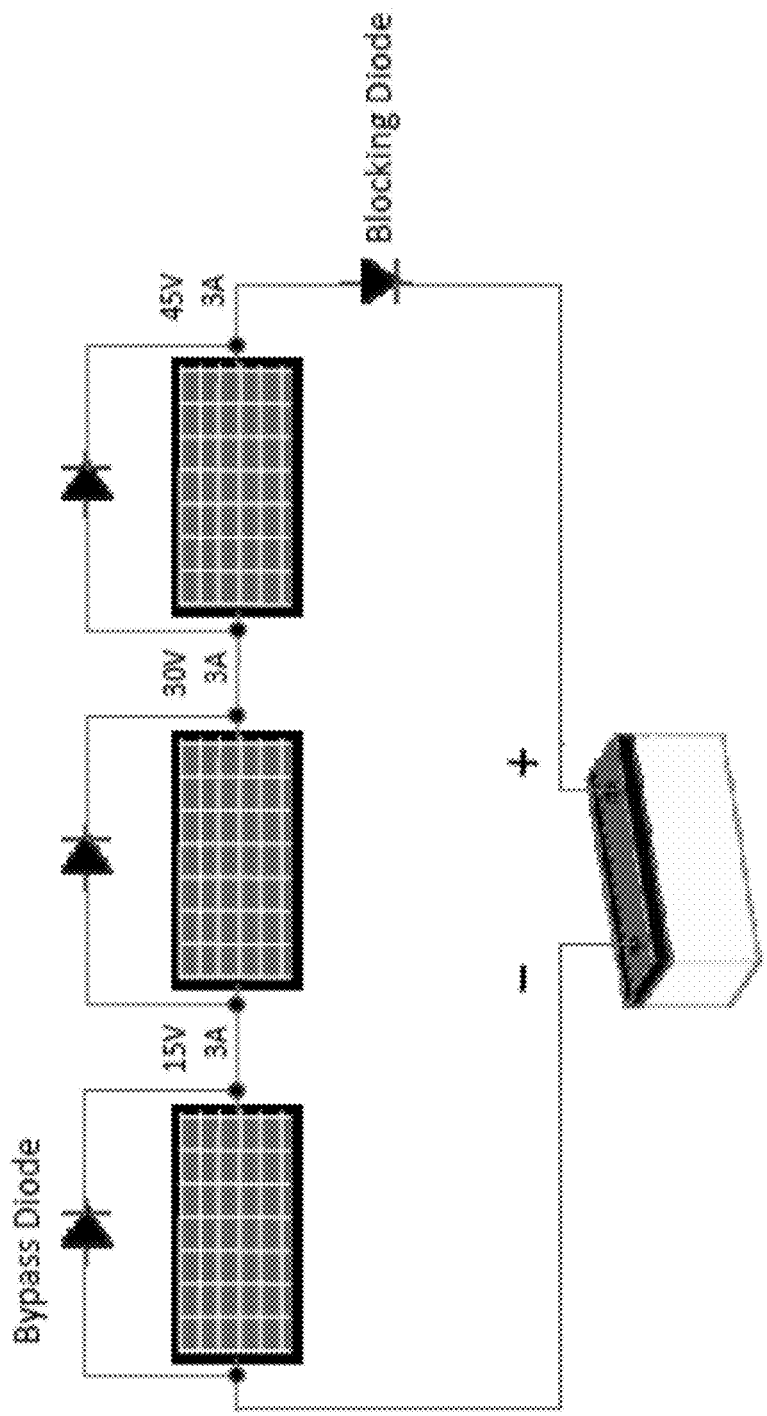
Figure 10:
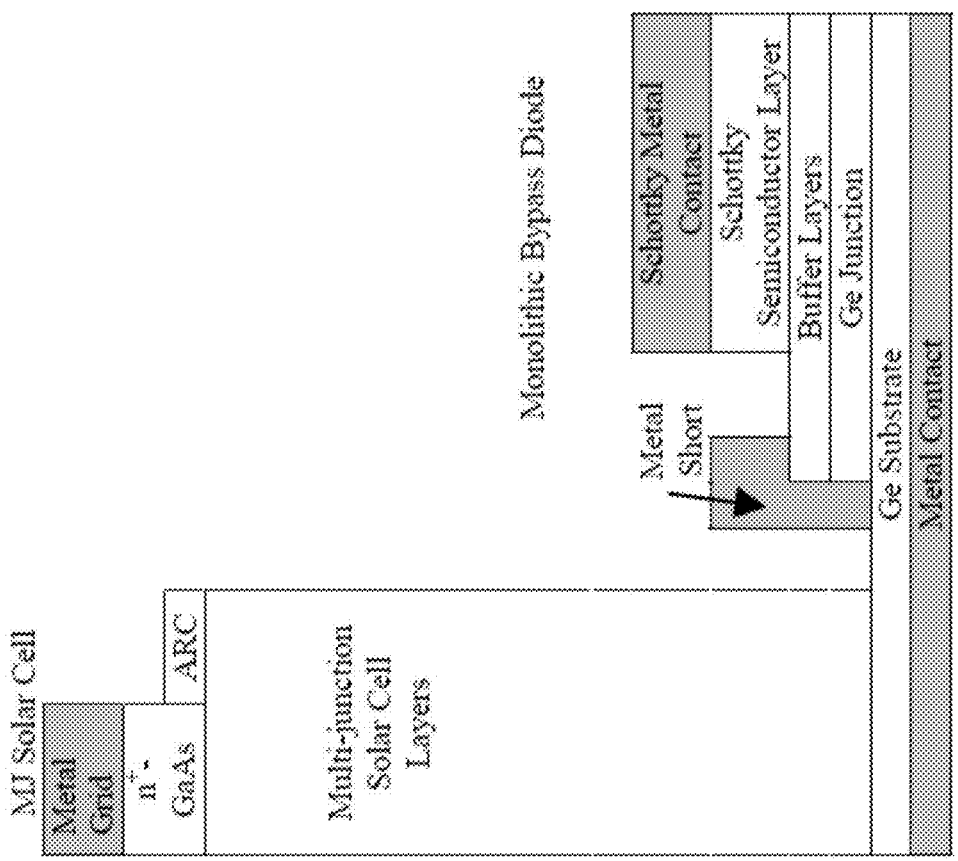
FIGS. 10 and 11 are diagrams showing examples of monolithic integration of a bypass diode (either Schottky diode or pn junction diode) with a multi junction compound semiconductor CPV cell.
Figure 11:
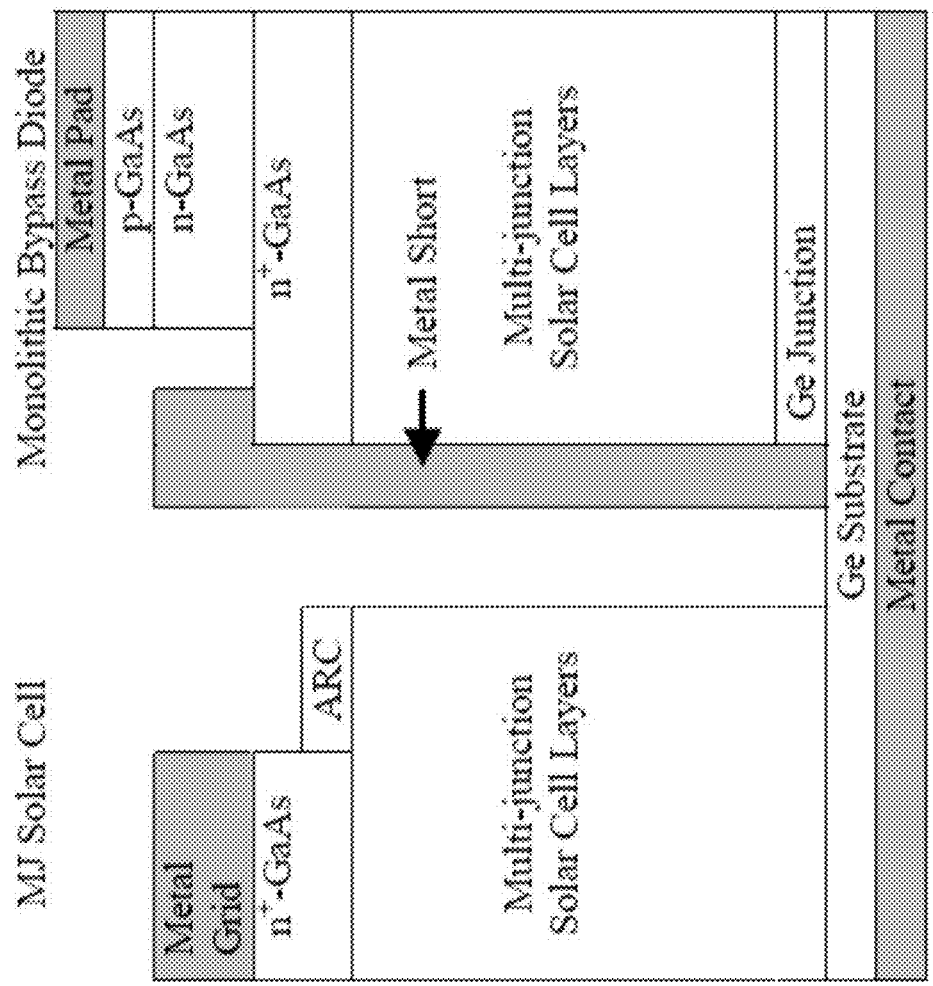

While bypass diodes may protect shaded cells, prevent hot spots, and prevent module failures due to hot spots and reverse biased cells, they also result in significant energy yield reduction due to module power extraction losses in realistic field operations when module shading or soling is present. For instance, a single shaded cell can result in loss of ⅓ of the module power (since the bypass diode would bypass the entire 20-cell sub-string containing the shaded cell) while the single cell accounts for only 1/60 of the module power during normal non-shaded conditions, assuming a standard 60-cell module design. Similarly, with three shaded cells, assuming one shaded cell per 20-cell sub-string in a 60-cell PV module (an example of which is shown in FIG. 7), all three bypass diodes are activated and the power extracted from the module drops to zero (or 100% loss of module power) while the three shaded cells account for only 3/60 (1/20) of the module power during normal non-shaded operating conditions.

In contrast, the solutions disclosed herein provide smart PV cells and smart PV modules which comprise, for example, the following components or a combination of the following components to increase PV module power harvesting and increase energy yield for PV installations as well as other associated benefits. A distributed shade management solution having a bypass switch mounted onto and integrated on the backside (for example on the cell backplane) of each solar cell and laminated/embedded within the module assembly—thus eliminating the need for the external junction box with external bypass diodes and also increases overall module reliability. A distributed power optimizer and energy yield enhancement solution which integrates one DC-to-DC converter power optimizer or one DC-to-AC micro-inverter power optimizer onto each solar cell backside (for example on the cell backplane). The cell-level power optimizer electronics (for example a monolithic single-chip solution) may be mounted onto and integrated on the backside backplane of the back-contact solar cell and laminated/embedded within the module assembly. In the various power optimizer embodiments disclosed, the power extracted from each cell may be maximized despite shading conditions and a distributed shade management solution obtained.

The disclosed systems and methods provide smart PV cells and smart PV modules with the capability of integrating very-low-cost distributed cell-level (cellular) power electronics, reducing system cost (enabling installed system cost of <$1/W installed), and improving performance in terms of energy yield (enabling <$0.05-$0.10/kWh Levelized Cost of Electricity or LCOE). Cost and efficiency play key roles in solar cell manufacturing and, as noted earlier, crystalline silicon photovoltaic (PV) modules currently account for over 85% of the overall global PV market. Currently, the starting silicon wafer cost accounts for approximately 40% of the crystalline silicon PV module manufacturing cost.

Figure 12:
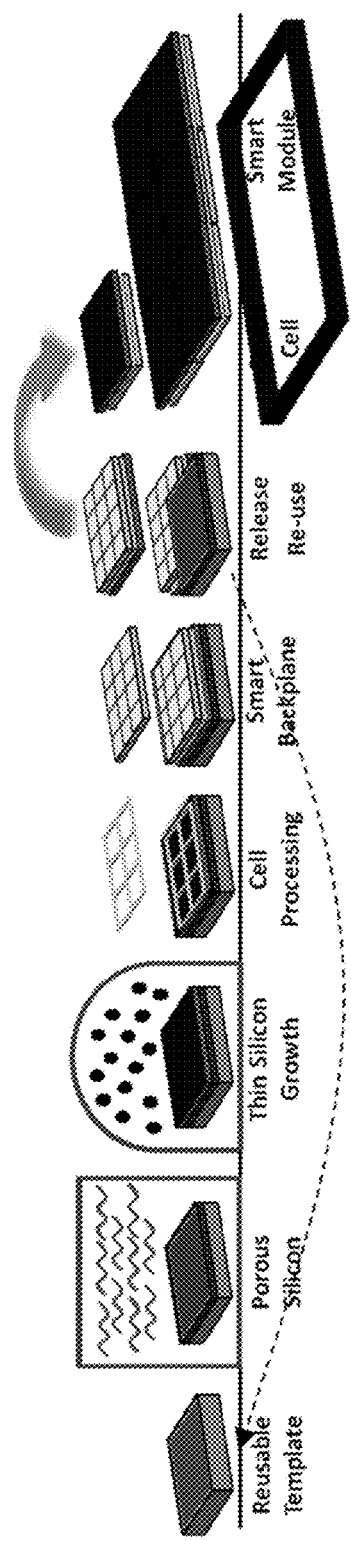
FIG. 12 is a process flow highlighting key processing steps of a thin-silicon, back-contact/back-junction crystalline silicon solar cell manufacturing process.

FIG. 12 is a process flow highlighting key processing steps of a thin-crystalline-silicon solar cell manufacturing process which substantially reduces silicon usage and eliminates traditional manufacturing steps to create low-cost, high-efficiency, back-junction/back-contact monocrystalline cells with laminated backplanes for smart cells and smart modules, using a reusable template and epitaxial silicon deposition on a release layer of porous silicon. The smart cell includes at least one or a combination of electronic components (such as bypass switch and/or a DC-to-DC or DC-to AC MPPT power optimizer directly mounted on and attached onto the backplane.

The process starts with a reusable silicon template (typically made of a p-type monocrystalline silicon wafer) into which a thin sacrificial layer of porous silicon is formed (for example by an electrochemical etch process through a surface modification process in an HF/IPA wet chemistry in presence of an electrical current). Upon formation of the sacrificial porous silicon layer, which serves both as a high-quality epitaxial seed layer as well as a subsequent separation/lift-off layer, a thin (typically with a thickness in the range of a few microns up to about 70 microns, most preferably no thicker than about 50 microns) layer of in-situ-doped monocrystalline silicon is formed (for example by atmospheric-pressure epitaxy using a chemical-vapor deposition or CVD process in ambient comprising a silicon gas such as trichlorosilane or TCS and hydrogen), also called epitaxial growth. After completion of a majority of cell processing steps, a very-low-cost backplane layer is bonded to the thin epi layer for permanent cell support and reinforcement as well as to support the solar cell high-conductivity cell metallization. Typically, the backplane material is made of a thin (for instance, about 50 to 250 microns), flexible, electrically insulating polymeric material sheet such as an inexpensive prepreg material (commonly used in printed circuit boards) which meets the process integration and reliability requirements. The mostly-processed back-contact, back-junction backplane-reinforced large-area (for instance with solar cell area of at least 125 mm×125 mm and larger) solar cell is then separated and lifted off from the template along the mechanically-weakened sacrificial porous silicon layer (for example through a mechanical release MR process) while the template may be re-used many times thereby further minimizing the solar cell manufacturing cost. Final cell processing may then be performed on the sunny-side which is exposed after being released from template (for instance, by completing the frontside texture and passivation & anti-reflection coating deposition process).

The combination of back-junction/back-contact cell designs in conjunction with a backplane-embedded interconnect and reinforcement backplane provides an enabling cell architecture for reliable integration of very-low-cost power electronics at the cell level using well-established electronics assembly methods such as surface mount technology (SMT). In addition to serving as a permanent structural support/reinforcement and providing embedded high-conductivity (aluminum and/or copper) interconnects for the high-efficiency thin crystalline silicon solar cell, these backplane technologies also allow for the integration of very-low-cost power electronics components, such as bypass switches and MPPT power optimizers, on the cell backplanes without interfering with the cell's sunnyside (i.e. there is no efficiency penalty since no active illumination area is consumed by the cell-based electronics mounted on the cell's backside backplane) while maintaining compatibility with proven back-contact module assembly and lamination techniques.

The backplane material may preferably be a thin sheet of a polymeric material with sufficiently low coefficient of thermal expansion (low CTE) not to cause excessive thermally induced stresses on the thin silicon layer. Moreover, the backplane material should meet the process integration requirements for the backend cell fabrication processes, in particular chemical resistance during wet texturing of the cell frontside and thermal stability during the PECVD deposition of the frontside passivation and ARC layer. Moreover, the electrically insulating backplane material should meet the module-level lamination process and long-term reliability requirements. While various suitable polymeric (such as plastics, fluoropolymers, prepregs, etc.) and non-polymeric materials (such as glass, ceramics, etc.) may be considered and possibly used as the backplane material, the optimal choice depends on many considerations including but not limited to the cost, ease of process integration, reliability, pliability, etc. One useful material of choice for backplane is prepreg. The prepreg sheets are used as building blocks of printed circuit boards. Prepreg sheets are made from combinations of resins and CTE-reducing fibers or particles. Preferably, the backplane material may be an inexpensive, low-CTE (typically with CTE <10 ppm/° C. and more preferably with CTE <5 ppm/° C.), thin (usually 50 to 250 microns, preferably 50 to 100 microns) prepreg sheet which is relatively chemically resistant in the texture chemistry and is thermally stable at temperatures up to at least 180° C., and more preferably up to at least about 280° C. The prepreg sheet is typically attached to the solar cell backside while still on the template (before the cell lift off process), using a vacuum laminator. Upon applying heat and pressure, the thin prepreg sheet is permanently laminated or attached to the backside of the processed solar cell. Then, the lift-off release boundary is defined around the periphery of the solar cell (near the template edges), usually using a pulsed laser scribing tool, and the backplane-laminated solar cell is then separated from the reusable template using a mechanical release or lift-off process. The subsequent process steps may include: (i) completion of the texture and passivation processes on the solar cell sunnyside, (ii) completion of the solar cell high conductivity metallization on the cell backside (which is the solar cell backplane). The high-conductivity metallization (typically comprising aluminum and/or copper but preferably not silver in order to reduce the solar cell manufacturing and material costs) is formed on the solar cell backplane and includes both the emitter and base polarities.

For example, the solar cell design and manufacturing process as described herein have two levels of metallization which are separated by the electrically insulating backplane layer. Prior to the backplane lamination process, essentially the last process on the back-contact solar cell is to form the solar cell base and emitter contact metallization pattern directly on the cell backside, preferably using a thin layer of screen printed or plasma sputtered (PVD) aluminum (or aluminum silicon alloy) material layer. This first layer of metallization (M1) defines the solar cell contact metallization pattern, such as the fine-pitch interdigitated back-contact (IBC) conductor fingers defining the base and emitter regions of the IBC cell. The M1 layer serves to extract the solar cell current and voltage and to transfer the solar cell electrical power to the second level of higher-conductivity solar cell metallization (M2 layer) which will be formed after this first layer of metal (after M1). After formation of the laminated backplane, subsequent detachment of the backplane-supported solar cell from the template, and completion of the frontside texture and passivation processes, the remaining process is to form the higher conductivity M2 layer on the backplane. A plurality (typically 100's to 1000's) of via holes are drilled (preferably using laser drilling) into the backplane. These via holes land on pre-specified regions of M1 for subsequent electrical connections between the patterned M2 and M1 layers through conductive plugs formed in these via holes. Subsequently, the patterned higher-conductivity metallization layer M2 is formed (by one or a combination of plasma sputtering and plating—with M2 comprising aluminum and/or copper). For an interdigitated back-contact (IBC) solar cell with fine-pitch (for instance, 100's of fingers (IBC fingers on M1, the patterned M2 layer is preferably designed to be orthogonal to M1, i.e., the M2 fingers are essentially perpendicular to M1 fingers. Moreover, because of this orthogonal transformation, the M2 layer has far fewer IBC fingers than the M1 layer (for instance, by a factor of about 10 to 50 fewer M2 fingers). Hence, the M2 layer is a much coarser pattern with much wider IBC fingers than the M1 layer. In this embodiment, the solar cell busbars are placed on the M2 layer (and not on the M1 layer) in order to eliminate the electrical shading losses associated with the busbars on cell. Since both the base and emitter interconnections and busbars are made available on the M2 layer on the solar cell backside backplane, the embodiments of this invention can effectively integrate the power electronics component or components on the backplane with access to both the base and emitter terminals of the solar cell on the backplane.

Similar in essence to a very low-cost printed-circuit board, the disclosed solar cell backplane with both polarities of the solar cell on the backplane may be effectively used to electrically assemble and integrate electronic components on the cell backside backplane, without obstructing the sunnyside of the solar cell and without degrading the reliability of the solar cell, hence enabling implementation of distributed shade management with enhanced energy yield, distributed cell-based MPPT power optimization, reduced LCOE, and improved PV system reliability via smarter electricity management through the entire cells and modules. The backplane not only enables direct mounting, attachment, and support of the thin-format electronic components on the solar cell, it also effectively decouples from the sensitive solar cell any detrimental stress effects of the components and their attachments. The embodiments described herein enable smart solar cells and smart solar modules, such as in back-contact solar cells including back-contact/back-junction IBC cells, with permanently attached (e.g., laminated) backplanes. The smart cell includes electronic components such as one bypass switch integrated on the cell backplane and/or one DC-to-DC or DC-to AC MPPT power optimizer directly attached onto the backplane on each cell.

Intelligent Cellular Shade Impact Suppression (ISIS).

Due to the series wiring of a PV system, a small amount of obstruction on a system's light-absorbing face may lead to large output loss. There are various representative examples of loss of power harvesting capability as a result of cell and module shading. For instance, one published study determined that obstruction on 0.15%, 2.6%, and 11.1% of the PV module surface area causes 3.7%, 16.7%, and 36.5% of output power loss, respectively, hence resulting in a significant reduction of the installed PV system energy yield in case of shading. As discussed earlier, when the current of one obstructed cell drops due to shading, the shaded cell drags down the current of all the other cells wired in series in a string or sub-string (unless corrective action is taken in the design of the module). A novel ISIS or shade management design of the disclosed subject matter integrates an inexpensive piece of electronics (e.g., a very low-cost power electronic bypass switch such as a power Schottky diode or MOSFET or another suitable low-forward-voltage/low-reverse-leakage/low-ON-resistance bypass switch) on each solar cell backplane with direct access and electrical connections to both the solar cell busbars (base and emitter) to enable the automatic re-routing of electricity around any obstructed or shaded cells with minimal impact on the series string and the PV module—thereby maximizing power harvesting of the PV module and the overall energy yield output. Additionally, the disclosed ISIS systems and methods disclosed herein may improve the overall cell and module reliability by reducing stress from accumulated heat associated with mismatched current within the modules. An integrated ISIS as disclosed herein eliminates the need for a junction box with external bypass diodes, hence, reducing the cost/Wp of the resulting smart module. Further, backplanes used as support substrates for the electronic components effectively isolate and decouple the stress effects of component placements and soldering from the sensitive semiconductor cell layers thus minimizing thermal and mechanical stresses and any detrimental effects of such stresses associated with mounting the ISIS bypass switches on cell backplanes and backsides.

Distributed Maximum-Power-Point Tracking (MPPT) Power Optimizer.

The Maximum Power Point (MPP) is the spot on the current-voltage continuum where a module yields the maximum possible output power under various solar illumination conditions from sunrise through sunset (or starting when the solar cell "wakes up" around sunrise until the cell "sleeps" around sunset). As current and voltage values vary with the solar irradiation flux changes and other operating conditions (such as ambient temperature, etc.) throughout the day, an automated MPP tracker adjusts the operating point of voltage and current on the IV curve in order to operate at the MPP condition (to extract the maximum module power); moreover, the MPP tracker also preferably adjusts its output current/voltage ratio to match the current values of all the solar cells (and modules) connected in series. The disclosed innovations provide truly distributed implementation of very-low-cost Maximum Power Point Tracking (MPPT) Power Optimization circuitry at the cell level by integrating smart electronics onto each cell backside via the backplane. If one external micro-inverter (or alternatively, one DC-to-DC converter) per module and module-level MPPT using each external micro-inverter (or alternatively, one DC-to-DC converter) is used, this configuration may produce 100% of power from the first string and, for instance, 97% of power from the second string. This would achieve an improved power harvesting of 98.5% of the full power from the PV installation, a substantial improvement compared to the traditional centralized inverter MPPT arrangement.

When extended and applied to the cell-level MPPT power optimization as disclosed herein, this solution not only enables substantially improved power harvesting from each and every cell under various illumination and cell shading conditions hence further maximizing the overall module energy yield compared to conventional methods, it also enables packaging of mismatched cells (cells from different manufacturing bins with different parametrics such as $V_{mp}$ and/or $I_{mp}$ values) within a given module and eliminates the impact of module mismatching at the system level.

Various embodiments of the disclosed systems, by integrating smart power electronic capabilities at the cell level through distributed cellular ISIS and/or cellular MPPT Power Optimizer electronics, provide significant cost improvements including less than $0.20/Wp installed power electronics, less than $0.50/Wp for balance of systems and installation (total BOS), and LCOE <$0.10/kWh (actually with LCOE capability of reaching <$0.05/kWh). As described earlier and in contrast to the disclosed systems and methods, conventional power electronics only exist at the module level (external DC-to-DC converter box or DC-to-AC microinverter box attached to the PV module) or at the installed PV system level (more traditional centralized inverter MPPT). Embodiments in accordance with the disclosed subject matter achieve substantially more gain and benefits than today's existing PV solutions through novel and unique distributed cell-level MPPT Power Optimization and maximum power extraction optimization enabled by back-junction cells including back-contact/back-junction IBC cells and backplane technology (with the backplane providing access to both the solar cell electrical leads or busbars, and providing support for placement of the electronic components opposite the sunnyside of the solar cell). The disclosed subject matter achieves these substantial gains with only incrementally higher cost, thereby substantially reducing LCOE, due to ease of process integration within existing manufacturing process (powerelectronics components such as the bypass switches and MPPT power optimizer components may be directly mounted onto the backplane on the cell backside without a need for expensive manufacturing steps) while providing substantially increased energy yield (including the elimination of cell and module mismatching). While current module-level DC-to-DC converter boxes tend to claim up to 25% increased energy yield, these solutions incur a cost typically above $0.20/Wp; in contrast, the novel embodiments disclosed herein (i.e., the unique distributed cellular ISIS and cellular MPPT Power Optimizer solution) increase the overall PV module and installed PV system power output and energy yield of the system significantly while reducing the implementation cost to below $0.20/Wp.

In addition, the distributed cellular power optimization solutions disclosed herein provide:

Improved inverter reliability—managing voltage and current to predictable levels removes stress on the centralized inverter (i.e., no overvoltage) and improves overall conversion efficiency. Further, the centralized inverter design may be simplified and cost reduced as a result of the truly distributed cellular MPPT Power Optimization solution.

Anti-islanding—fully embedded smart power circuitry enables distributed tracking and communication within the module, among the modules, and between the modules and locations outside the PV installation to allow automatic shut-off for emergencies and easier and safer installations and maintenance.

Ability to ignore shading and design flexible string lengths and planes will mean less of expensive system design analyses and cheaper overall installation costs.

Cell/module monitoring leads to improved servicing, cleaning, performance forecasting, and preventive maintenance actions.

Intelligent Cellular Shade Impact Suppression (ISIS) Solution Using Bypass Switches Integrated with the Solar Cells:

The following section describes various ISIS implementation embodiments. Considerations and criteria relating to selection of a bypass electronic switch for use in the distributed cellular shade management (ISIS) systems disclosed, without substantial power dissipation losses in the distributed switches, include, but are not limited to:

A cellular bypass switch with a small on-state voltage drop, in some instances far smaller than that of a forward-biased diode. For example, assuming $V_{mp}$=575 mV and $I_{mp}$=9.00 A (corresponding to approximately $V_{oc}$=660 mV and $I_{SC}$=9.75 A), an on-state voltage of 50 mV would result in an on-state power dissipation of 0.45 W which is less than 10% of that of a diode (this calculation excludes any loss associated with the switch $R_{series}$).

A cellular bypass switch with a very small on-state series resistance to minimize the on-state switch power dissipation: preferably an on-state switch $R_{series}$ less than or equal to 10 mΩ (for example $R_{series}$=5 mΩ, ohmic power dissipation of switch=0.405 W).

A bipolar junction transistor (BJT) or a MOSFET or any suitable switch circuitry comprising such components providing relatively low voltage drop and small $R_{series}$.

For example, a bypass switch with the following functionality may be used as an electronic component:

Low power dissipation when the bypass switch is turned ON (forward biased). For example, the power dissipation may be no larger than a fraction of the average cell power production. For instance, for a 5 Wp cell a bypass switch selected to limit the power dissipation to no more than about 1 W when the full cell string current passes through the bypass switch of the shaded cell.

Low reverse leakage current when the bypass switch is OFF (reverse biased).

A thin component package (for example <<2 mm or even as low as <1 mm).

Capable of handling the full current of the cell string.

Figure 13:
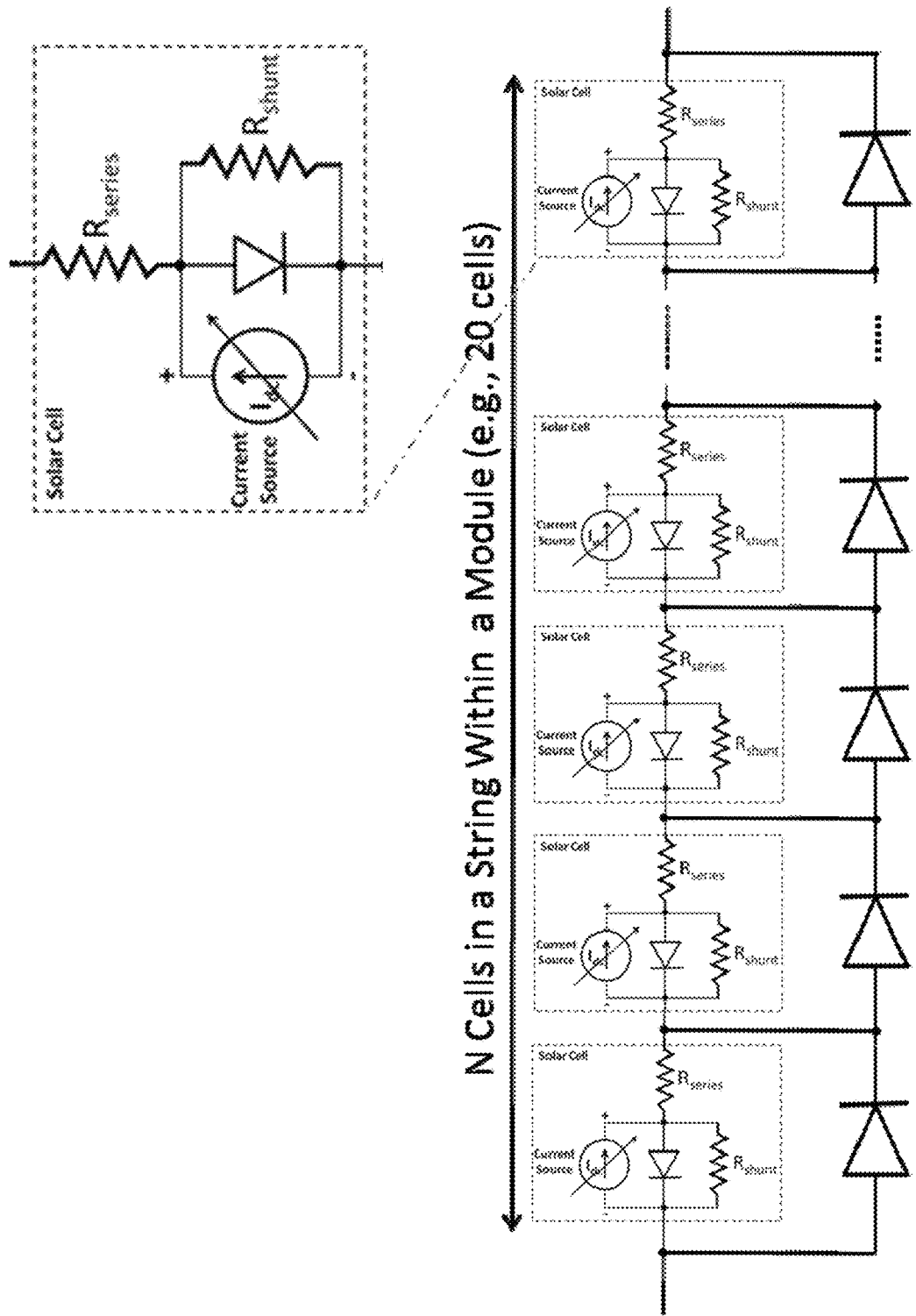
FIG. 13 is a schematic diagram showing a distributed cellular shade management system with one bypass diode per solar cell (solar cells shown with their equivalent circuit diagrams)

FIG. 13 is a schematic diagram showing a distributed cellular shade management system, referred to herein as Intelligent cellular Shade Impact Suppression or ISIS, using one low-Vf (low forward bias voltage) bypass diode (which may also be one low Vf bypass switch such as a low-Vf Shottky diode) per each solar cell (shown with its equivalent circuit model) attached to each cell backside backplane and laminated within the module. This distributed bypass switch arrangement eliminates the need for the external junction box bypass diodes and improves the overall energy yield performance of the modules in PV installations compared to the known arrangement of one bypass diode per multi-cell sub-string (typically one bypass diode per 20-cell substring in known configurations). Since one bypass switch (such as a rectifying diode such as Schottky diode in this example) per cell is used, the entire module may be wired as a single string of all the cells within the module connected in series (e.g., one string of 60 cells connected in series for a 60-cell module). Thus, the use of the ISIS architecture in accordance with the disclosed subject matter eliminates the need for multiple sub-strings within the module.

Figure 14:
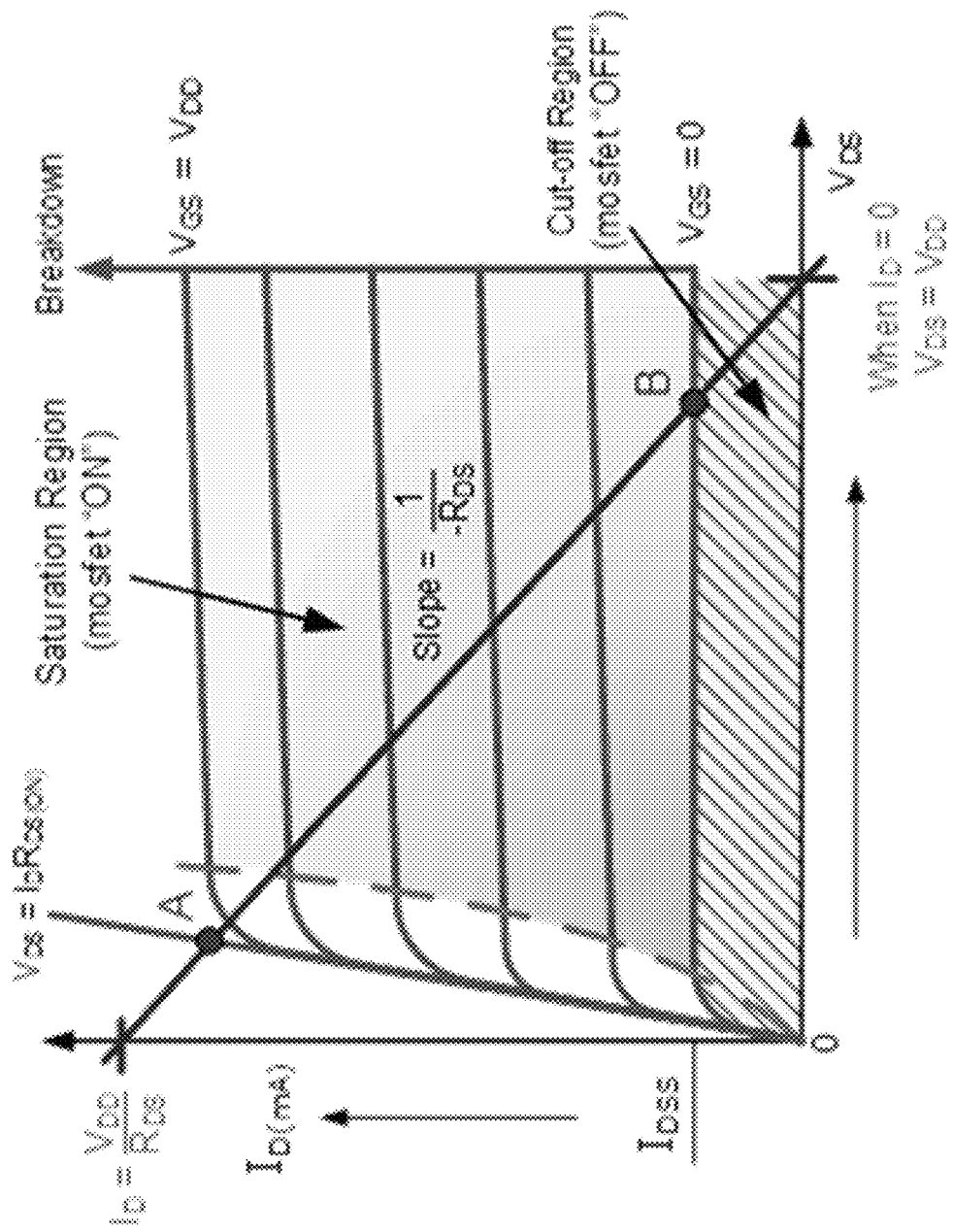
FIG. 14 is a graph showing the IV characteristics of a metal-oxide-semiconductor field-effect transistor (MOSFET) which may be used as a bypass switch (or as part of a bypass switch circuitry)

FIG. 14 is a graph showing that power metal-oxide-semiconductor field-effect transistor (MOSFET) with suitable specifications may be used (stand alone or as part of a switch circuitry) has an effective bypass switch for distributed bypass switches attached to the cell backplanes for integrated shade management solution (ISIS). For example, using enhancement-mode MOSFET as the switch, when $V_{GS}$>0 turn MOSFET on and $V_{GS}$=0 turn MOSFET off:

When $V_{GS}$ is zero, the MOSFET is OFF and the output voltage ($V_{DS}$) is equal to $V_{DD}$.

When $V_{GS}$>0 or equal to $V_{DD}$, the MOSFET bias point (Q) move to point A along the load line. The drain current $I_D$ rises to its max value due to a reduction in the channel resistance. $I_D$ becomes a constant independent of $V_{DD}$ and depends only on $V_{GS}$. Thus, the transistor behaves like a closed (ON) switch and the channel ON resistance does not reduce fully to zero due to its $R_{DS}$(on) value but gets very small.

When $V_{GS}$ is LOW or zero, the MOSFET bias-point moves from A to B. The channel resistance is very high so the MOSFET is OFF. If $V_{GS}$ toggles between these two values, the MOSFET behaves as a single-pole single-thrown switch.

Appropriate power MOSFETs usually have $R_{series}$ of less than 0.01Ω (or less than 10 mΩ).

Power MOSFET switches typically have surge-current protection, but for high-current applications bipolar junction transistors may be used.

Figure 15:
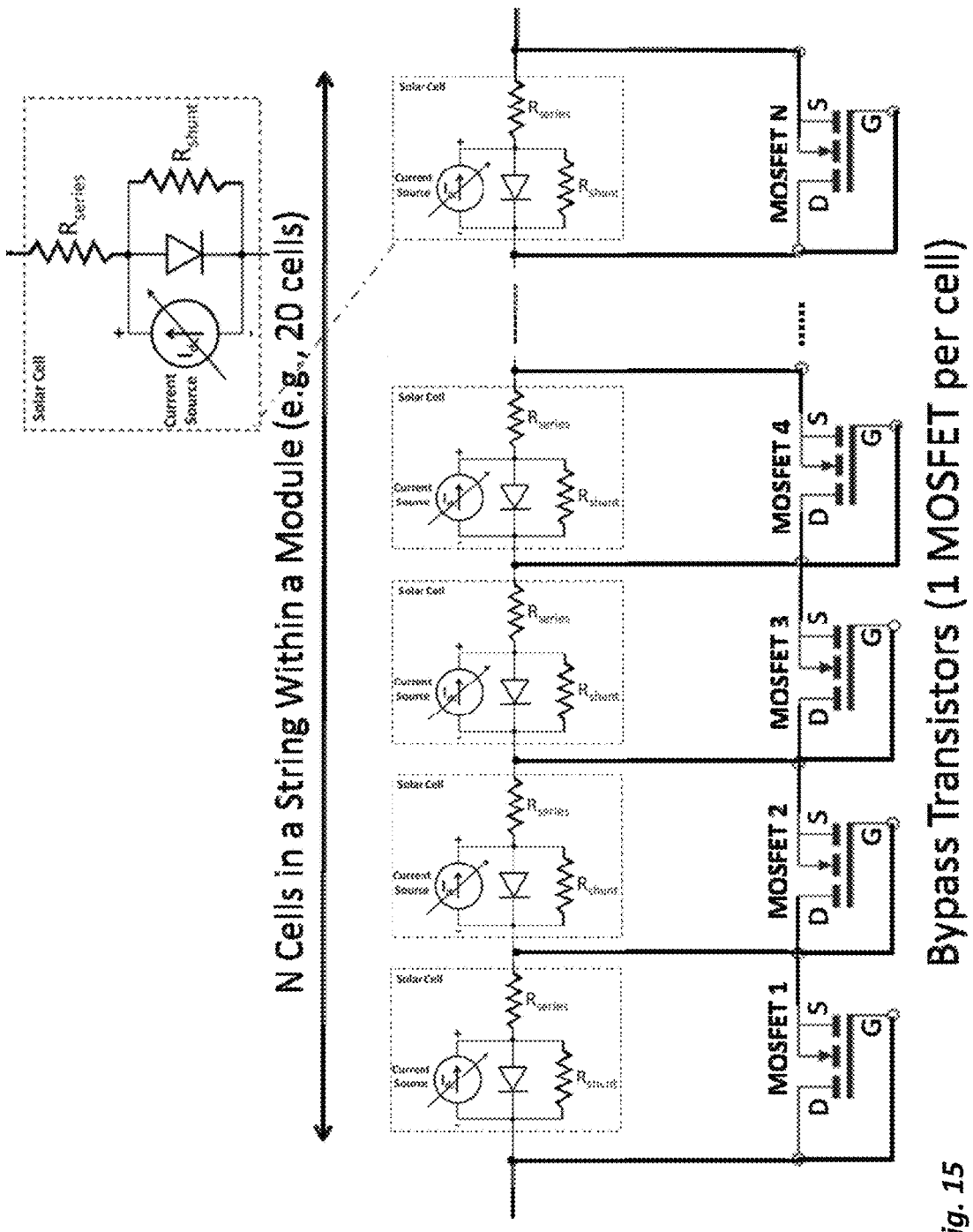
FIG. 15 is a schematic diagram of an ISIS distributed cellular shade management implementation in accordance with the disclosed subject matter (specifically an embodiment using MOSFETs or circuitry comprising MOSFETs as bypass switches)

FIG. 15 is a schematic diagram of an ISIS distributed cellular shade management implementation in accordance with the disclosed subject matter using one very-low-Vf power MOSFET-based bypass switch per solar cell (the switch comprising MOSFET or monolithic circuitry including MOSFET) attached to each cell backside and laminated within the module. Again, this distributed bypass switch arrangement will eliminate the need for the external junction box bypass diodes and improves energy yield of the module as compared to an arrangement of one bypass diode per multi-cell sub-string (typically one bypass diode per 20-cell substring in known configurations). In this system, if no cells are shaded the bypass diode remains in the reverse bias state and the solar cell string operates normally contributing fully to the power generation of the solar module. If any of the cells are partially or fully shaded, the shaded cell(s) is (are) reverse biased and the bypass transistor switch (es) is (are) turned on, eliminating the possibility of a hot-spot or damage to the solar cell.

Figure 16:
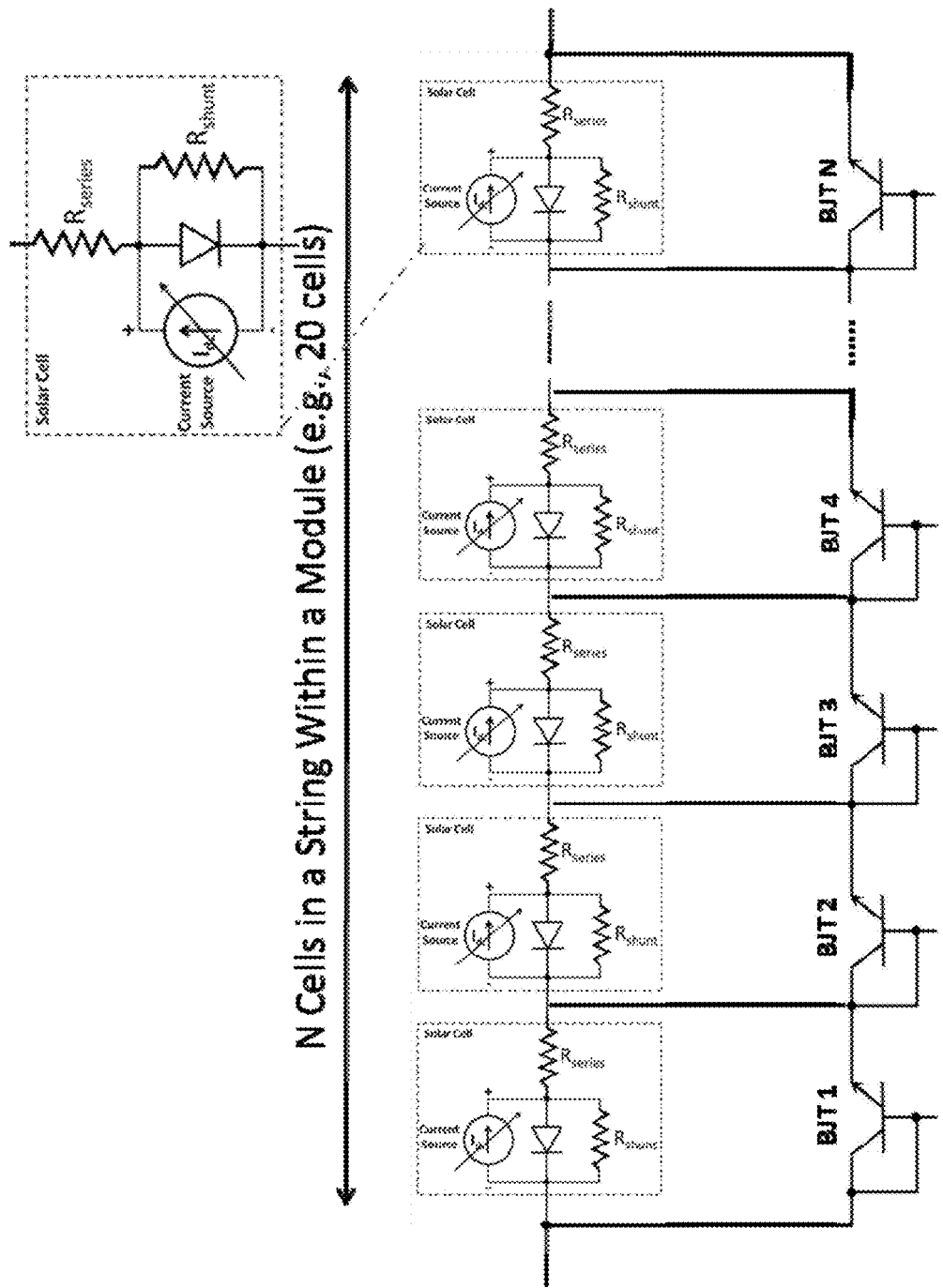
FIG. 16 is a schematic diagram of an ISIS distributed cellular shade management solution in accordance with the disclosed subject matter (specifically an embodiment using Bipolar Junction Transistors—BJTs or circuitry comprising BJTs as bypass switches)

FIG. 16 is a schematic diagram of an ISIS distributed cellular shade management solution in accordance with the disclosed subject matter using one very-low-Vf power bipolar junction transistor (BJT)-based bypass switch per solar cell (the switch comprising BJT or monolithic circuitry including BJT) attached to each cell backside and laminated within the module. The base and collectors of the bipolar transistors are connected together. This distributed bypass switch arrangement will eliminate the need for the external junction box bypass diodes and improves energy yield of the module compared to an arrangement of one bypass diode per multi-cell sub-string (typically one bypass diode per 20-cell substring in known configurations). In this system, if no cells are shaded the bypass transistor switch remains in the OFF state and the solar cell string operates normally contributing fully to the power generation of the solar cell. If any of the cells are partially or fully shaded, the shaded cell(s) is (are) reverse biased and the bypass transistor switch (es) is (are) turned ON, eliminating the possibility of a hot-spot or damage to the shaded cell.

And although embodiments of the disclosed subject matter may be applied to any type of solar PV cells and modules, ISIS may be particularly advantageous for application with back-contact-type solar cells (either front junction or back-junction) utilizing a backplane attachment on the cell backside. The electrically insulating backplane layer on the cell backside enables attachment of electronic components onto the cell backside without mechanical or thermal stress problems affecting the active cell region. And because the active cell and the electronic components are positioned on the opposite sides of the backplane there is minimal or no efficiency penalty due to loss of active cell illumination area because of placement of electronics components.

Figure 17:
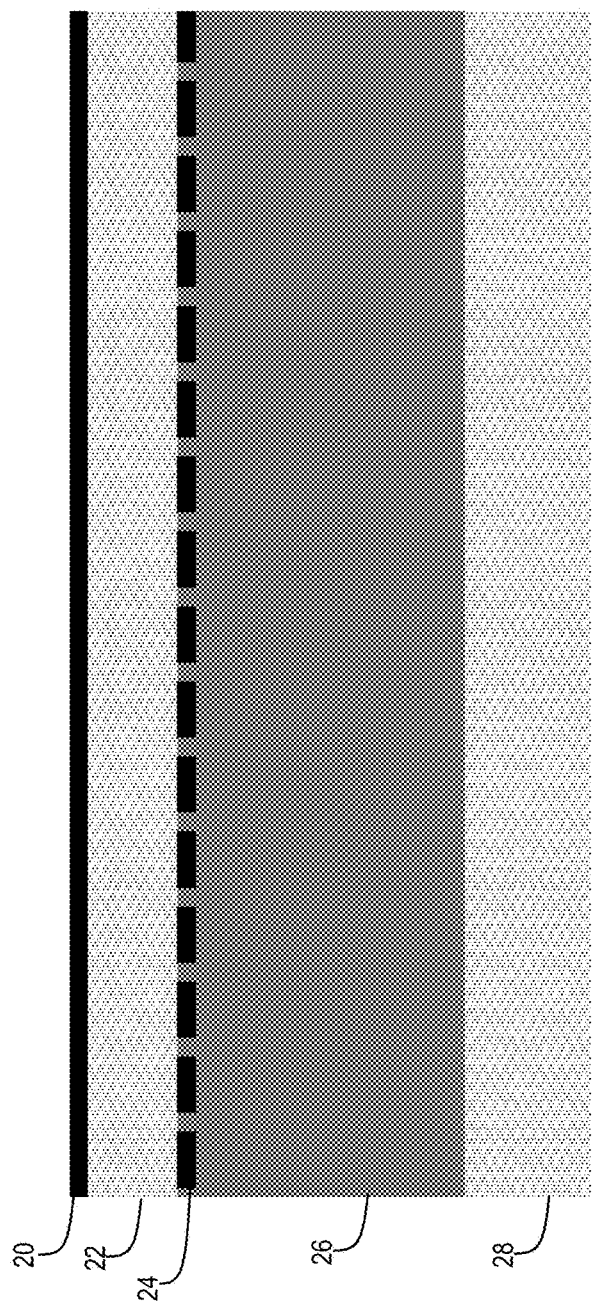
FIG. 17 is a cross-sectional diagram of a back-contact/back-junction crystalline semiconductor solar cell which includes a backplane support layer.
Figure 20:
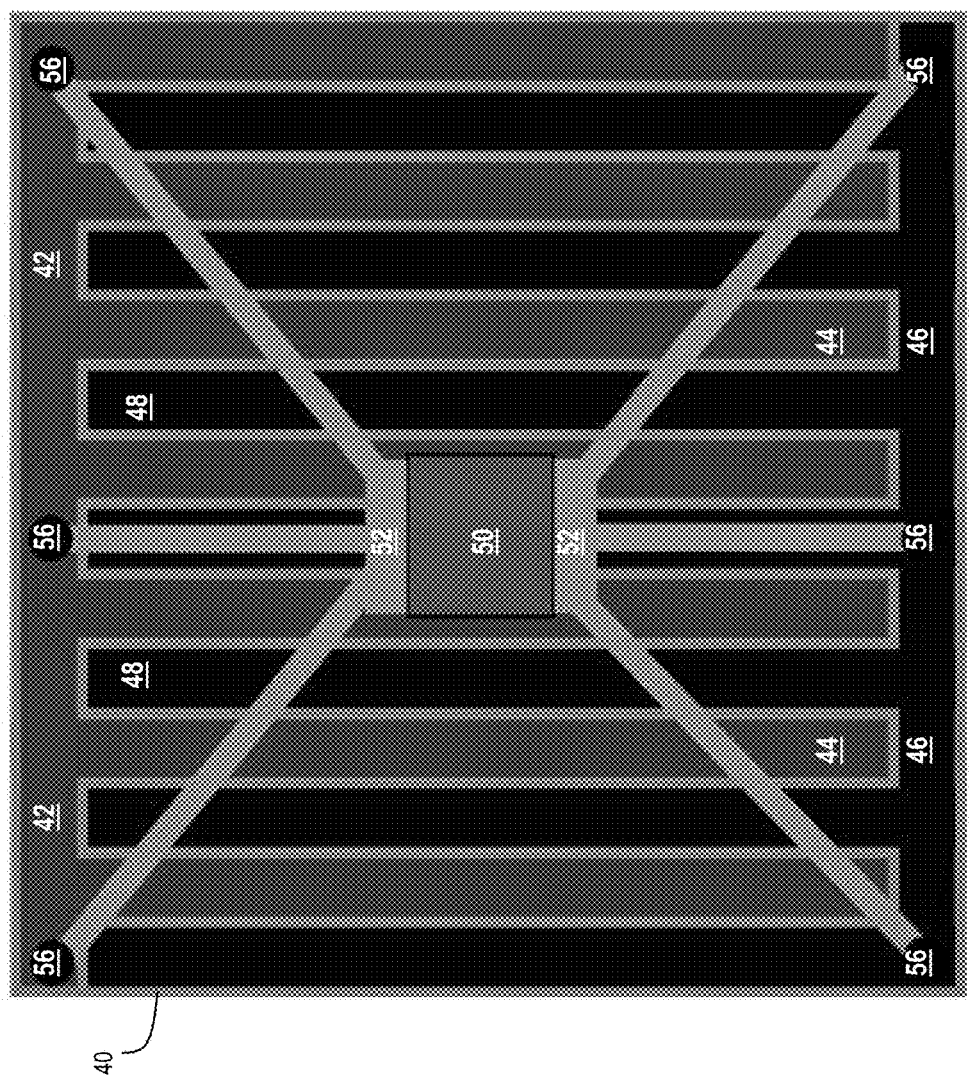
FIG. 20 is a diagram showing the top view of the backplane of the solar cell in FIG. 19 having a bypass switch directly attached to the cell terminals or busbars on the cell backside and which minimizes hot spots by providing high conductivity attachments of the bypass switch leads to the emitter and base busbars.

FIG. 17 is a representative schematic cross-sectional diagram of a back-contact/back-junction crystalline semiconductor solar cell, such as an thin mono-crystalline silicon solar cell (for example having a ≤50 µm mono-crystalline silicon absorber layer), having a laminated or attached electrically insulating backplane layer with high-electrical-conductivity cell interconnects (for example, comprising aluminum and/or copper metallization) on the side opposite of the sunnyside of the cell (referred to as the backside). The back-contact/back-junction crystalline semiconductor solar cell shown in FIG. 17 comprises thin or ultrathin crystalline semiconductor substrate 22, substrate 22 may be a large area cell for example a 125 mm×125 mm or 156 mm×156 mm sized (or any other large area with areas from about 150 cm² to over 1000 cm²) substrate. The cell sunnyside is the light receiving surface of the cell and may comprise frontside texture, as well as passivation and anti-reflective coating layer 22. The relatively fine-pitch on-cell metallization (the M1 metallization layer) fingers 24 are positioned on the cell backside prior to the backplane attachment, for example in the form of an interdigitated back contact Aluminum metallization finger pattern (for example a pattern of hundreds of fine-pitch metallization fingers without any on-cell busbars). Backplane 26 may be a permanently laminated backplane on the cell backside having a thickness, for example, in the range of 0.05 mm to 0.50 mm (for example 0.05 mm to 0.25 mm), and allows for the attachment of electronic components on the cell backside without stress issues on the active cell. Backplane 26 may comprise conductive via plugs (for example aluminum and/or copper via plugs, embedded within or positioned on the backplane, to electrically connect high-conductivity cell interconnects 28 on the backplane backside of the cell (M2 metallization) to on-cell interdigitated back contact metallization (M1 metallization) fingers 24. FIG. 20 highlights an example embodiment of high-conductivity cell interconnects 28 (M2 metallization), for example in the form of orthogonally transformed dual busbar IBC metallization pattern with aluminum and/or copper fingers having a thickness in the range of a few microns up to 100 µm and, for example, from four to tens of pairs of base/emitter metallization fingers.

Figure 18:
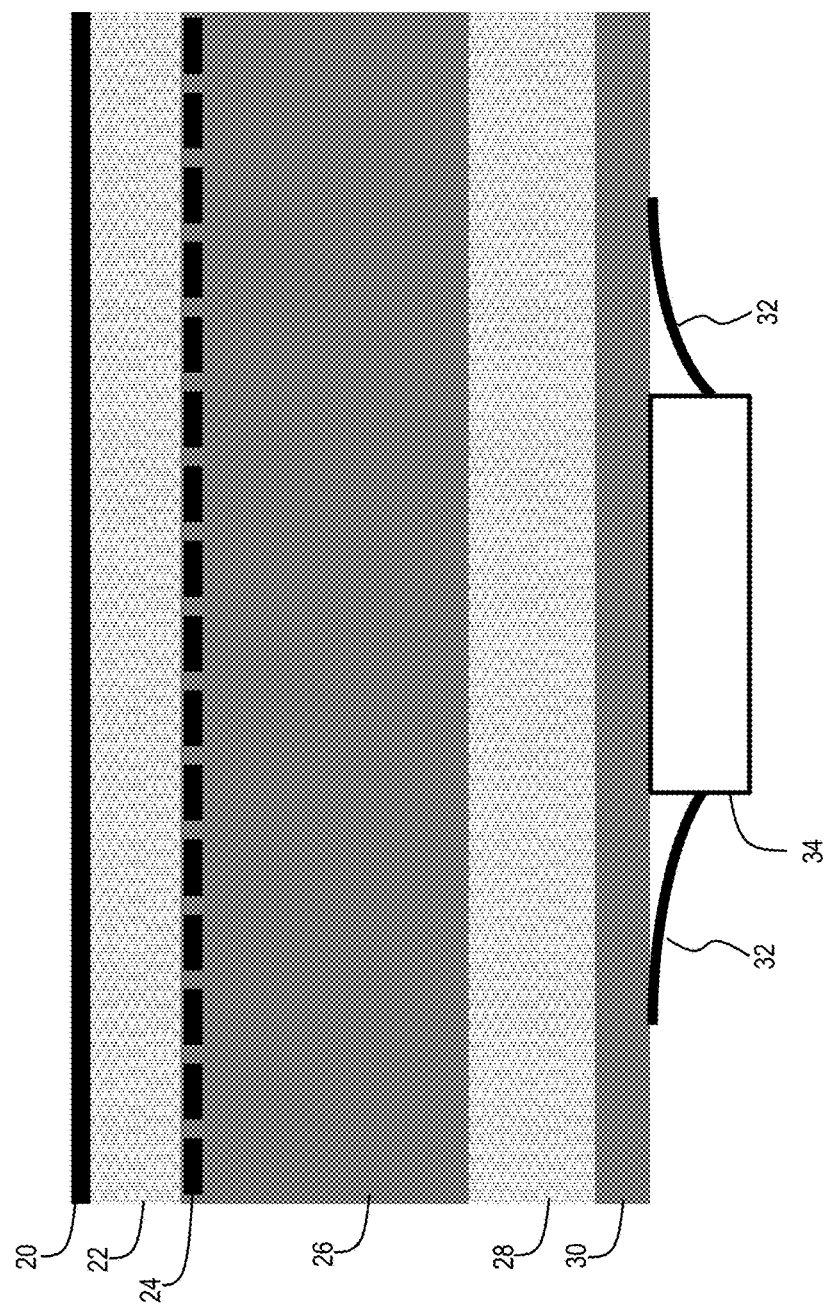
FIG. 18 is a cross sectional diagram of a back-contact/back-junction crystalline semiconductor solar cell similar to the cell shown in FIG. 17 with at least one on-cell electronic component mounted on and attached to a backplane layer.

FIG. 18 is a cross sectional diagram of a back-contact/back-junction crystalline semiconductor solar cell similar to the cell shown in FIG. 17 with on-cell electronic components (single monolithic component attachment shown) comprising electrical insulator layer 30, on-cell electronic component 34, and electrically conductive leads 32 positioned on the back side of the cell. As shown, electronic component(s) 34 are mounted onto (or within) the backplane and electrical leads 32 are connected to the cell interconnects. The cell-level electronics components placed onto the cell backplane may be the bypass switch and optionally the MPPT DC-to-DC (or MPPT DC-to-AC) Power Optimizer. As shown in the cell in FIG. 18, the power electronics parts are positioned on the backside of the cell and decoupled/separated from the active cell absorber by the backplane. Optional electrical insulator layer 30 providing electrical insulation may be a sprayed or screen printed layer or an attached sheet. Without electrical insulator layer 30 the electrical leads 32 may have insulation jacket around them to allow for electrical connections of the leads only at the pre-specified sites (by soldering or conductive epoxy). Electrically conductive leads 32 (for example two leads in the case of a bypass switch) may be electrically attached to the cell busbars (and/or IBC fingers) in order to provide the required electrical interconnections between the integrated shade management and/or MPPT power optimization (for example DC-to-DC or DC-to-AC power optimizer) components of electrical component 34 and the solar cell leads. On-cell electrical component 34 may comprise a bypass switch and/or a DC-DC MPPT or DC-AC MPPT power optimizer. Other possible status monitoring and reporing electronic components may also be used. The MPPT power optimizer attached to the cell may be remotely programmable to shut off and turn on the solar cell, to re-program the current and/or voltage outputs, and to provide status of the solar cell (including but not limited to the cell power, temperature, etc.).

Figure 19:
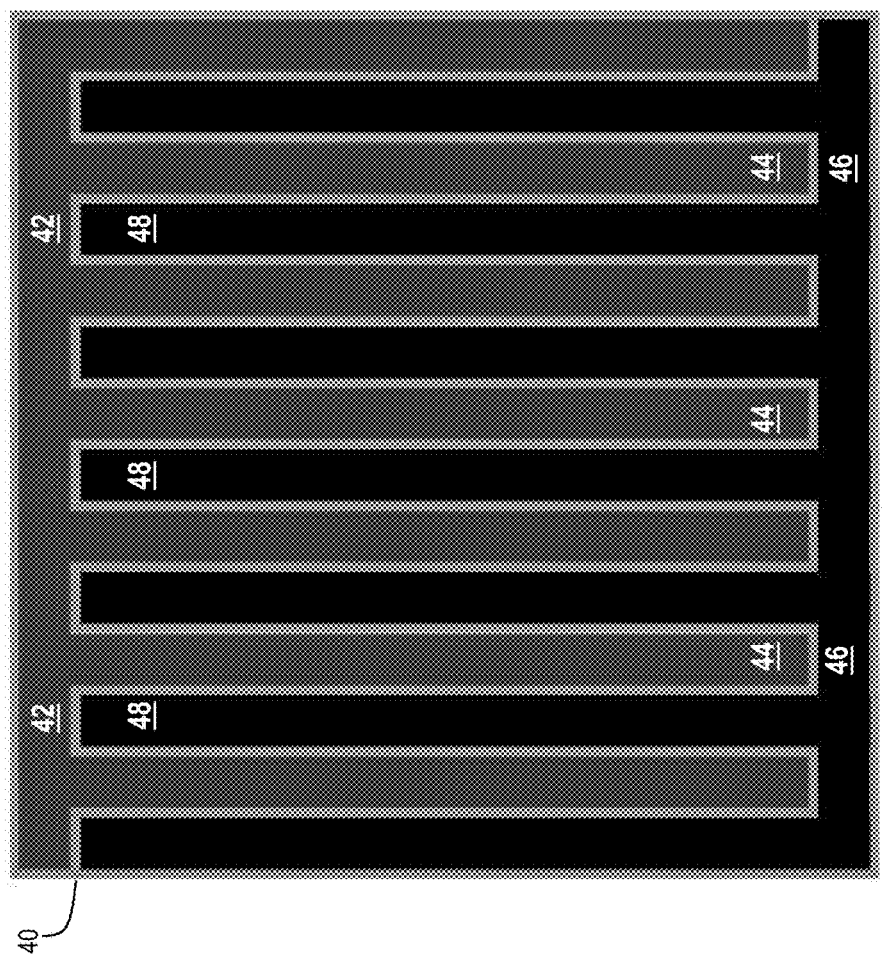
FIG. 19 is diagram showing the top view of the backplane and representative interdigitated back-contact (IBC) metallization pattern of a solar cell.

FIG. 19 is diagram showing the top view of the backplane and IBC metallization (M2 metallization) pattern of a solar cell (such as that shown in FIGS. 17 and 18), in other words FIG. 19 shows the backplane side of the solar cell (opposite the sunnyside). As shown here, the backplane side includes the high-conductivity cell metallization interconnects (M2 metallization), shown as emitter busbar 42 and corresponding emitter metallization fingers 44 and base busbar 46 and corresponding base metallization fingers 48, positioned on backplane surface 40 (backplane surface 40 shown as backplane 26 in FIGS. 17 and 18). In the back-contact/back-junction IBC architecture of FIG. 19, the interconnect pattern is an interdigitated pattern with two busbars (emitter and base busbars) on two sides of the backplane. As described before, the number of interdigitated high-electrical-conductivity fingers on the backplane may be much smaller than the number of on-cell metallization fingers (shown as on cell metallization fingers 24 in FIGS. 17 and 18) due to an orthogonal transformation of the metallization pattern from on-cell to on-backplane interconnects (e.g., the number of on-backplane fingers may be a factor of about 10× to 50× less than the number of on-cell IBC fingers) and the fingers on the backplane run essentially perpendicular to the fingers on the cell. The fingers on the backplane may be attached to the surface of the backplane or may be embedded within the backplane and the busbars may be positioned on the backplane. The power electronics component(s) may be mounted on and attached to this backplane surface (with proper electrical insulation if necessary) while connecting the appropriate electrical leads to the base and emitter busbars on the backplane surface (for example by soldering, conductive epoxy bumps, or another suitable attachment technique).

FIG. 20 is a diagram showing the top (backplane side opposite the sunnyside) view of the backplane of the solar cell in FIG. 19 having a suitable thin-format bypass switch directly attached to the solar cell base and emitter terminals on the backplane side (cell backside). On-cell bypass switch 50 is connected to high-conductivity cell metallization (M2) interconnects by electrical lead 52 which is connected to base busbar 42 and emitter busbar 46 by soldered joints 56. As shown, and for example, the M2 interconnect pattern may be an interdigitated pattern with two busbars on two sides of the backplane (emitter and base busbars). The bypass switch may have a very thin flat package (e.g., preferably with a package thickness of less than 1 mm) and high-electrical conductivity terminals (for example in the form of flat ribbons). Each terminal of the bypass switch may be electrically soldered or attached by a conductive epoxy to one or multiple points (multiple points shown) on each busbar (emitter and base busbars) to ensure minimum ohmic losses through the cell when the bypass switch is activated and turned on by shading. The bypass switch electrical leads may be properly electrically insulated from the interdigitated fingers on the backplane.

For example, commercially available representative embodiments of bypass switches for direct assembly on cell backplanes to form smart cells and modules enabling distributed shade management solution (ISIS) include: an thin-package (0.74 mm), low-forward-voltage (low-Vf) 10 A Schottky diode suitable for use as bypass diode (bypass switch); and, an ultra-low-forward-voltage (ultra-low-Vf) component, suitable for use as a near-ideal bypass switch.

Additionally, a low-forward-voltage (low-Vf) switch known as a Super Barrier Rectifier (SBR) using MOSFET technology, may also be suitable for use as bypass switch for direct assembly on cell backplanes to form smart cells and modules enabling distributed shade management solution (ISIS). SBR provides a lower forward bias voltage and lower reverse leakage current than conventional Schottky barrier diode. Further, SBR may provide thermal stability and reliability characteristics comparable to conventional pn junction diodes but with additional properties superior for application in ISIS. Alternatively, a low-forward-voltage (low-Vf) switch called Super Barrier Rectifier (SBR), may also be suitable for use as a bypass switch for direct assembly on cell backplanes to form smart cells and modules enabling the distributed shade management solution of the disclosed subject matter. The combination of low-forward-bias and small reverse leakage for the SBR switch technology may make it a very attractive and suitable bypass switch candidate for ISIS.

Yet another example of commercially available representative embodiments of bypass switches for direct assembly on cell backplanes to form smart cells and modules enabling distributed shade management solution (ISIS) include a low-forward-voltage (low-Vf) switch known as a Cool Bypass Switch (CBS) using MOSFET technology. Various packaging is available for commercially available low-forward-voltage (low-Vf) Schottky diodes and also low-forward-voltage switch called Cool Bypass Switch (CBS) using MOSFET technology.

Figure 21:
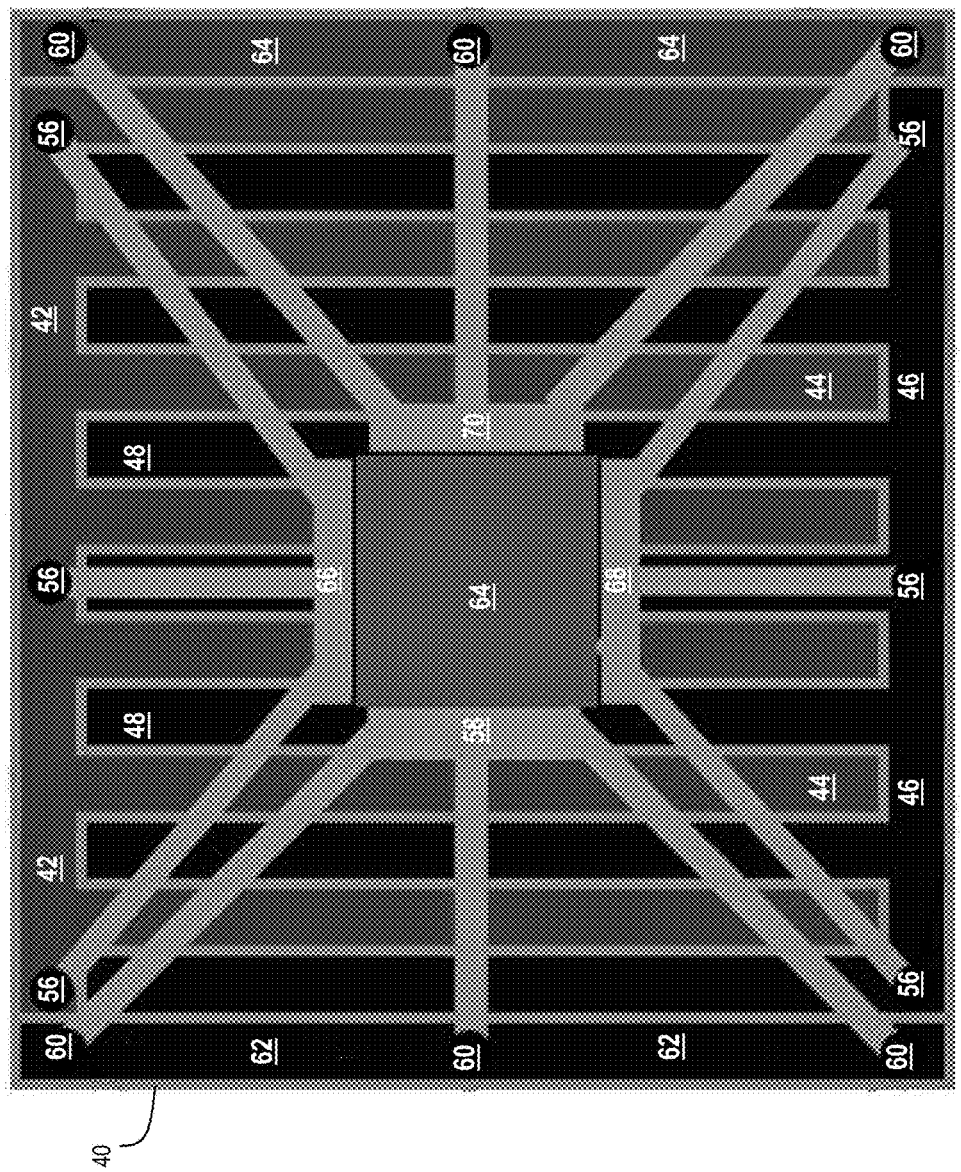
FIG. 21 is a diagram showing the top view of the backplane of the solar cell in FIG. 19 with a DC-to-DC MPPT Power Optimizer, or a DC-to-AC MPPT power optimizer, directly mounted on and attached to the cell terminals, at the emitter and base busbars, on the backplane side.

Distributed Cellular DC-to-DC MPPT Power Optimization or DC-to-AC MPPT Power Optimization by Positioning Power Optimizer Electronics Directly on the Cell Backplanes of Cells: FIG. 21 is a schematic diagram showing the top view of the backplane of the solar cell along with the M2 interconnect pattern in FIG. 19 with a DC-to-DC MPPT Power Optimizer, or a DC-to-AC MPPT power optimizer, directly attached to the cell terminals on the backplane side. In this example shown, the power optimizer chip (either a DC-to-DC or a DC-to-AC power optimizer) is shown to have two input terminals (with inputs connected to the solar cell base and emitter busbars) and two output terminals (which provide the adjusted output current/voltage of the power optimizer chip and are connected to the external pairs of busbars on the backplane). on the input terminals of on-cell power optimizer 64 (for example a DC to DC MPPT or a DC to AC MPPT power optimizer) are connected to high-conductivity cell metallization interconnects by positive input electrical lead 66 and negative input electrical lead 68 which are connected to positive (emitter) busbar 42 and negative (base) busbar 46 of the solar cell by soldered joints 56. And negative output electrical lead 58 and positive output electrical lead 70 connect on-cell power optimizer 64 by adjusted output terminals to negative output lead busbar 62 and positive output lead busbar 64 by soldered joints 60. The on-cell power optimizer 64 effectively provides a variable impedance input for the solar cell in order to operate the solar cell at its maximum-power point at all times, while providing the maximum cell power at its output terminals with pre-specified level of constant current (for current matching in series connected cells) or with pre-specified level of constant voltage (for voltage matching in parallel connected cells).

As shown in FIG. 21, the backplane side of the cell comprises high-conductivity cell metallization interconnects (M2 layer), for example made of aluminum and/or copper. The M2 interconnect pattern may be an interdigitated pattern with two busbars (emitter and base busbars) on two sides of the backplane surface. The MPPT Power Optimizer electronics (for example a single-chip package) has a thin flat package (e.g., preferably with a package thickness of less than 1 mm) and high-electrical conductivity terminals (for example flat ribbons). Each input terminal of the MPPT Power Optimizer electronics may be electrically soldered or attached by a conductive epoxy to one or multiple points on each busbar (emitter and base busbars) in a manner to minimize ohmic losses in the cell. Similarly, each output terminal of the MPPT Power Optimizer electronics may be electrically soldered or attached by a conductive epoxy to one or multiple points on each output busbar in a manner to minimize ohmic losses in the cell.

Output busbars 62 and 64 shown in FIG. 21 are optional. If output busbars are used, they may be formed on the backplane at the same time during the cell fabrication process as the other cell backplane M2 interconnect fingers and emitter and base busbars. If output busbars are not used, the output terminals of the MPPT Power Optimizer electronics may be directly used as the cell output terminals during the final PV module assembly and cell to cell interconnections.

Figure 22:
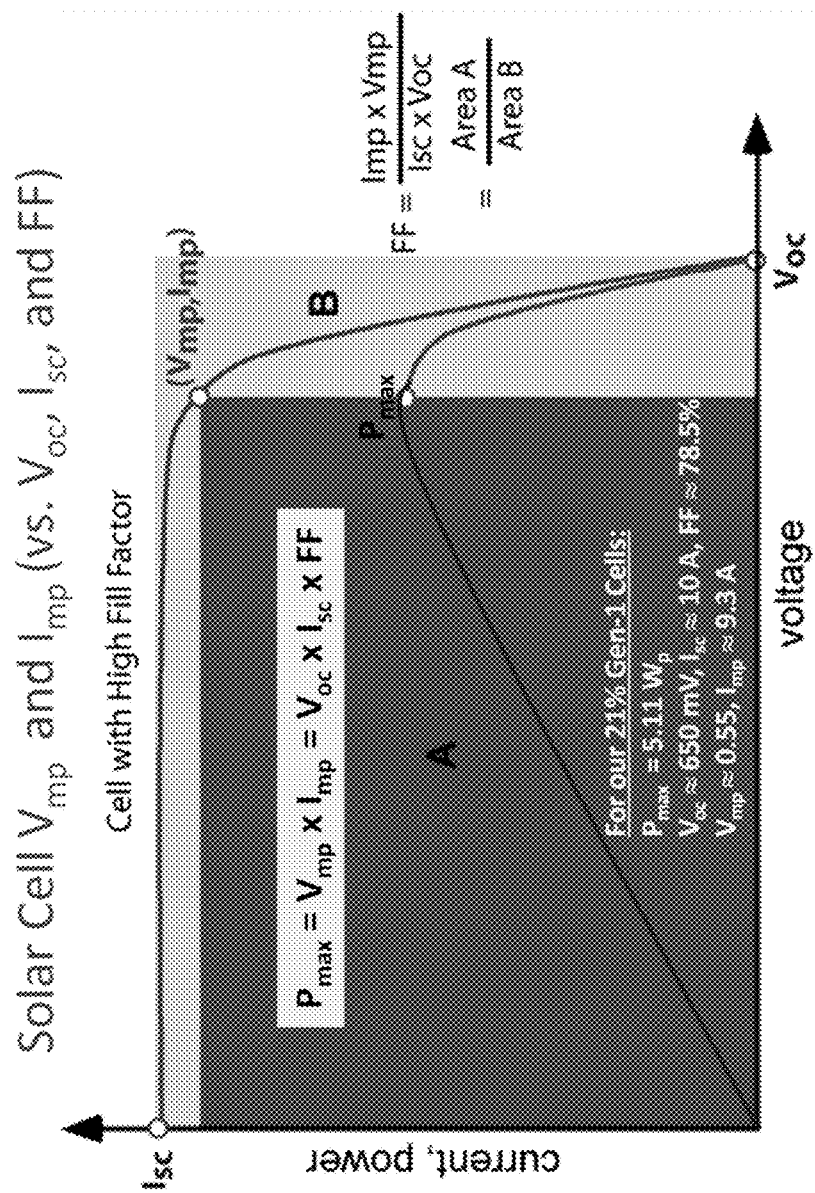
FIG. 22 is a graph showing solar cell IV characteristics and Maximum Power Point (MPP) for maximum power harvesting at a given sunlight illumination level.
Figure 23:
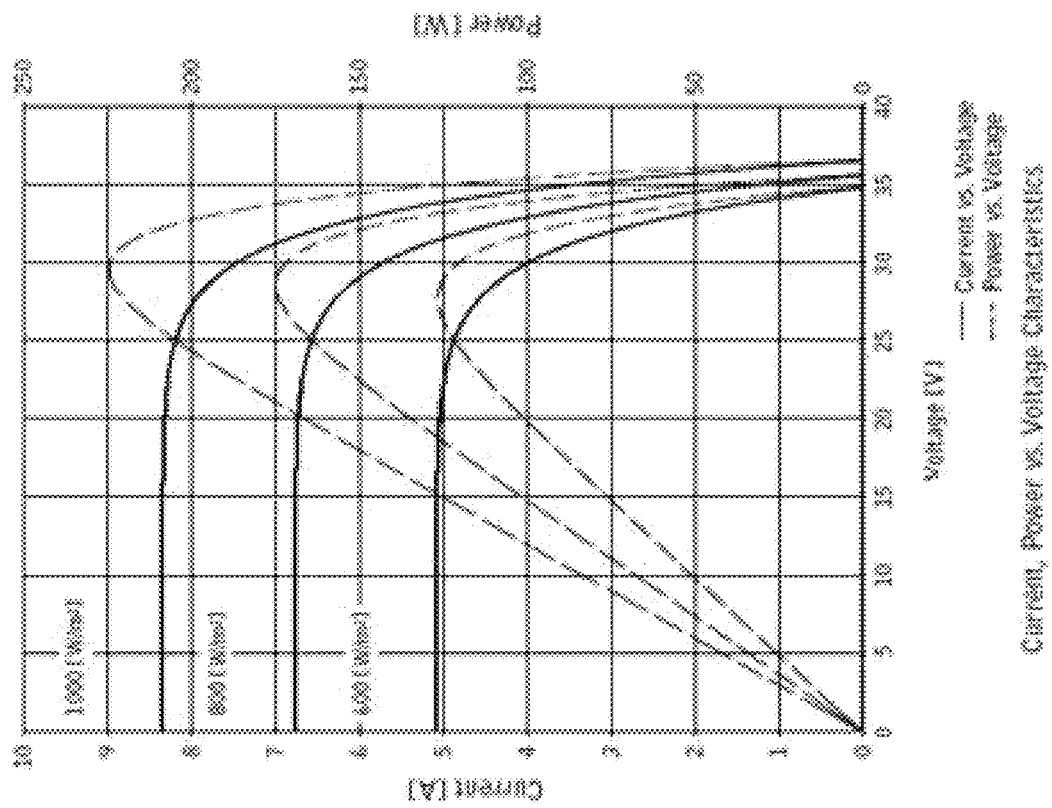
FIG. 23 is a graph for representative a solar module showing power vs. voltage characteristics, and the peak maximum power points of operation, under different solar module illumination intensities.

An aspect of the disclosed subject matter is attachment of MPPT Power Optimizer electronics (DC-to-DC or DC-to-AC) on the cell backplane. FIG. 22 is a graph showing solar cell IV characteristics and Maximum Power Point (MPP) for maximum power harvesting at a given illumination (e.g., 1 SUN illumination). (The MPP is different for different levels of solar cell illumination intensity). And an example, FIG. 23 is a graph for representative solar module IV showing power vs. voltage characteristics under different solar module illumination intensities from ~0.4 sun to ~1 sun. In order to maximize power harvesting from sunrise to sunset, cell embodiments in accordance with the disclosed subject matter enable placement of MPPT Power Optimizer electronics on each cell backside (backplane) in order to maximize energy yield of PV modules and PV systems while achieving very high system level reliability and very low LCOE.

There are a number of commercially available single-chip DC-to-DC MPPT Power Optimizer electronics suitable for the cellular (cell level) MPPT Power Optimization applications disclosed herein. Alternatively, it is possible to design and manufacture a monolithic (or nearly monolithic) MPPT power optimizer which is optimized for a given solar cell. While some example chips may have an overkill design and offer excessive power capability for distributed cell-level MPPT Power Optimizer electronics on cell backside/backplane implementations, much lower power (e.g., 5 to 10 Watt max) single-chip solutions may also be used for direct mounting and attachment onto the cell backplane.

By placing distributed MPPT Power Optimizers on the backplanes of cells and laminating them within solar modules, the distributed MPPT DC-to-DC (or DC-to-AC) Power Optimization solutions disclosed herein provide a wide range of capabilities and benefits including, but not limited to, the following:

- Total mitigation of shading effects and substantial enhancement of power harvesting of PV modules and installed PV systems compared to module-level DC-to-DC inverter box or DC-to-AC micro-inverter box or centralized inverter MPPT power optimization.
- Eliminating the need for separate bypass diodes or bypass switches.
- Harvesting power from shaded cells instead of shunting and bypassing the shaded cells.
- Enabling the fabrication of PV modules from mismatched cells with different binning parameters.
- Reducing the effective cost per watt of manufactured modules.
- Eliminates the need for module-level MPPT DC-to-DC (or DC-to-AC) power optimizers.
- Distributed MPPT Power Optimizers (DC-to-DC or DC-to-AC) mounted onto and attached to each cell backplane prior to final module lamination enables complete remote-access status monitoring, diagnostics, and control at the cell level. Each cell may be remotely monitored and controlled (e.g., by shutting off the cell or turning it back on) and the status of the cells and module may be monitored in real time.

Cell level communications may be provided via wireless communications (WiFi) or RF/AC modulation over the PV Module power leads.

Distributed cellular MPPT Power Optimizer electronics may provide real time status of the cells and their relative performance compared to the other cells in the module and in the installed PV system.

Remote access signals may address and re-program the distributed MPPT Power Optimizer electronics for various tasks such as overall PV module or system shut off or start-up (e.g., during maintenance, installation, start-up, etc.), or adjusting desired MPPT module current and/or voltage, etc.

May provide real-time metrics for the installed PV system in the field, such as cell temperature (on the backplane side).

While the embodiments described herein have been largely explained in conjunction with back-contact/back-junction crystalline silicon solar cells using very thin monocrystalline silicon absorber layers and backplanes, it should be understood that the aspects of the disclosed subject matter may be applied to other solar cell and module implementations by one skilled in the art, including but not limited to the following: front contact solar cells and PV modules comprising such cells; non-crystalline silicon solar cells and modules such as those made from crystalline GaAs, GaN, Ge, and/or other elemental and compound semiconductors; and, wafer-based solar cells including back-contact/front-junction, back-contact/back-junction and front-contact solar cells made from crystalline semiconductor wafers (such as crystalline silicon wafers).

However, as noted earlier, the use of back-contact cells may be advantageous as the aspects of the disclosed subject matter may be applied to back-contact cells without substantially impacting final module manufacturing. Further, availability of both the emitter and base interconnection leads on the backsides of the cells may further simplify the overall implementation of on-cell electronics for enhanced energy harvesting, as well as additional cell-level monitoring and control functions.

The solar cell enhanced distributed power harvest solutions provided herein utilize one or a combination of the following embedded components within the PV module laminates: 1) a local cell-level (or associated with a small group of N cells, such as at least N=2 cells, electrically interconnected together in parallel or in series or in hybrid parallel/series) bypass switch for distributed shade management; 2) a local cell level (or associated with a small group of cells, such as at least 2 cells, electrically interconnected together in parallel or in series or in hybrid parallel/series) MPPT power optimizer. The MPPT power optimizer and bypass switch may be integrated to provide increased solar module power harvest (i.e., increased energy yield) and distributed shade management using low cost and reliable power electronic components associated and connected with an individual solar cell (or in some instances N solar cells connected in series or parallel or in hybrid parallel/series). Thus, for instance, a distributed (e.g., cell level) MPPT power optimizer and integrated bypass switch may operate together to harvest maximum power from unshaded cells in series with a shaded cell AND any available partial power generated by the shaded cells. The cell-level bypass switches also prevents hot spots in the fully shaded solar cells which are not producing any harvestable electrical power.

Further, it may be desirable to modify solar cell parameters to decrease the footprint and cost of the on-cell power electronics component. Importantly, increasing or scaling up the cell voltage and decreasing or scaling down the cell current reduces the power electronics component size, cost, and power dissipation losses at both the cell and module levels. Thus, scaling-up the voltage and scaling-down the current of a solar cell enhances and increases on-cell electronics performance and reduces their size and cost. In one embodiment this is achieved through an isled master solar (or a monolithically isled or monolithically tiled solar cell) comprising a plurality of monolithically-fabricated sub-cells which are electrically interconnected together in series or in a hybrid parallel-series arrangement to scale up the voltage and scale down the current (referred to and described herein as an isled cell or iCell).

Additionally, the electronic components disclosed herein, such as a bypass switch and/or MPPT power optimizer or their integrated combination, may be positioned on a supporting backplane and connected to each solar cell on a per cell basis or multiple cell basis (e.g., two parallel-connected solar cells sharing one MPPT power optimizer and/or bypass switch combination, up to N connected cells in parallel, with N being in the typical range of 2 to 12, and with the solar cells being connected in parallel, in series, or in hybrid parallel-series). In other words, the component itself may be associated with one individual cell or a plurality of cells connected in parallel (e.g., two cells connected in parallel). The design of the cell and/or combination of solar cells connected in parallel or series may result in operation voltage of the embedded power electronic component to 2.5V to 15V and more particularly to 2.5V to 6V for lower cost component implementation.

Modification of cell voltage and current through the iCell design provides enhanced variability in the positioning and cell connectivity of the electronics component, can significantly decrease the component size to reduce module lamination complexity, and may also significantly decrease component cost.

Further, the distributed bypass switch embodiments described herein include a monolithically integrated bypass switch (referred to and described herein as MIBS). Further, bypass switch embodiments of the disclosed subject matter may dissipate less than 10% of solar cell generation power (when the cell is in normal power generation mode), resulting in elimination of localized hot spots for full shaded cells (and increased power harvest from the PV module laminate). In some instances, distributed monolithically integrated bypass switches may be associated individually with the sub-cells of an isled master cell (also known as monolithically-isled or tiled solar cell—called an iCell) as described above to further enhance power harvesting at the sub-cell level.

Additionally, the embedded (embedded within the solar module encapsulant/laminate) component (bypass switch and distributed MPPT power optimizer) may be positioned/attached with the solar cell using a monolithic module interconnection design and process (e.g., integrated with back-contact solar cell interconnection metallization, to reduce or eliminate tabbing, and supported by the solar cell backplane for backplane-attached back-contact solar cells) or attached as a discrete component on each individual cell backside (e.g., SMT or using electrical bussing connectors). Importantly, the backplane (e.g., prepreg sheet) decouples/buffers the sensitive active semiconductor (e.g., silicon) absorber from the electrical component and allows for more robust and reliable fabrication (e.g., soldering or conductive epoxy) and substantially enhanced in-field cell and module reliability (because of much smaller CTE mismatch induced stress of smaller footprint components impacting the semiconductor absorber) without comprising reliability of the solar cell while providing access to both base and emitter terminals of the backplane-attached back contact solar cell. In a two level metallization structure such as that described herein, the coarser second level metallization layer (which may be used both to complete the solar cell metallization and also for cell to cell interconnections in a monolithic module implementation) allows for reliable electronics component placement.

The following solar module power harvesting solutions utilize a localized cell level (individual cells or in some instances a plurality of parallel and/or series connected cells) MPPT power optimizer. In one embodiment, the MPPT power optimizer component may be attached/positioned directly on the cell backplane and embedded within the module laminate (e.g., as described above), or elsewhere embedded within the module laminate as a discrete component. The MPPT power optimizer may be associated with one cell or a plurality of N (with N being between 2 and 12) electrically-interconnected cells (e.g., 1 MPPT power optimizer for 2 parallel connected monolithically-isled solar cells).

In practical field installations and applications, shaded cells within the shaded sections of modules typically still receive significant diffuse daylight and can produce additional electricity which would be wasted unless harvested using a distributed power optimizer design. Portable and transportable power generation applications particularly involve significant sunlight and daylight irradiance distribution non-uniformity patterns with varying irradiance pattern characteristics experienced by the modules during each day. The MPPT power optimizer solutions disclosed herein increase the harvest from the PV assets under such realistic conditions. Thus, solar cell applications which may benefit from the disclosed MPPT power optimizer are numerous and include, but are not limited to: monolithic solar modules with in-line and without end-of-the-line cell test and sort (allowing for increased variances in solar power generation at the cell level); specialty portable and transportable applications (e.g., automotive, portable chargers, etc.); applications involving non-planar module formats (e.g., BIPV rooftop tiles, curved roofs, etc.); residential rooftops (non-uniform solar irradiance, variable shading) allowing for full-area rooftop coverage; commercial rooftops (non-uniform solar irradiance, variable shading); full-area rooftop coverage, and; BIPV façade applications (building façade may typically involves significant irradiance non-uniformities).

Further, the distributed shade management solutions in conjunction with the monolithically-isled or tiled solar cells disclosed herein allow a module to "wake-up" at sunrise earlier and "sleep" at sunset later (compared to conventional modules) as individual cells may be bypassed and do not drag down power generation of the module (or a series connected string of solar cells). The MPPT power optimizer disclosed herein enhances that advantage and allows power generation to begin earlier at dawn and continue longer into the afternoon.

The primary functionalities of the MPPT power optimizer include: a DC to DC converter core (preferably a DC-to-DC buck or voltage step-down converter); an MPPT controller/power optimizer, and; a bypass switch. In one embodiment, the MPPT power optimizer may be formed as a CMOS integrated circuit, such as monolithic CMOS IC. The DC to DC converter core may be a buck (output voltage never higher than input, typically lower), boost (output voltage is higher than input, output current lower than input current), or buck/boost (both functionalities) converter. In some instances, a buck converter may be preferred as it may be typically less expensive and particularly for higher voltage solar cells such as monolithically-isled solar cells it's the desirable design embodiment. The DC to DC converter operates in conjunction with the MPPT controller/optimizer. The MPPT optimizer includes an algorithm that finds the max power point of solar cell on IV curve (see FIG. 22) under all conditions including different solar irradiance levels received by solar cell as well as different solar cell ambient temperatures. The MPPT algorithm allows the DC to DC converter to adjust its input conditions such that the solar cell effectively receives or experiences an effective load impedance that corresponds to the maximum power point (MPP) bias condition for the solar cell (or solar cells that share a single optimizer such as two monolithically-isled solar cells connected in parallel). Importantly, the MPPT power optimizer may be integrated with a bypass switch (such as the disclosed distributed bypass switch solutions including a bypass switch associated with a single cell or N cells connected in parallel, in series, or in parallel/series). The bypass switch may have an ultra-low forward bias (for instance <0.4 V to reduce power dissipation of the solar cell when it's fully shaded and the bypass switch is activated because there is negligible harvestable power to be harvested by the MPPT power optimizer) dependent on cell current, for example a Schottky barrier rectifier (SBR) or Schottky diode.

Described now with reference to the voltage current graph of FIG. 22, the bypass switch may engage whenever the current of the associated solar cell (for instance, a shaded solar cell) drops below a certain threshold compared with the current of cells which are not blocked or shaded (for example a 5-10% current drop, when not using a local cell-level MPPT power optimizer), and below the minimum current level for the MPPT power optimizer to be able to achieve maximum power point and to harvest useful power (when using a local cell-level MPPT power optimizer). The current threshold is based on the current difference of the cell between cell peak power and at short circuit current. In other words, the central MPPT power optimizer from a central inverter sets the series-connected string current at a suitable value to achieve maximum power for the unshaded solar cells.

Further, the MPPT power optimizer may operate autonomously and without a need for synchronization with the other embedded MPPT power optimizers within the module laminate—in other words each MPPT power optimizer autonomously and locally controls the associated solar cell (or plurality of electrically interconnected solar cells) based on circuit law. At the system level, a remote MPPT power optimizer governing the plurality of series-connected solar module laminates attached to its input, for instance the MPPT input of a string inverter, may be utilized to govern the MPPT of the solar cells generating full power without any blockage (a relationship described in detail later). In other words, in the embodiments of this invention, the MPPT function for the "strong" or unshaded solar cells in a series-connected string of module laminates is performed by the main power converter unit (such as the string inverter with MPPT inputs), while the MPPT function for the "weak" or shaded solar cells (or the solar cells receiving less sunlight and hence producing less power than the stronger unshaded cells receiving the full available sunlight) is performed locally by the MPPT DC-to-DC power optimizer attached to the solar cell. For the strong or unshaded cells, the DC-DC-power optimizers associated with those cells operate in the non-switching pass-through mode with extremely low insertion loss, until if and when a strong cell is weakened (e.g., by shading) and produces less power compared to the other strong cells in the series-connected string of module laminates, or the solar cell operating point deviates beyond the allowed tolerance limit away from its MPP condition.

The MPPT tracking algorithm is described with reference to FIG. 22. A simple-to-implement (hence, low cost) MPPT algorithm may be modeled according to one of two proportionality factor algorithms: periodically measure open-circuit voltage Voc or short-circuit current Isc to predict maximum-power voltage Vmp or maximum-power current Imp (in other words Vmp=a*Voc and Imp=b*Isc). Further, Pmax (peak power) is not a fixed point and changes according to different times of the day based on changes in the solar irradiance level and ambient temperature. Typically, when temperature rises, Voc drops, current rises, and the power generated by the solar cell slightly drops. (see FIG. 23). Additionally, Voc may be sampled by open-circuiting the solar cell briefly in various conditions throughout the day (alternatively Isc may be sampled and measured by shorting the cell). Thus, Vmp may be found by multiplying Voc by proportionality constant "a" and Imp may be found by multiplying Isc by proportionality constant "b."

In other words, Maximum-Power-Point (MPP) of the solar cell changes with the solar irradiation level and also with the solar cell operating temperature. One algorithm which may be used in the cell-level MPPT Buck Converter is based on a sample and hold circuit which measures (samples and holds till the next sample) the solar cell $V_{oc}$ (open circuit voltage) at regular intervals (for instance, once every T=1 to 60 seconds), with sampling measurement of $V_{oc}$ being performed over a relatively short time in the range of about 100 microseconds up to about 1 millisecond (e.g., typically <0.1% of the time is used for sampling the solar cell $V_{oc}$ while the cell is open circuited for sample and hold measurements). The solar cell $V_{mp}$ (maximum power point or MPP voltage) is then determined based on a pre-determined factor of $V_{oc}$ (i.e., $V_{mp}=\alpha \cdot V_{oc}$). The proposed approach is fairly simple and low cost to implement and can account for the MPP variations with both light level and solar cell temperature. If necessary, the algorithm may be further refined by measuring and using the cell operating temperature T (measured by on-chip circuit) as an additional parameter, for instance: $V_{mp}=\alpha \cdot (V_{oc}-a \cdot T)$. In general, one may use a pre-measured function f of $V_{oc}$ and T which fits the best to measure $V_{mp}$, thus $V_{mp}=f(V_{oc}$ and T). Importantly, as may be noted in FIG. 22, the power vs voltage slope at the maximum power point is 0 and allows for some level of inaccuracy tolerance in Vmp calculations and Vmp tracking (Voc is measured) thus providing substantial tolerance in Vmp estimation and thus the voltage proportionality factor has built-in fault tolerance (e.g., up to about 5% $V_{mp}$ error or deviation while still able to operate at very close to the MPP for Pmax).

Conversely, an algorithm may be based on current in much the same way. For example, the algorithm may be based on a sample and hold circuit which measures (samples and holds) the solar cell $I_{sc}$ (short circuit current) at regular intervals (for instance, once every T=1 to 60 seconds), with sampling measurement of $I_{sc}$ being performed over a relatively short time in the range of about 100 microseconds up to about 1 millisecond (e.g., typically <0.1% of the time is used for sampling the solar cell $I_{sc}$ while the cell is short circuited). The solar cell $I_{mp}$ (maximum power point or MPP current) is then determined based on a pre-determined factor of $I_{sc}$ ($I_{mp}=\beta \cdot I_{sc}$). The proposed approach is fairly simple to implement and can account for the MPP variations with both light level and temperature. If necessary, the algorithm can be further refined by using the cell operating temperature T (measured by on-chip circuit) as an additional parameter, for instance: $I_{mp}=\beta \cdot (I_{sc}-b \cdot T)$. In general, one may use a pre-measured function g of $I_{sc}$ and T which fits the best to measure $I_{mp}$, thus $I_{mp}=g(I_{sc}$ and T).

And while the MPPT algorithm may be based on current Isc or voltage Voc (and irradiance level is the primary factor in power generation), in some instances Voc may be chosen based on the direct relationship between ambient temperature variations and power generation and Voc. Typically, when temperature rises, Voc drops, current rises, and the power generated solar cell slightly drops—thus Pmax and Voc move in the same direction with the ambient temperature effects, and have a direct relationship based on ambient temperature variations. Therefore, a simple $V_{oc}$-based proportionality algorithm may be used for MPPT, to account for all MPP variations due to the solar irradiance and ambient temperature changes.

Figure 24:
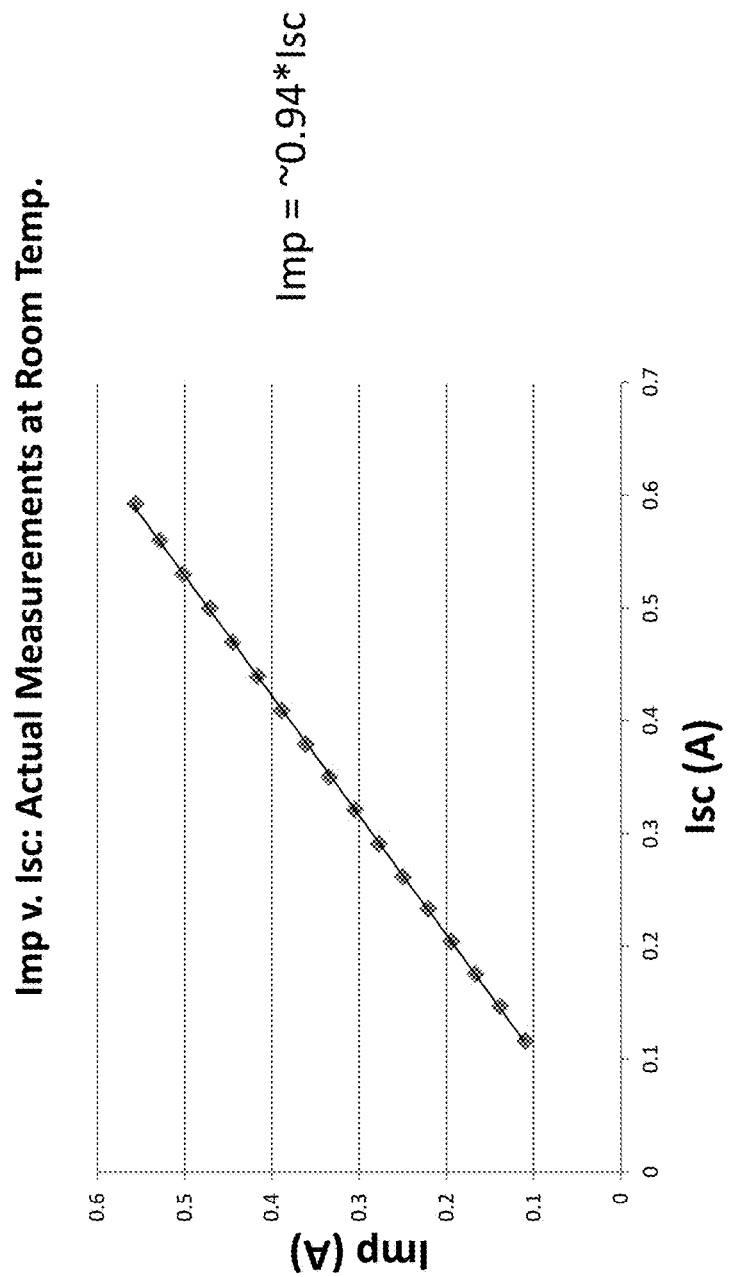
FIGS. 24 through 27 are graphs showing current and voltage measurements relating to solar cell maximum power point.
Figure 25:
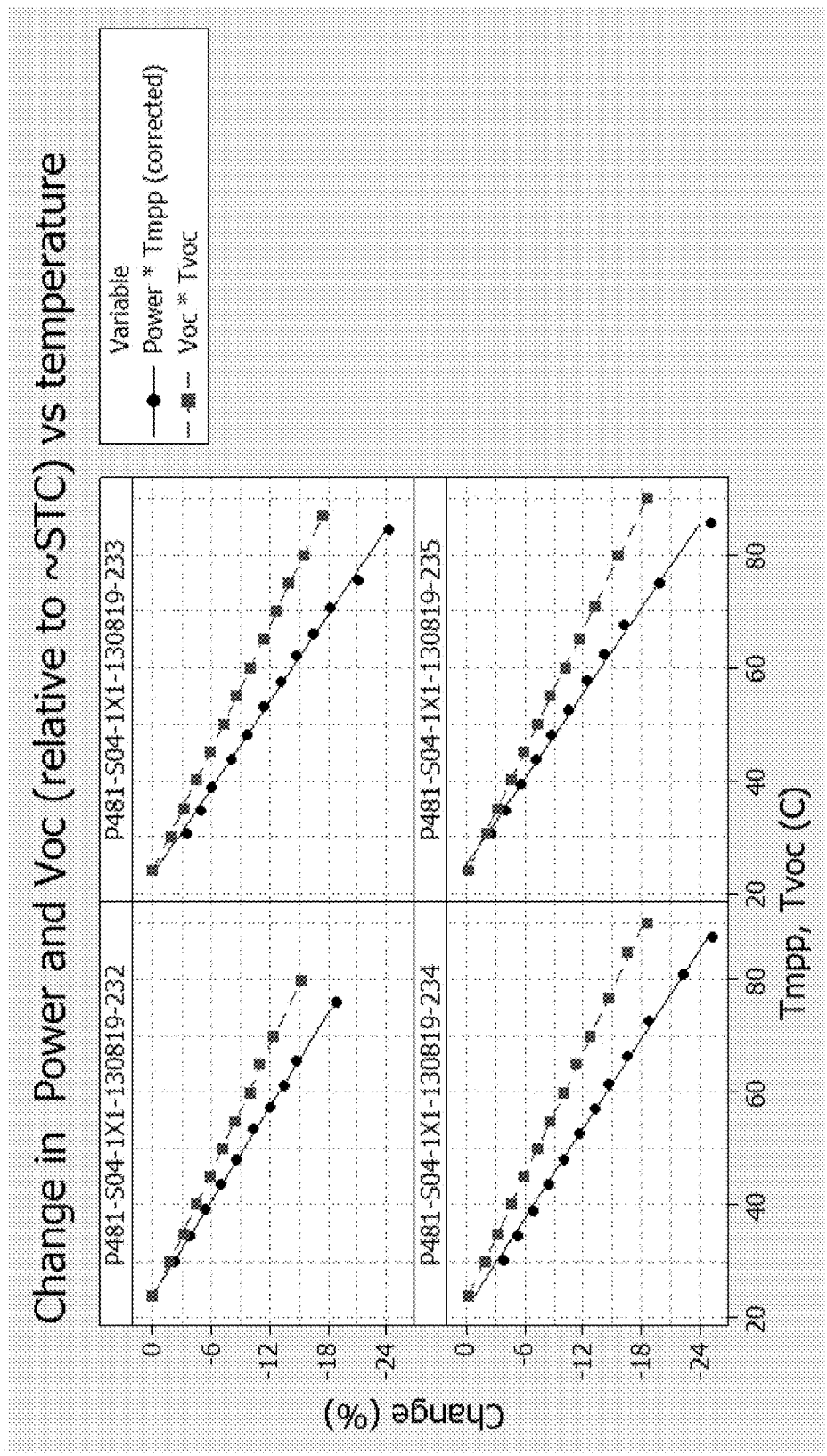
Figure 26:
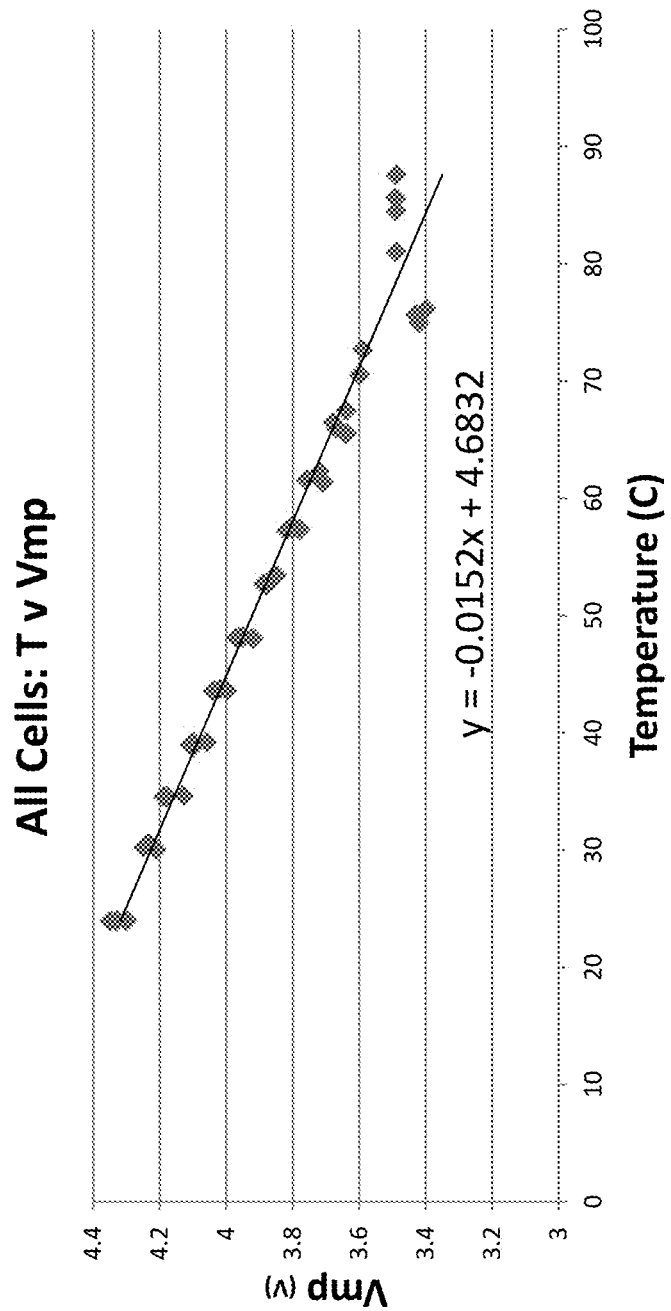
Figure 27:
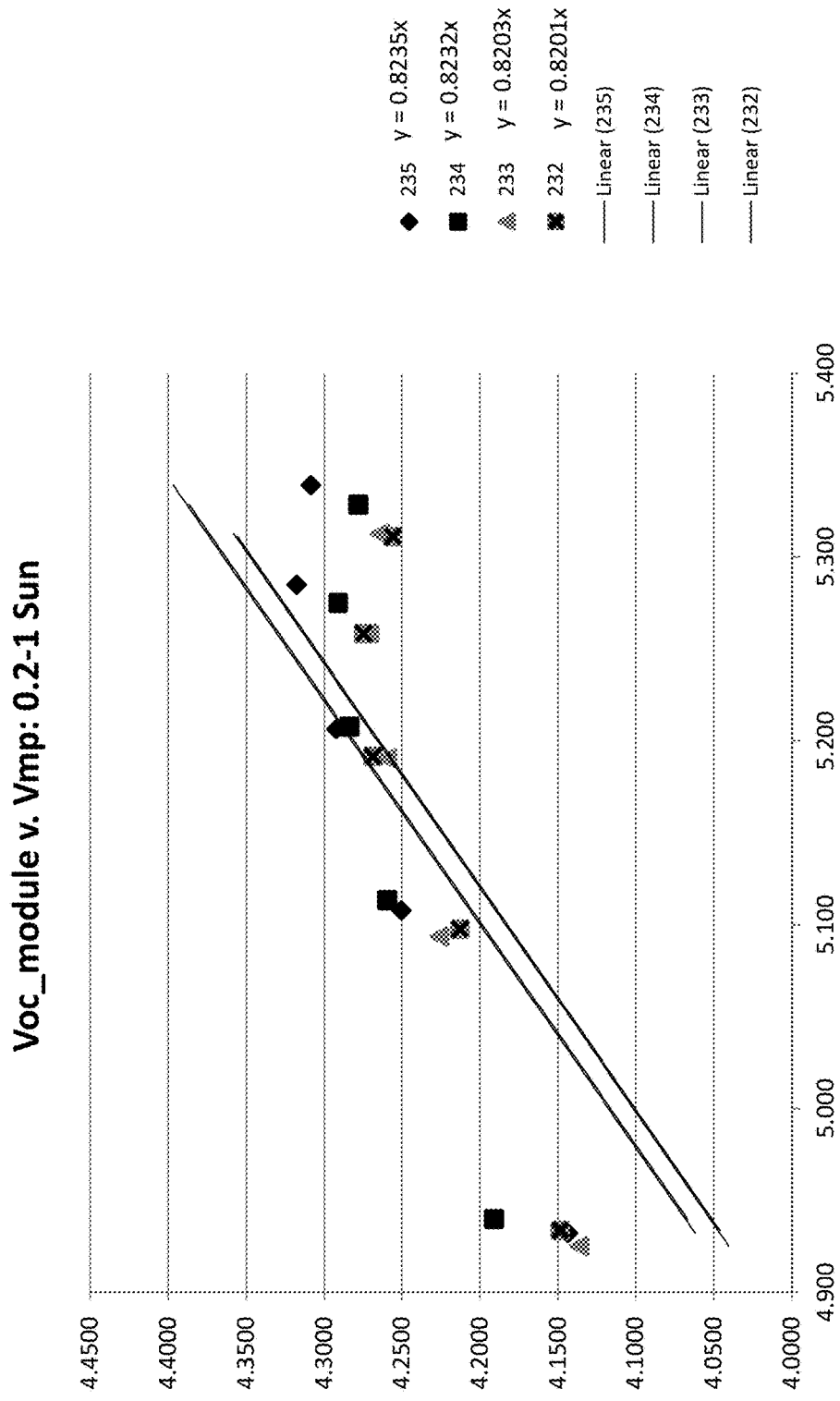

FIGS. 24 through 27 are graphs supporting a simple and cost effective proportionality algorithm, such as that provided herein. FIG. 24 is a graph showing measured Isc vs. Imp for a solar cell at room temperature (25° C.), provided for descriptive purposes and showing Isc may equals approximately 0.94*Isc. FIG. 25 is a graphs showing actual measurement of cell performance vs. temperature and provided for descriptive purposes. FIG. 26 is a graph showing actual measurement of cell showing the direct relationship between voltage and temperature variation. FIG. 27 is graph showing actual measurement of a solar cell indicating the measured correlation between Voc and Vmp. FIG. 27 provides an example of actual Voc measurement for a specific solar cell, outlines the Vmp Voc relationship, and shows Vmp linear approximation at 0.82×Voc resulting in only 0.36% error (given fault tolerance of peak power zero slope, deviation from peak power with error in Vmp is negligible). Thus, FIG. 27 supports Vmp may be approximated linearly with small peak power prediction errors over a wide range of solar irradiance and temperature conditions. Further, the actual deviation in peak power due to Vmp prediction error is minimal due to the substantially small slop of Pmax vs voltage (the slope is zero at the peak power point).

Figure 28:
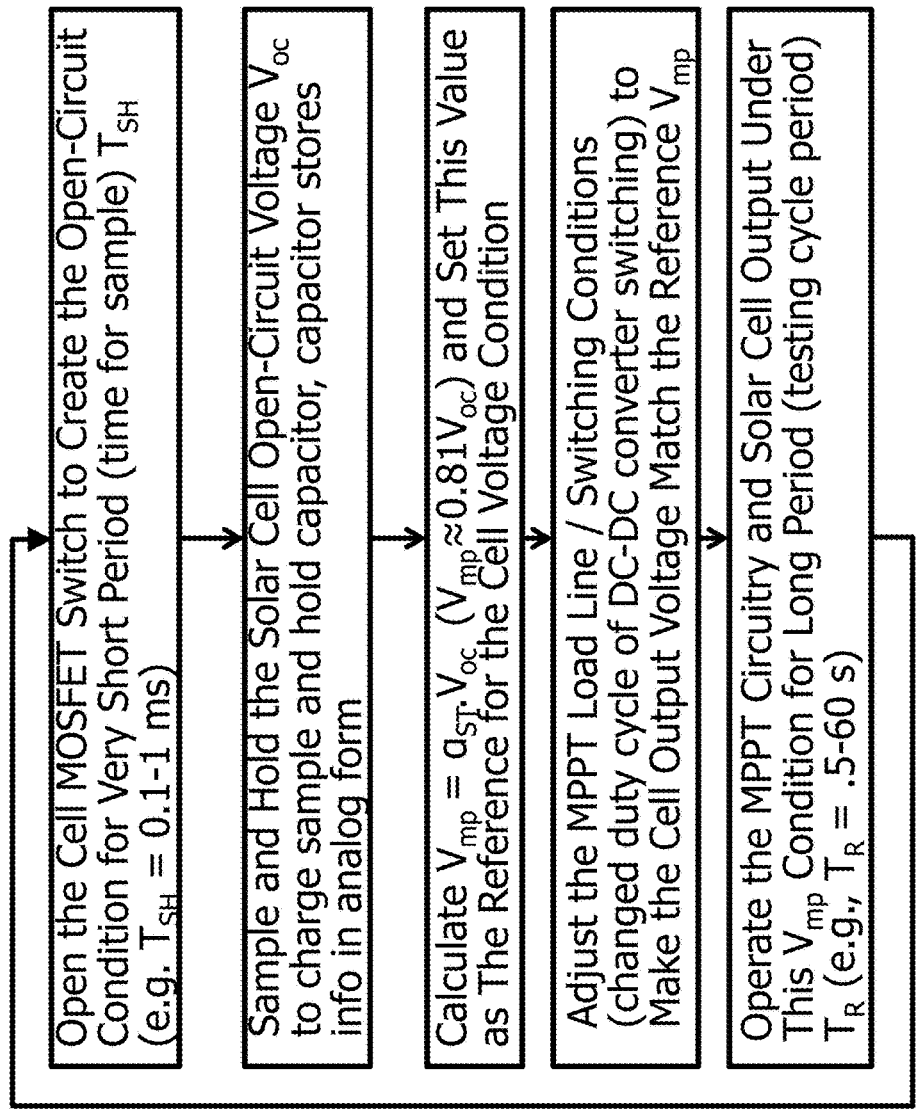
FIG. 28 is a representation of a low cost and effective MPPT $V_{mp}$ vs $V_{oc}$ tracking proportionality algorithm.
Figure 29:
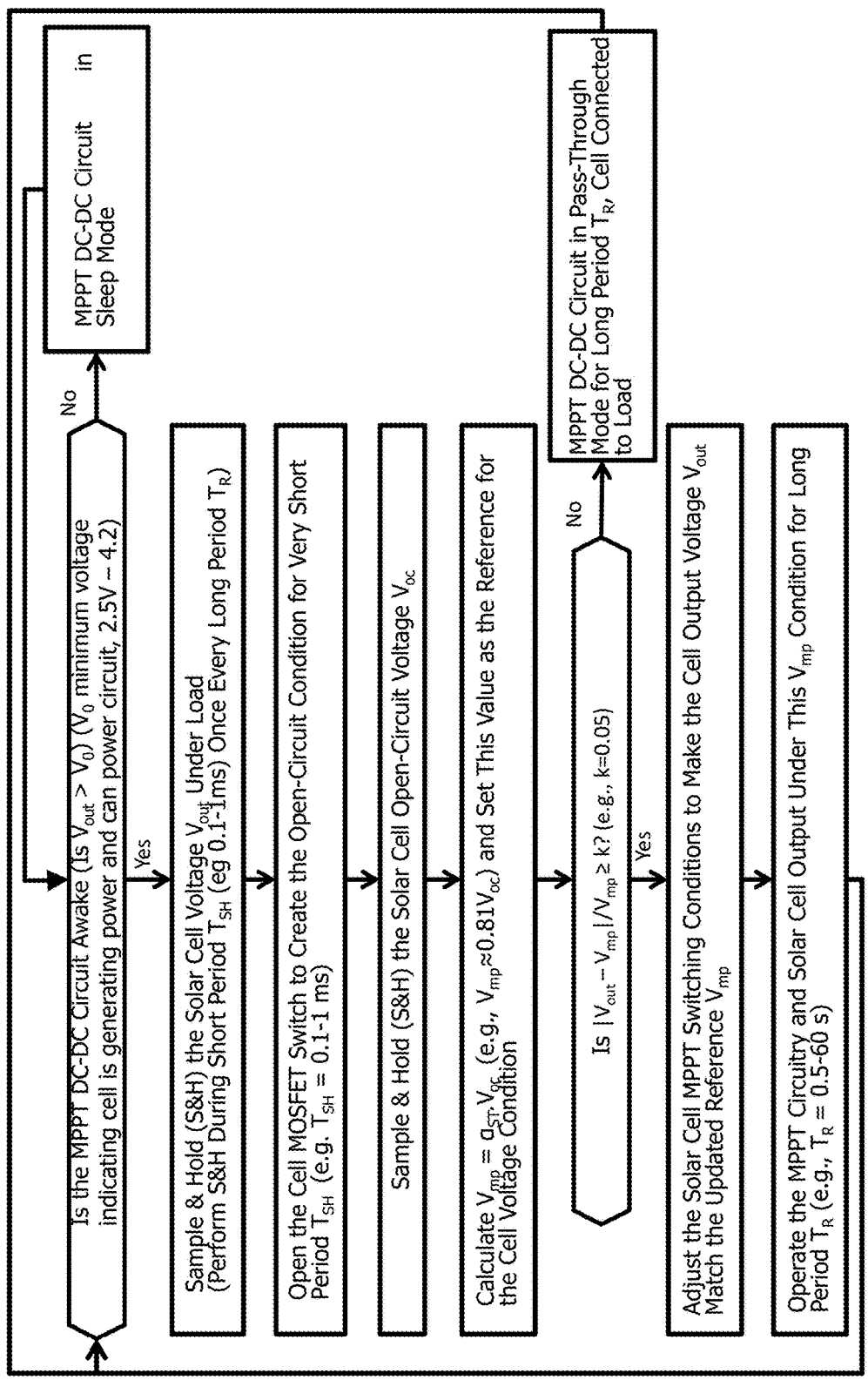
FIG. 29 is detailed Maximum-Power-Point Tracking (MPPT) algorithm.

Based on these observations, a simple and cost effective MPPT voltage proportionality factor algorithm may be based on the following: tracking parameter $V_{mp}=\alpha \cdot V_{oc}$; temperature effects are calculated at: $\alpha_T$=0.80; illumination intensity (suns) effects: $\alpha_{SUNS}$=0.82; error: $0.02 \cdot V_{oc}$ at MPP is about 0.3%. Therefore, it is possible to track MPP using $V_{oc}$ with just one average multiplier parameter $\alpha_{ST} \approx 0.81$ to account for the effects of both the solar irradiance and temperature variations. Therefore, based on the above description a simple $V_{mp}$ vs $V_{oc}$ proportionality algorithm to track MPP variations due to both illumination and temperature changes may be used for a specific solar cell structure, such as a monolithically-isled solar cell (iCell). Further, as temperature is included in UT (resulting in the increase from 0.80 to 0.81) measurement of the cell temperature in the MPPT chip may not be required thus further simplifying and reducing the complexity and the insertion loss of the MPPT DC-to-DC power optimizer power electronics circuit. By using the $V_{oc}$ sample and hold measurement in conjunction with the multiplier $\alpha_{ST} \approx 0.81$, $V_{mp}$ may be calculated accurately without the need for complex circuitry. The actual proportionality factor may be different for different solar cell technologies but the algorithm of this invention can be applied to a wide range of solar cell technologies. FIG. 28 is a simplified representation of a low cost and effective MPPT $V_{mp}$ vs $V_{oc}$ tracking proportionality algorithm embodiment accounting for the effects of both the illumination intensity and temperature variations based on the above observations. Thus, the MPPT tracking algorithm of this invention reduces the implementation complexity and cost while suitably approximating Voc and tracking the solar cell maximum power point with reasonable accuracy. FIG. 29 is a more complete representation of the Maximum-Power-Point Tracking (MPPT) algorithm embodiment accounting for both illumination intensity and temperature variations and providing enhanced time-averaged MPPT DC-DC conversion efficiency (or reduced time-averaged insertion losses) based on a combination of two functional states: (1) non-switching pass-through mode (when a solar cell MPPT is tracked and set by the central power conversion unit such as a string inverter MPPT input connected to a string of series-connected module laminates), and, (2) switching-mode of the MPPT DC-to-DC power optimizer unit when the solar cell MPPT is tracked and set by the local cell-level MPPT DC-to-DC power optimizer.

In order to minimize the insertion loss and maximize the efficiency of the MPPT buck converter, the MPPT power optimizer/DC-to-DC buck converter (which is powered by the cell or cells associated with it) has two primary active functional states (PASS THROUGH mode and SWITCHING mode) during which cell power is monitored (sample and hold), and an additional SLEEP mode (when the power optimizer is powered down when the solar cell is not producing any power).

For example, when there is light and the MPPT DC-DC (buck) converter is not operating in the active switching mode (not switching), the MPPT DC-DC converter should operate as a pass-through gate (thus minimizing resistor loss), delivering the cell current and voltage to its output terminals without any changes—this is referred to as PASS-THROUGH MODE. When there is no light (e.g., a fully shaded cell or between sunset and dawn), the MPPT DC-DC converter is not powered and is in the SLEEP MODE. The MPPT DC-DC converter wakes up when the cell wakes up and begins to generate power (e.g., at sunrise) and powers up the MPPT DC-DC power optimizer—in other words the MPPT DC-DC power optimizer is powered by the solar cell and once the solar cell achieves a minimum level of power generation at the beginning of the day, it powers the MPPT power optimizer circuit waking it up. For example, when the output voltage of the solar cell exceeds a preset voltage: $V_{cell} \geq V_0$, where $V_0$ represents the solar cell voltage under extremely low light condition (e.g., at dawn). For an ideal solar cell: $V_{oc} \approx (kT/q)\ln(I_L/I_0)$, where $V_T = kT/q$, and $I_L \approx I_0 \exp(V_{oc}/V_T)$. If $V_0$ is selected to correspond to the condition when the solar cell is producing $1/1000^{th}$ of its STC current, then: $1/1000 = [\exp(V_0/V_T)]/[\exp(V_{oc}^{STC}/V_T)]$. Thus, $1/1000 = \exp[(V_0 - V_{oc}^{STC})N_T]$, then $V_0 = V_{oc}^{STC} + (\ln 0.001) V_T = V_{oc}^{STC} - 0.173$ V.

For a particular solar cell, $V_0$ may be approximated based on $V_{oc}^{STC} - 0.173$ V. Then, based on an approximate $V_{oc}$ and $V_{mp}$ for a particular solar cell an MPPT DC-DC wake-up voltage may be selected. For example for a monolithically-isled solar cell embodiment, $V_{oc} = 5.6$V and $V_{mp} = 4.6$V then a wake up voltage between 2.5V and 4.2V may be suitable to wake up the MPPT power optimizer circuit. In this case, the MPPT DC-DC wakes up when the solar cell voltage $V_{out}$ builds up to $V_0 = 3.5$ V and goes to sleep when the solar cell voltage drops below $V_0 = 3.5$ V—the MPPT buck converter may wake up in pass-through mode and will continue to operate in pass through mode until the operating power point of the solar cell is beyond the allowed deviation tolerance limit percentage (e.g. with the tolerance limit being set in the range of about 1% up to 5%, such as 2%) from max power point (at which point the MPPT power optimizer moves to the switching mode of operation).

When the DC-DC buck converter is switching (e.g., in the range of few hundred KHz to 10 MHz) to match the cell voltage output to the reference $V_{mp}$ there is a relatively higher insertion loss (e.g., about 3% to 10% of insertion loss, corresponding to a switching-mode transfer efficiency of about 90% to 97%). In comparison, in pass-through mode the insertion loss (based on series resistance) may be designed to be less than 1% (and in some instances even less than 0.5%), resulting in >99% transfer efficiency (transfer efficiency is power efficiency of the MPPT DC-DC BUCK converter/power optimizer). Thus, it may be critical to minimize insertion loss and maximize transfer efficiency of the MPPT DC-DC Power Optimizer.

The following algorithm based on a dual active functional state MPPT power optimizer (PASS-THROUGH mode and SWITCHING mode) may be used to maximize the time-averaged effective conversion efficiency (power transfer efficiency) of the MPPT DC-DC converter/power optimizer circuit.

1. Measure (sample and hold) the solar cell output voltage $V_{out}$ under load in operation. 2. Measure (sample and hold) the solar cell open-circuit voltage $V_{oc}$. 3. Determine $V_{mp} = \alpha_{ST} \cdot V_{oc} = 0.81$ Voc: if cell is working at MPP then $\Delta V$ is 0: if $\Delta V = |V_{out} - V_{mp}|/V_{mp}$ is less than a pre-specified allowed tolerance deviation value k (e.g., k=0.05 or 5%) and $\Delta V = |V_{out} - V_{mp}|/V_{mp} < 0.05$), then the MPPT DC-DC converter does not perform any active switching operation (remains in observation/pass-through mode with very low insertion loss), at peak power the power-vs-voltage slope is zero (high tolerance of MPP): if $\Delta V = |V_{out} - V_{mp}|/V_{mp}$ is greater than (or equal to) a pre-specified value k (e.g., k=0.05 and $\Delta V = |V_{out} - V_{mp}|/V_{mp} \geq 0.05$), then the MPPT DC-DC buck converter proceeds with performing localized MPPT tracking by adjusting the DC-DC converter switching duty cycle and the resulting output voltage of the solar cell to match $V_{mp}$.

For example, if the conversion efficiency of the MPPT DC-DC optimizer is $\eta$ and it operates around F fraction of time, the effective time-averaged efficiency of the MPPT optimizer would be $(1-F)+\eta \cdot F$. For instance, if the optimizer works (is in SWITCHING mode) 25% of the time (F=0.25), and if the SWITCHING mode (continuous-mode) conversion efficiency of the optimizer is $\eta$=96%, and the optimizer is in PASS THROUGH mode 75% of the time assuming a conversion efficiency of 100% (assuming zero insertion loss in the pass-through mode), then the effective time-averaged efficiency of the optimizer is: $(1-0.25)+0.96 \times 0.25 = 0.75+0.24 = 0.99$ or Effective Transfer Optimizer Efficiency=99%. In the event the PASS THROUGH mode may be approximately 99% in which case the effective time averaged efficiency (or power transfer efficiency) of the MPPT DC-DC power optimizer is $(0.75 \times 0.99)+(0.96 \times 0.25)=98\%$.

Sample and hold monitoring occurs during both SWITCHING and PASS THROUGH modes and is off when there is no electrical power and the MPPT is in SLEEP mode (at night when there is no solar cell power generation).

The primary modes of operation for the embedded distributed MPPT DC-DC power optimizers of this invention are as follows:

1) In the pass-through mode, the optimizer is not switching and the insertion loss can be made negligible (e.g., <1%). In practice, the solar cell operates in pass-through mode most of the time thus allowing for the switching mode to operate at a relatively high frequency (e.g., about 300 KHz up to 10 MHz and specifically in the range of about 500 KHz to 5 MHz), resulting in smaller footprint and lower cost circuits requiring much smaller energy storage devices (capacitors and inductors). In this mode, the circuit may have an insertion loss less than 0.5-1%.

2) A switching mode during which the MPPT DC-DC power optimizer adjusts the DC to DC input conditions by adjusting the switching duty cycle such that the solar cell effectively receives a load impedance that corresponds to the maximum power point bias condition for the solar cell.

3) Sleep mode when the cell generates essentially zero power (e.g., nighttime) and/or the bypass switch is activated.

Importantly, the MPPT DC-DC power optimizer matches its output current to that of the other series connected power optimizers (or cells for those with the MPPT DC-DC power optimizers in the pass-through mode) and adjusts its output voltage upward (up to near the cell voltage at its input) or downward according to the power generated by the cell and engages the bypass switch at the lowest voltage output where circuit still functions—at which point the MPPT power optimizer switches to PASS THROUGH mode. In other words, when the generated cell power is below the MPPT DC-DC power optimizer threshold value for its effective operation (for instance, due to substantial shading and reduction of solar irradiace), the bypass switch is activated and bypasses the solar cell and the MPPT DC-DC power optimizer associated with it.

Key aspects and embodiments of the disclosed distributed MPPT DC-DC Power Optimizer include: the use of two primary operating states for each of the distributed (and in some instances autonomous) MPPT DC-DC Power optimizers: (1) a DC-DC switching operation mode providing localized MPPT function based on adjustments of the switching duty cycle at a fixed switching frequency the cell level when a given cell behaves weaker (i.e., producing less power compared to the strong cells on the same series-connected string of module laminates, for example, because of receiving less light such as because of some shading) as compared to the stronger cells (i.e., those producing more power or full power because of no shading conditions) in a series-connected string of MPPT DC-DC power optimizers, and (2) a pass-through operation mode allowing direct transfer of the solar cell power without any localized DC-DC switching and without any localized cell-level MPPT, allowing for the central (e.g., string inverter at power conversion unit) MPPT to govern the strong cells in the series-connected string of power optimizers. This structure allows for very high effective operation efficiency or power transfer efficiency (or very low insertion loss of the distributed optimizers) since the localized switching-mode operation is only performed when a given solar cell (or group of solar cells) connected to an optimizer is weaker (or produces less power) as compared to the other "strong" solar cells in the series-connected string (or has a current mismatch or less current compared to the other cells in the series-connected string of optimizers). Additionally, these dual modes allow for much higher switching frequency operation of the MPPT DC-DC converter power optimizer in the switching mode (as it is not switching at all times) which allows further benefits including substantially smaller input and output energy storage capacitors and much smaller output energy storage inductor (further reducing the footprint of the distributed embedded MPPT power optimizer).

Autonomous operation of the disclosed MPPT power optimizer means that the distributed MPPT DC-DC Power Optimizers operate independent of one another and at substantially the same frequency, hence, they do not require to receive a frequency synchronization signal and do not require phase control with respect to one another in a series-connected string of power optimizers.

As described above, the disclosed distributed MPPT power optimizer uses two primary modes of operation allowing for either localized switching-mode MPPT using MPPT DC-DC Power Optimizer operation in the switching mode (with a switching duty cycle of <100%) performing localized MPPT function, or non-switching-mode MPPT Power Optimizer operation in the non-switching pass-through mode allowing for remote MPPT governing the solar cells with pass-through-mode DC-DC Power Optimizers. Remote MPPT function may be performed by the central or string inverter (or converter) having its own MPPT function. The choice between the switching mode with localized MPPT and pass-through mode with remote central MPPT is made automatically, by the combination of the central or string inverter (or converter) and the plurality of electrically interconnected (series-connected) MPPT Power Optimizers associated with said central or string inverter (or converter).

The dual modes of switching mode and pass-through mode of operation are enabled by the cooperative use of the localized MPPT DC-DC buck converters with the system-level MPPT inputs of the DC-AC inverter (e.g., the string inverter or central inverter) OR the system-level MPPT inputs of the DC-DC converter (e.g., the string converter or central converter). The disclosed algorithm may use a combination of distributed MPPT (in conjunction with the plurality of MPPT DC-DC power optimizers) AND central (for strong-type unshaded cells producing their full available power) DC-AC inverter or DC-DC converter with central MPPT in order to enable this multi-state mode of operation for maximum effective system level power transfer efficiency, while enabling MPPT operation for all the solar cells in the PV system.

The disclosed subject matter may also utilize a bypass switch (e.g. a bypass diode or a bypass transistor) for distributed shade management in conjunction with each MPPT DC-DC power optimizer. The bypass switch may be an input-stage bypass switch separate from the solar cell, an output-stage bypass switch separate from the solar cell, and/or MIBS which is monolithically integrated with the solar cell itself. In case of extreme shading when the MPPT DC-DC power optimizer cannot effectively harvest useful power from the solar cell (and such operation is below the capability limit of the MPPT DC-DC converter power optimizer circuit), the bypass switch will activate and bypass the solar cell and the MPPT DC-DC power optimizer to allow the current flow for the system without creation of hot spot in the affected solar cell.

The disclosed MPPT algorithm uses a simple to implement proportionality algorithm in conjunction with sample and hold circuitry. The algorithm measures both the open circuit voltage (Voc) and the actual output voltage under load of the solar cell in order to determine the desired operating condition of the MPPT DC-DC buck converter (pass through mode vs MPPT DC-DC switching mode to achieve maximum power transfer efficiency or minimum insertion loss for the actual system operation while achieving distributed MPPT at the individual solar cell levels using an energy-efficient algorithm). Further, the MPPT DC-DC buck converter is able to operate at a much higher switching frequency in switching mode (because it is in switching mode only a fraction of the time) since the solar cell MPPT function is performed by the central inverter (or string inverter) MPPT whenever the cell is in strong mode and is unobstructed (unshaded), while the MPPT DC-DC power optimizers are in the pass-through mode for the strong cells.

Some embodiments may use a combination of a shared output shunt capacitor and a shared output series inductor with a plurality of series-connected MPPT DC-DC converters. A combination of the output shared storage inductor and capacitor may filter out and reduce the current and voltage ripples.

The MPPT power optimizer may operate as autonomous units (meaning cell MPPT DC-DC buck converters are not frequency synchronized; the autonomous mode of operation is enabled because the MPPT DC-DC converter does operate at a much higher switching frequency) for simplest, smallest footprint chips, and lowest cost implementation of the distributed MPPT DC-DC buck converters. Synchronization adds to the design complexity and cost of the distributed MPPT power optimizers and ideally should be avoided. The embodiments disclosed may utilize a plurality of series-connected autonomous MPPT DC-DC Power Optimizers with a fixed (pre-designed) switching-mode frequency (switching frequency does not change, duty cycle changes to adjust the MPP) in the range of about 300 kHz up to about 10 MHz and preferably in the range of about 0.5 MHz up to 5 MHz. The frequency in the switching mode of operation is preferably fixed and does not change. Localized MPPT is achieved by varying and adjusting the switching duty cycle based on the MPPT algorithm.

Thus, the disclosed MPPT power optimizer may be implemented as substantially monolithic single-chip silicon integrated circuit (because of substantially simpler circuit with far fewer and much smaller capacitors) because of lack of the circuit complexity associated with charge-pump circuit, microprocessor for MPPT implementation, ADC, and also because of much higher operating switching frequency for the MPPT DC-DC buck converter. Higher operating frequency (hence, much smaller, simpler, and lower cost implementation) is enabled by the algorithm using two primary modes of operation (switching mode and pass through mode) which provides a very low time-averaged effective insertion losses for the MPPT DC-DC Power Optimizers.

Various PV system configurations may be structured utilizing the distributed shade management bypass switch and embedded MPPT power optimizer of the present application in combination with a remote/central/system level MPPT power optimizer. The remote MPPT power optimizer may be any power optimizer serving a string of series connected MPPT power optimizers, for example at the central power inverter level and integrated with power inverter (e.g., a string inverter with MPPT power optimizer). Ideally, in most cases the cells in the system are not shaded, are operating at full power capability without being shaded, and the individual local distributed embedded cell level MPPT DC-DC power optimizers are mostly operating in pass through mode to reduce insertion loss attributed to the local distributed embedded MPPT power optimizer. Pass through mode has a very low insertion loss, in some instances well below 1% power insertion loss. In this case, the unshaded cells are governed by the remote/central MPPT power optimizer. In other words, for a cell generating full power the local distributed embedded MPPT power optimizer algorithm operates in pass-through mode to minimize insertion loss and allows the cell generating full power to be governed (current and voltage) by the remote MPPT power optimizer. When an individual cell produces lower power (e.g., the cell shaded or soiled), for example 90-97% of peak power, the local MPPT optimizer takes control from the remote MPPT power optimizer and moves from pass-through mode to switching mode to current match the shaded cell to cells in the series producing at peak power and which remain governed by the remote MPPT power optimizer. Thus, the remote/central MPPT power optimizer dictates the global condition for maximum power point which governs fully generating solar cells. The local cell level distributed embedded MPPT power optimizers operate in pass-through mode and only engage when cell power drops. In other words, a cell is governed by the remote/central MPPT unless the distributed embedded cell level MPPT engages (i.e., moves to switching mode).

Figure 30:
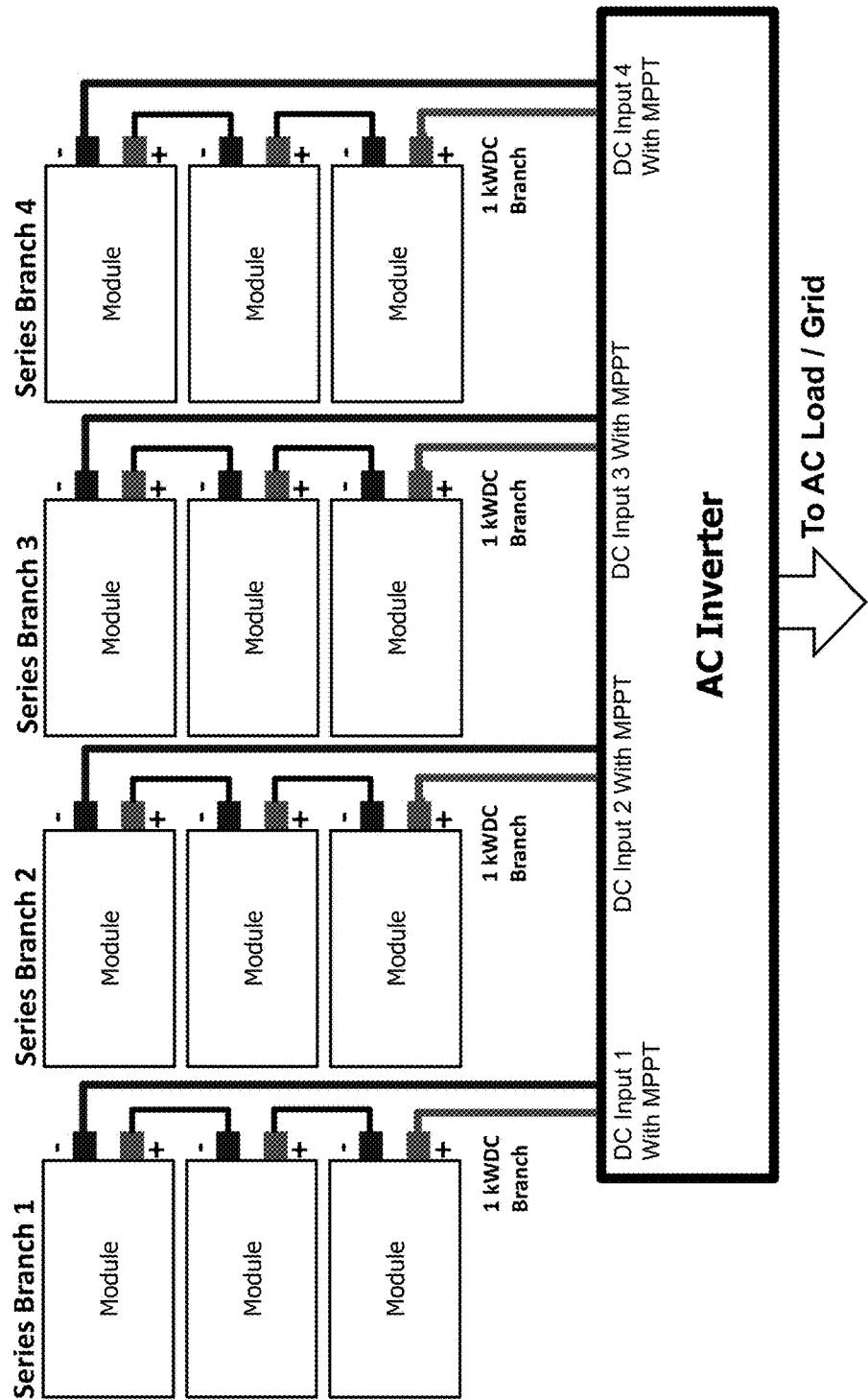
FIG. 30 shows a PV system having twelve solar cell modules each utilizing distributed shade management bypass switch and embedded MPPT power optimizer functionality.
Figure 31:
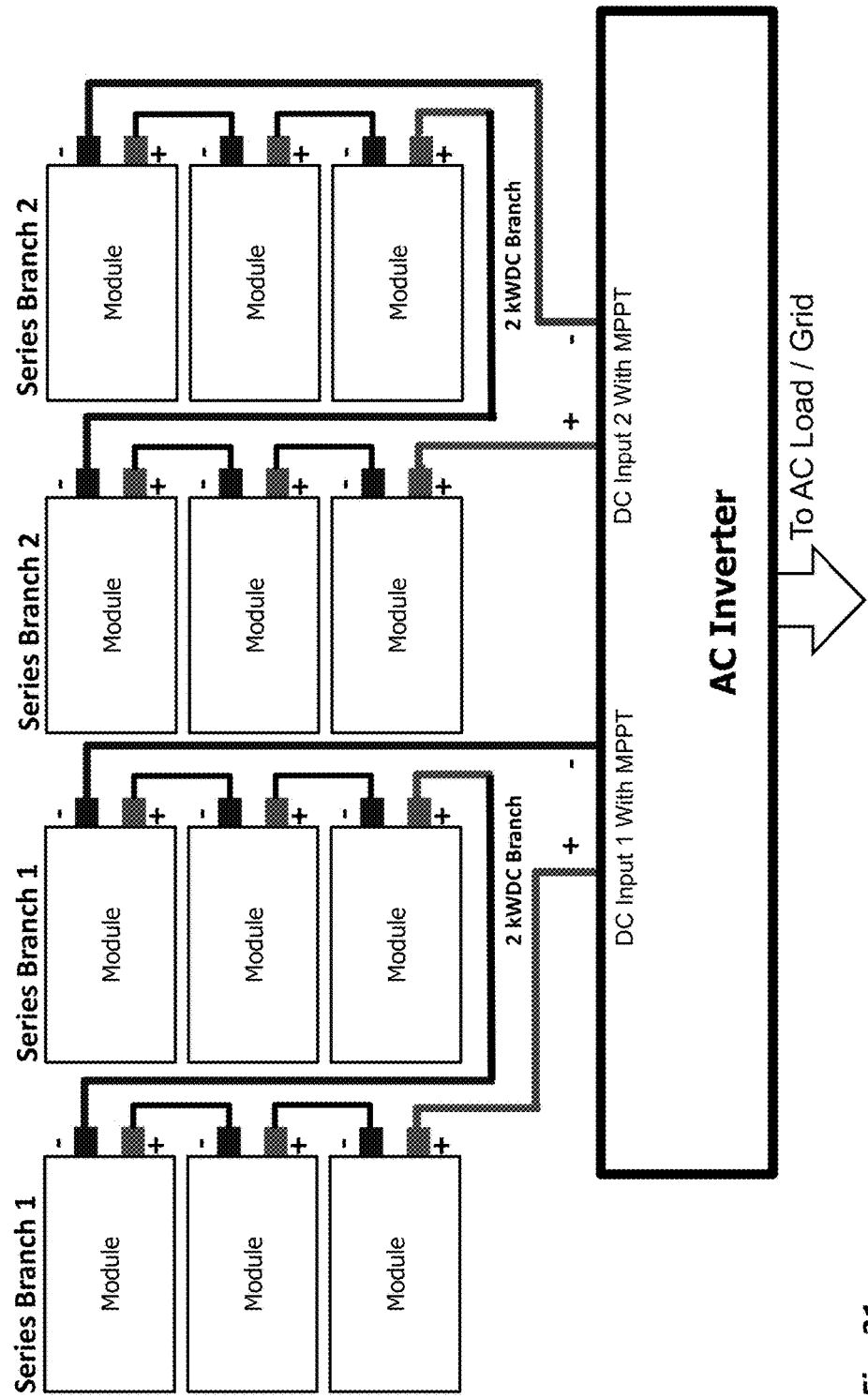
FIG. 31 shows a PV system having two pairs of six series connected solar cell modules each utilizing distributed shade management bypass switch and embedded MPPT power optimizer functionality.

For example, FIG. 30 shows a PV system having twelve solar cell modules (e.g., 60 cell modules) each utilizing distributed shade management bypass switch and embedded MPPT power optimizer functionality and shown with exemplary module power production. The PV system shown utilizes three series connected full voltage modules per AC inverter input (i.e., a four input string inverter). Each inverter input integrated with a remote/central MPPT power optimizer governing cells generating full power. The AC Inverter is a multi-input single (or three) phase approximately 4 W AC inverter which delivers 120/240 V single phase AC to an AC load/grid. Importantly, the module connections may be configured in numerous configurations. For example, FIG. 31 shows a PV system having two pairs of six series connected solar cell modules (e.g., 60 cell modules) each utilizing distributed shade management bypass switch and embedded MPPT power optimizer functionality. The PV system shown utilizes six series connected (half) voltage modules per AC inverter input (i.e., a two input string inverter). Each AC inverter input integrated with a remote/central MPPT power optimizer governing cells generating full power. The AC Inverter is a multi-input single (or three) phase approximately 4 W AC inverter and which delivers 120/240 V single phase AC to an AC load/grid.

Multiple embodiments relating to the Inductor/Capacitor and bypass switch are possible. For example in one cost-effective embedded MPPT power optimizer implementation embodiment, one inductor/capacitor pair (to be used as an energy storage device to smooth/filter ripples created during switching) at the output of multiple series connected MPPT power optimizers is used. In other words, one MPPT DC-DC Buck Power Optimizer (Power Harvester) per cell (or N parallel connected cells, for example N=2), and one inductor and one capacitor (shared L/C) at the output of a plurality of series-connected MPPT DC-DC Buck Power Optimizers (i.e., no need for dedicated inductor and capacitor at the output of each individual/localized power optimizer). The shared L/C may be used at the output of each PV module and may be laminated within the module (e.g., one shared LC per 60-cell or 72-cell or 90-cell module, or per 12-cell BIPV shingle/the module). The elimination of the dedicated inductor and capacitor components at the output of each individual MPPT Power Optimizer reduces the overall cost per cell and cost per watt of implementing the distributed MPPT DC-DC Buck Power Optimizers, and enhances the overall reliability of the modules due to reduced component count. Elimination of the dedicated inductor and capacitor components at the output of each individual MPPT Power Optimizer also enables each MPPT DC-DC Buck Power Optimizer to be a fully monolithic integrated circuit package, eliminating the need for attaching additional components along with each MPPT Power Optimizer.

Alternatively, one inductor/capacitor pair may be integrated per MPPT power optimizer to reduce the current/voltage requirements of the inductor/capacitor pair and in some instances decrease the costs associated with higher inductor/capacitor.

FIGS. 32A through 37A are cell level schematic circuit diagrams showing multiple embodiments relating to MPPT power optimizer, Inductor/Capacitor, and bypass switch. FIGS. 32B through 37B are module level schematic circuit diagrams of the cells of FIGS. 32A through 37A, respectively. Specific implementation configurations may be selected be based on cost and complexity considerations. In the diagrams shown, the MPPT DC-DC buck converter package includes the components between the $V_{in}$ and $V_{out}$ (and may or may not comprise the bypass switch, e.g., SBR, Schottky Barrier Rectifier, etc.). The MPPT outputs are used for cell to cell interconnections. In exemplary embodiments provided in FIGS. 32A through 37A, the following functional components are utilized as guidelines: a buck converter or step-down (voltage step-down) converter design; a typical buck converter MPPT power optimizer includes two switches (MOSFETs), gate drive control circuitry with an MPPT algorithm, 2 capacitors, and 1 inductor; the controller circuit includes the Maximum-Power-Point-Tracking (MPPT) algorithm comprising sample and hold circuit and switching driver circuitry based on which the switching signal (including the switching frequency and duty cycle, e.g. switching frequency from a few KHz to 10 MgHz and more particularly 1.3-3 MgHz) is generated and sent to the MOS transistors (gate drive signals for the two switching transistors shown), and; C1 & C2 are MPPT switching control outputs, I1 & I2 are MPPT Sample & Hold inputs, in pass-through mode, transistor switch M1 is closed and transistor switch M2 is open (100% duty cycle or no switching).

Figure 32A:
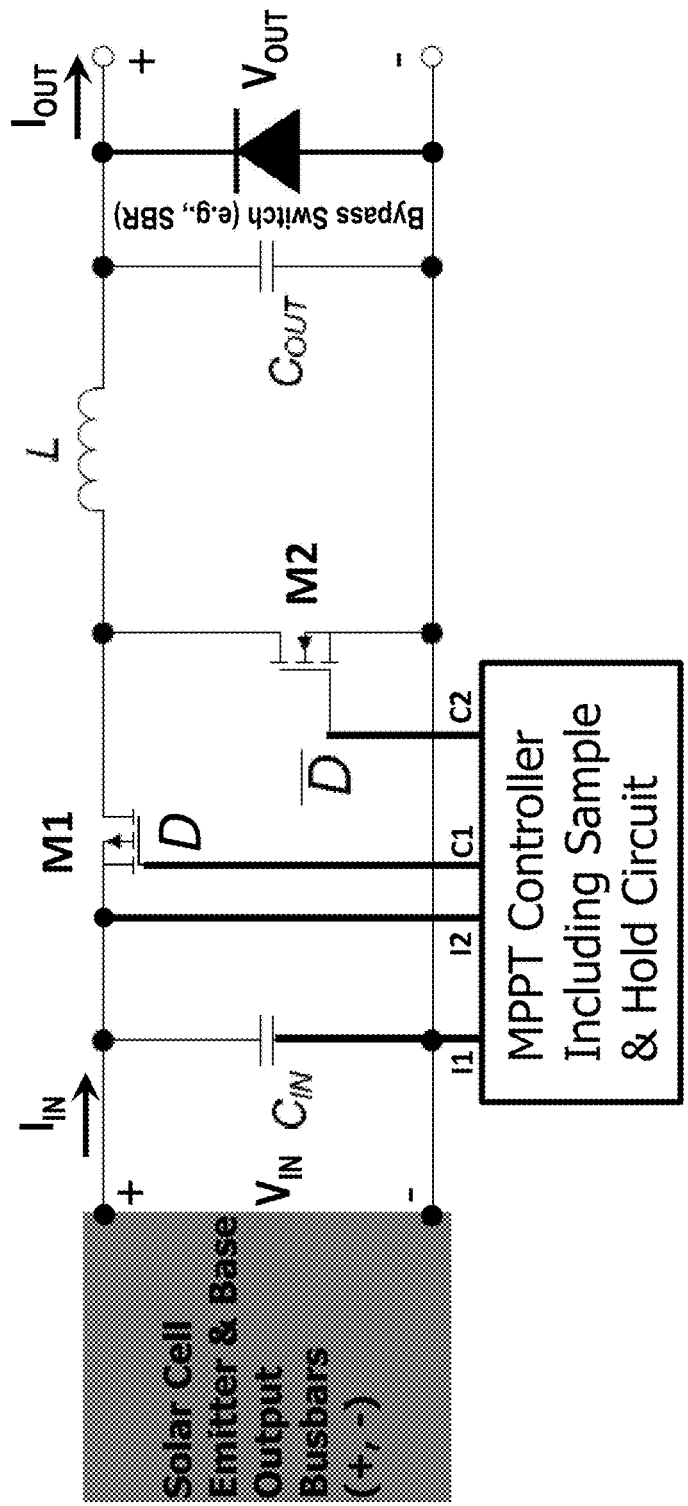
Figure 32B:
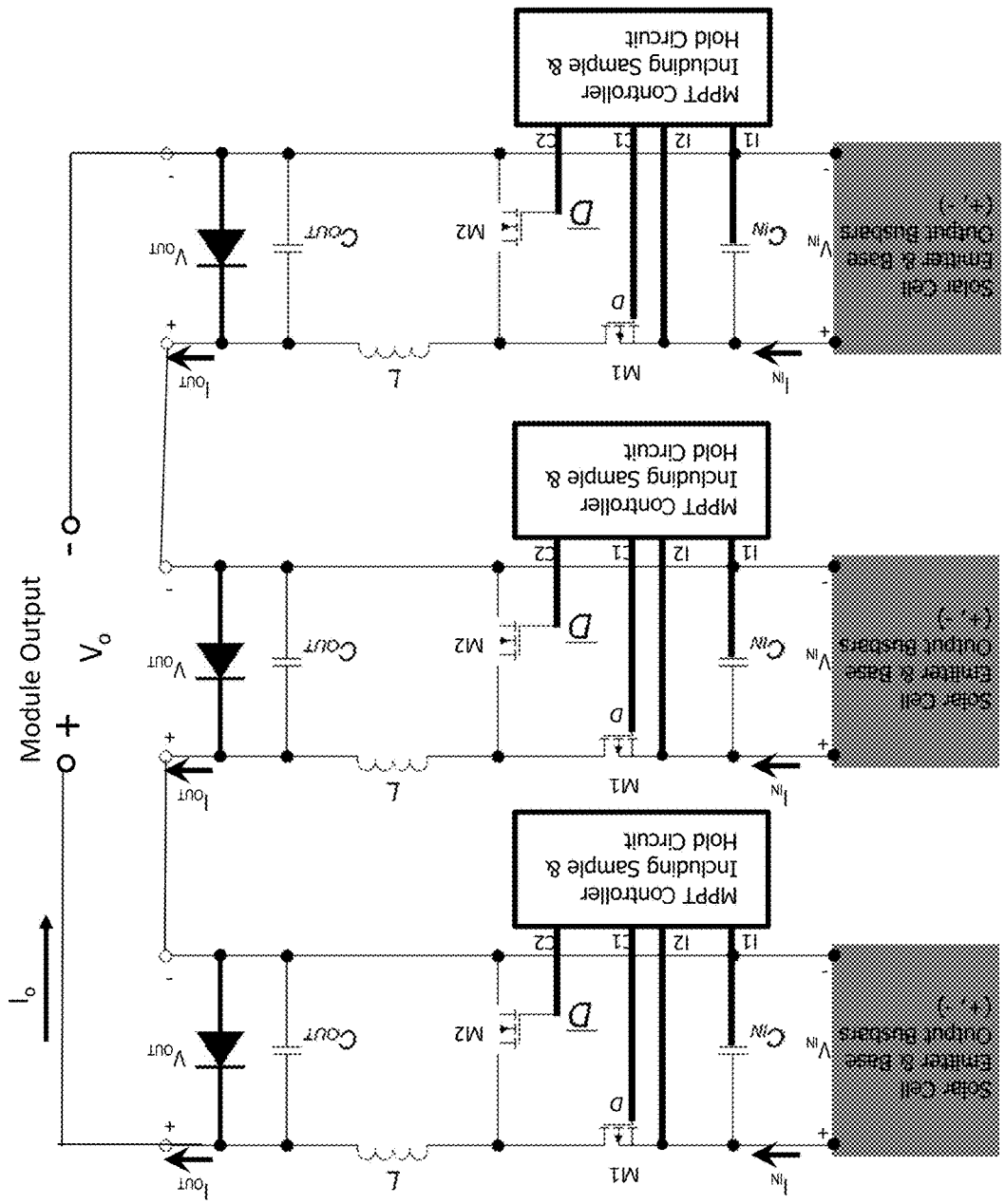

FIG. 32A is a schematic circuit diagram of an MPPT DC-DC Buck converter power optimizer with dedicated output-stage inductor L and capacitor $C_{OUT}$ and with output-stage bypass diode for distributed shade management. FIG. 32B is a schematic diagram of a plurality of MPPT DC-DC power optimizers connected in series with dedicated inductor and capacitor at the output stage of each series-connected optimizer and output-stage bypass switch, such as that shown in FIG. 32A. Each optimizer shown is used in conjunction with one solar cell or a pair of parallel-connected solar cells and each MPPT DC-DC power optimizer has its own dedicated output-stage inductor L and capacitor $C_{OUT}$.

Figure 33A:
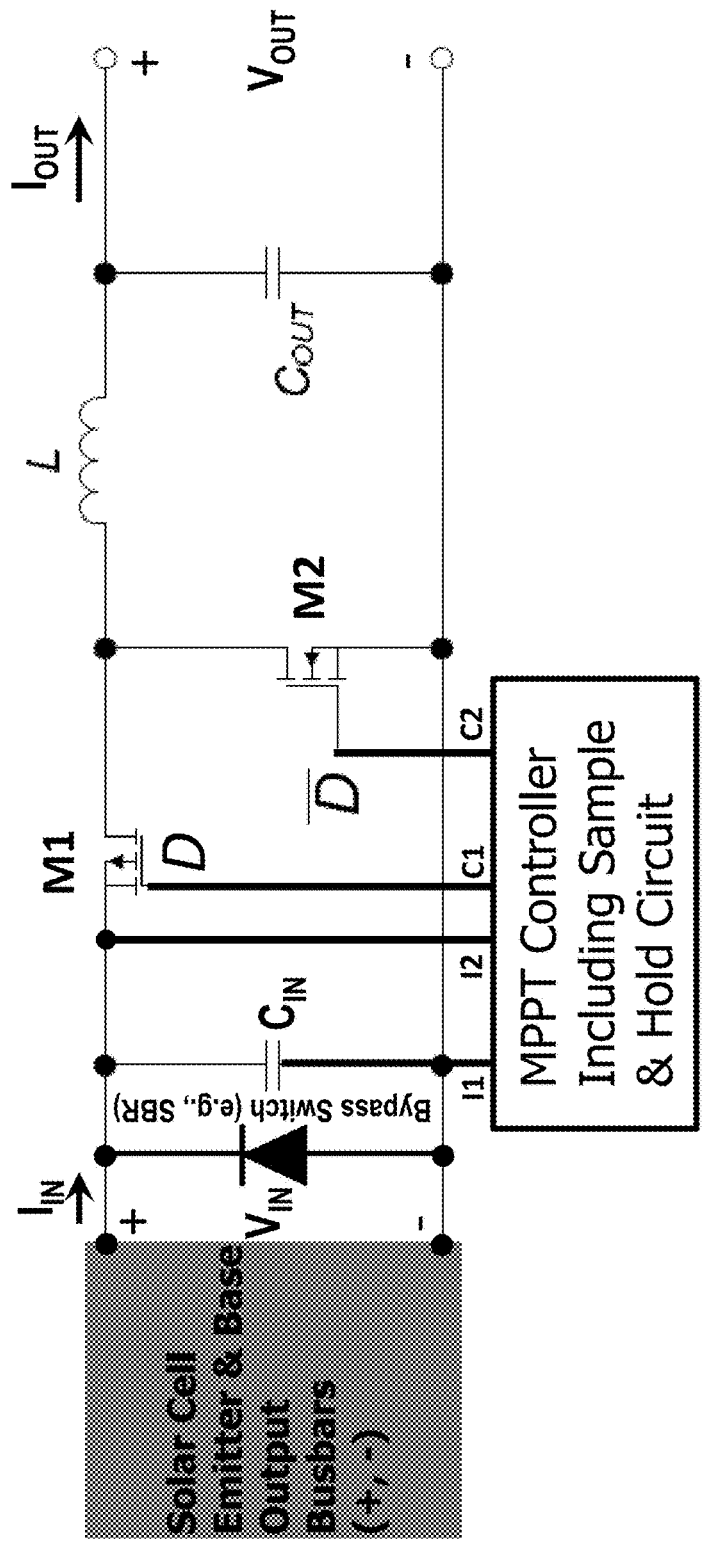
Figure 33B:
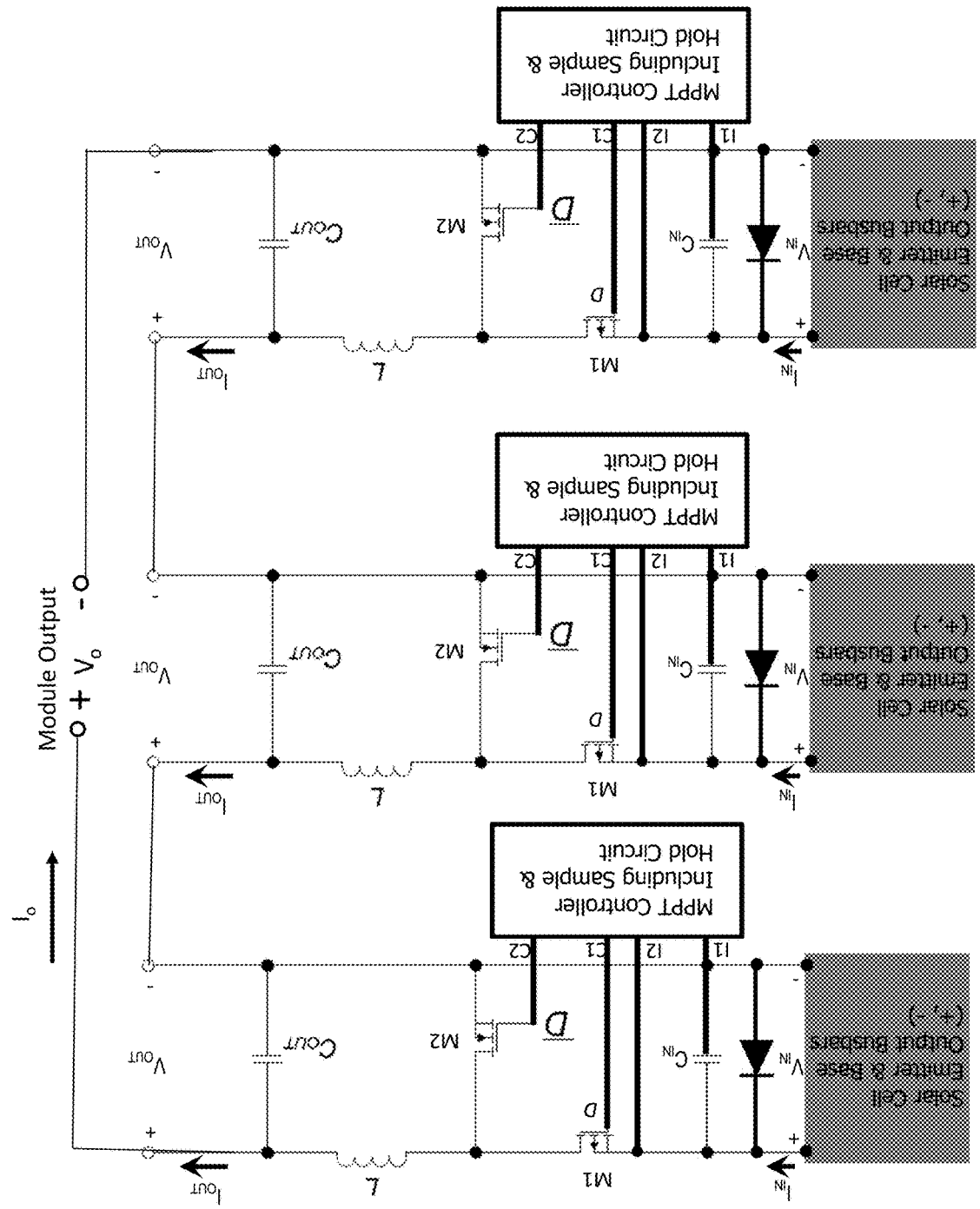

FIG. 33A is a schematic diagram of an MPPT DC-DC buck converter power optimizer with dedicated output-stage inductor L and capacitor $C_{OUT}$ and with input-stage bypass diode for distributed shade management. FIG. 33B is a schematic diagram of a plurality of MPPT DC-DC power optimizers connected in series with dedicated inductor and capacitor at the output stage of each series-connected optimizer and input-stage bypass switch, such as that shown in FIG. 33A. Each optimizer shown is used in conjunction with one solar cell or a pair of parallel-connected solar cells and each MPPT DC-DC power optimizer has its own dedicated output-stage inductor L and capacitor $C_{OUT}$.

Figure 34A:
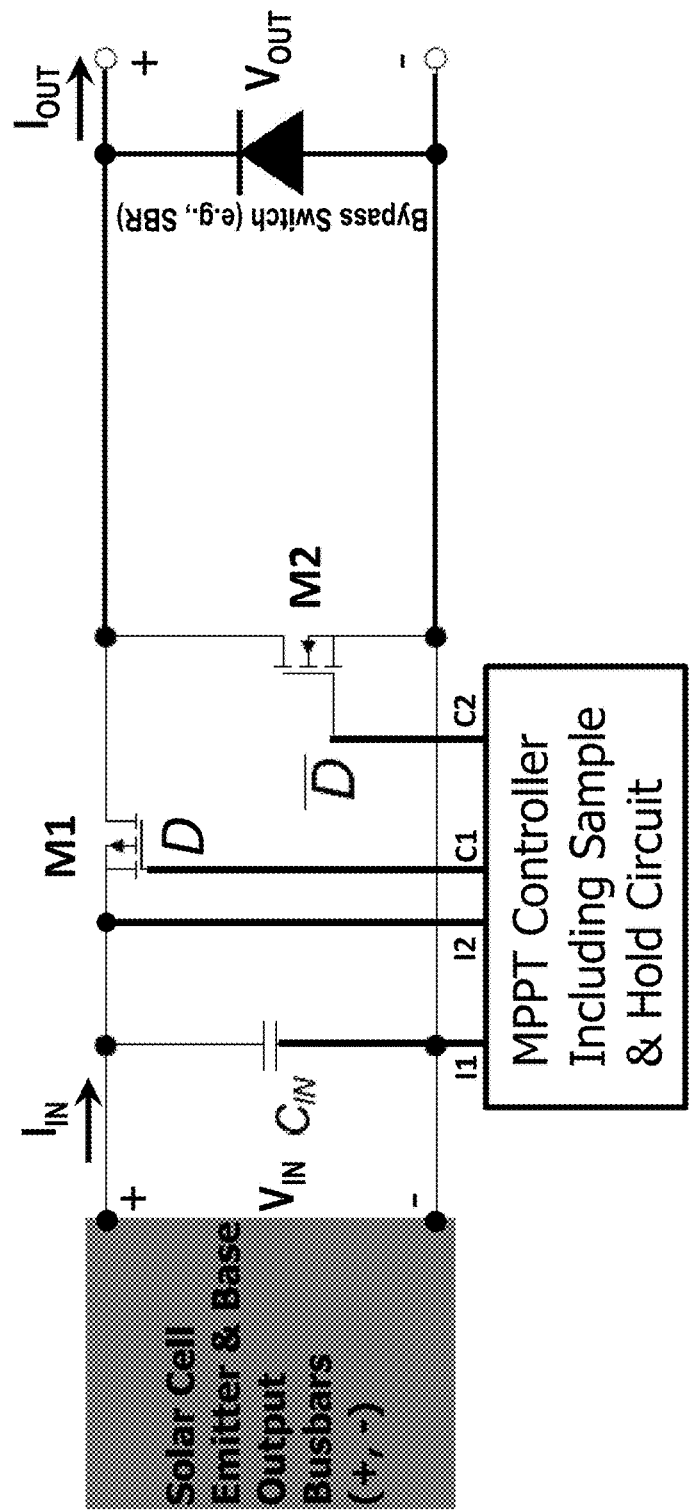
Figure 34B:
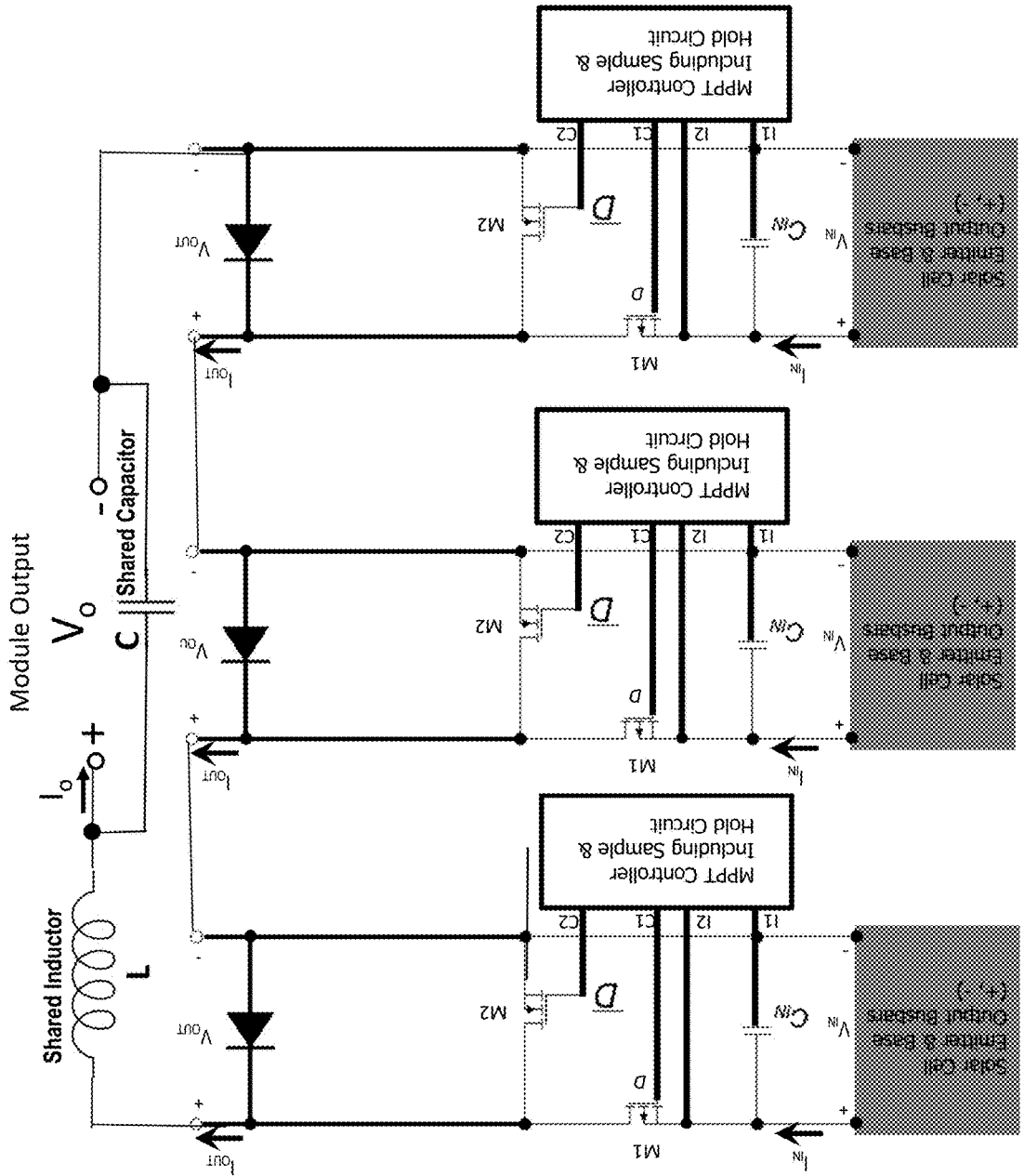

FIG. 34A is a schematic diagram of an MPPT DC-DC buck converter power optimizer without dedicated output-stage inductor L and capacitor $C_{OUT}$ and with output-stage bypass diode for distributed shade management. FIG. 34B is a schematic diagram of an MPPT DC-DC buck converter power optimizer without dedicated output-stage inductor L and capacitor $C_{OUT}$ and with output-stage bypass diode for distributed shade management, such as that shown in FIG. 34A. Each optimizer shown is used in conjunction with one solar cell or a pair of parallel-connected solar cells and each MPPT DC-DC power optimizer does not have its own dedicated output-stage inductor and capacitor. In other words, the MPPT DC-DC power optimizers (N connected in series) share 1 inductor L and 1 capacitor C at output.

Figure 35A:
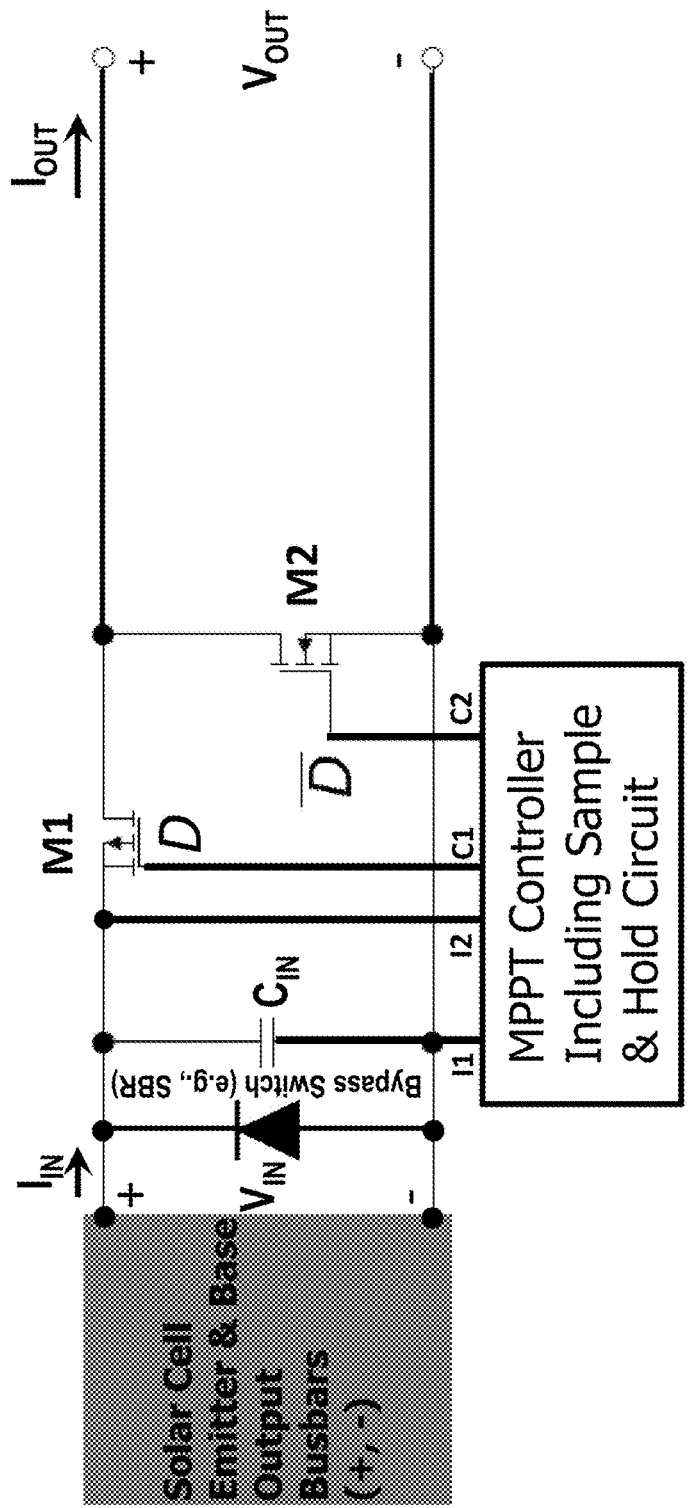
Figure 35B:
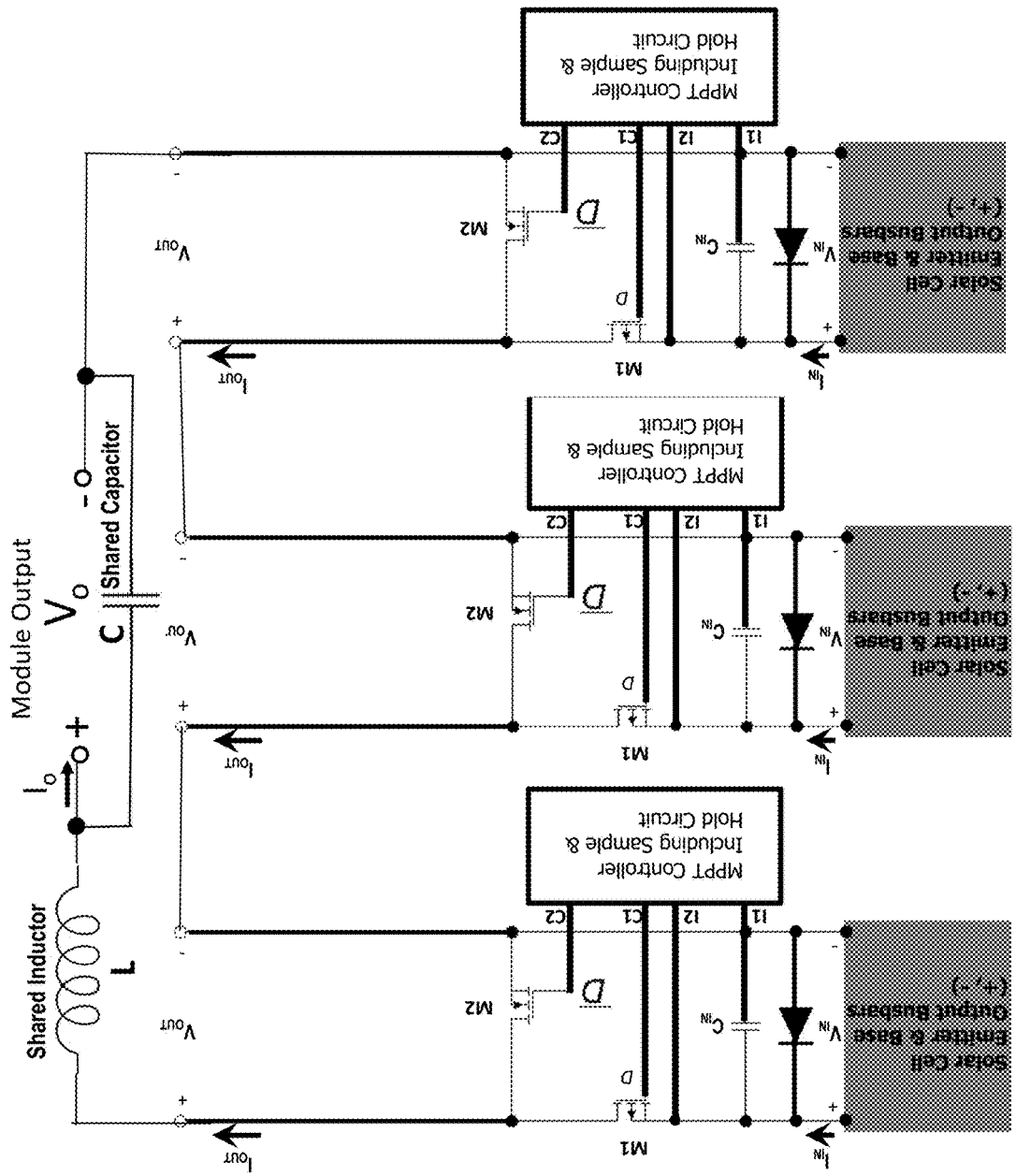

FIG. 35A is a schematic diagram of an MPPT DC-DC buck converter power optimizer without dedicated output-stage inductor L and capacitor $C_{OUT}$ and with input-stage bypass diode for distributed shade management. FIG. 35B is a schematic diagram of an MPPT DC-DC buck converter power optimizer without dedicated output-stage inductor L and capacitor $C_{OUT}$ and with input-stage bypass diode for distributed shade management, such as that shown in FIG. 35A. Each optimizer shown is used in conjunction with one solar cell or a pair of parallel-connected solar cells and each MPPT DC-DC power optimizer does not have its own dedicated output-stage inductor and capacitor. In other words, the MPPT DC-DC power optimizers (N connected in series) share 1 inductor L and 1 capacitor C at output.

Figure 36A:
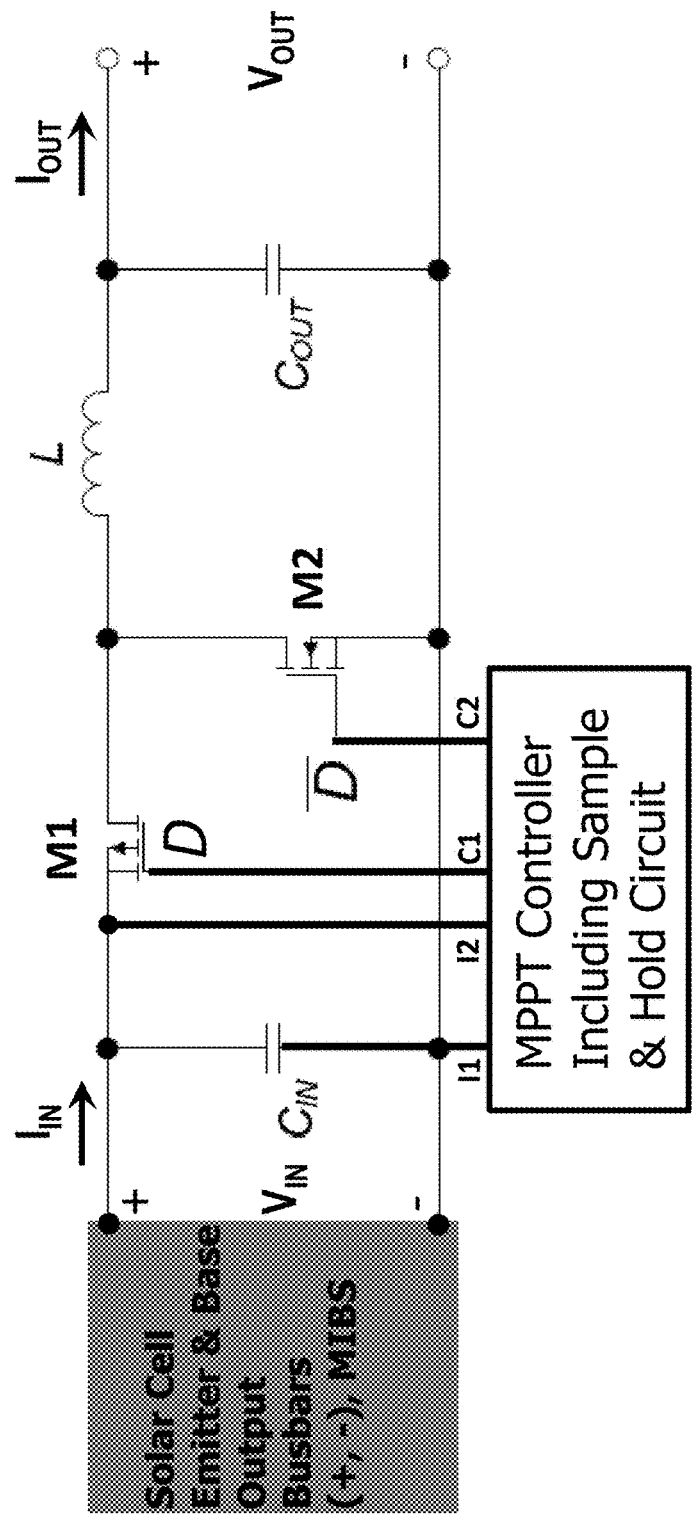
Figure 37A:
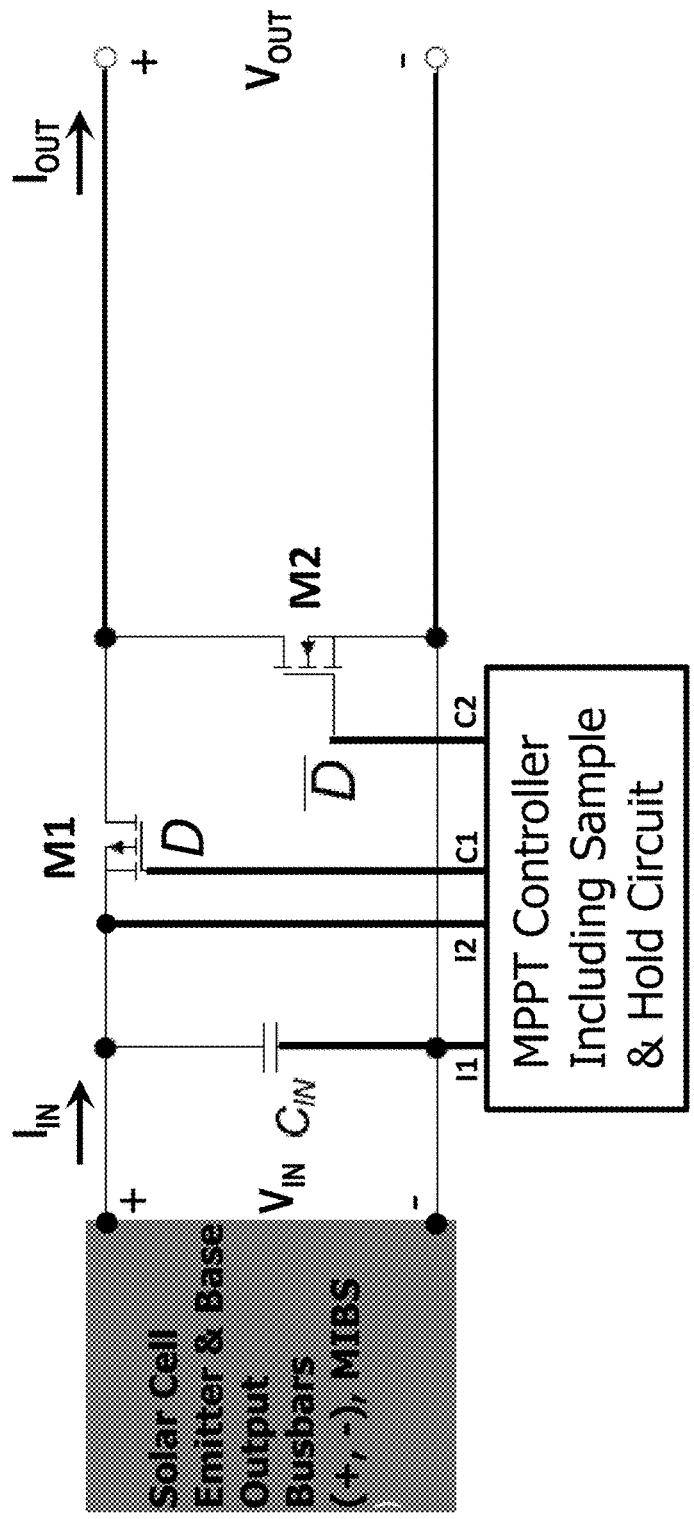

FIGS. 36A and 37A utilize a monolithically integrated bypass switch (MIBS) distributed and associated with each sub-cell of an isled solar cell (in other words an isled solar cell and each solar cell isle or sub-cell having a monolithically integrated bypass switch) as described later in detail. FIG. 36A is a schematic diagram of an MPPT DC-DC buck converter power optimizer with dedicated output-stage inductor L and capacitor $C_{OUT}$ and having a monolithically-integrated bypass switch (MIBS) associated with the sub-cells of an isled solar cell for distributed shade management.

Here it should be noted that a monolithically integrated bypass switch may be integrated with a solar cell or distributed and integrated individually with each sub-cell of an isled solar cell. Thus, MIBS is integrated with the solar cell itself, thus an external bypass switch integrated in the MPPT DC-DC buck converter package is optional. In other words, in when the cell utilizes a MIBS, an optional external bypass switch either as an input-stage or as an output-stage bypass switch (for increased fault tolerance), in conjunction with the MPPT DC-DC buck power optimizer to provide reduced power dissipation in the solar cell whenever the cell is fully shunted/bypassed.

Figure 36B:
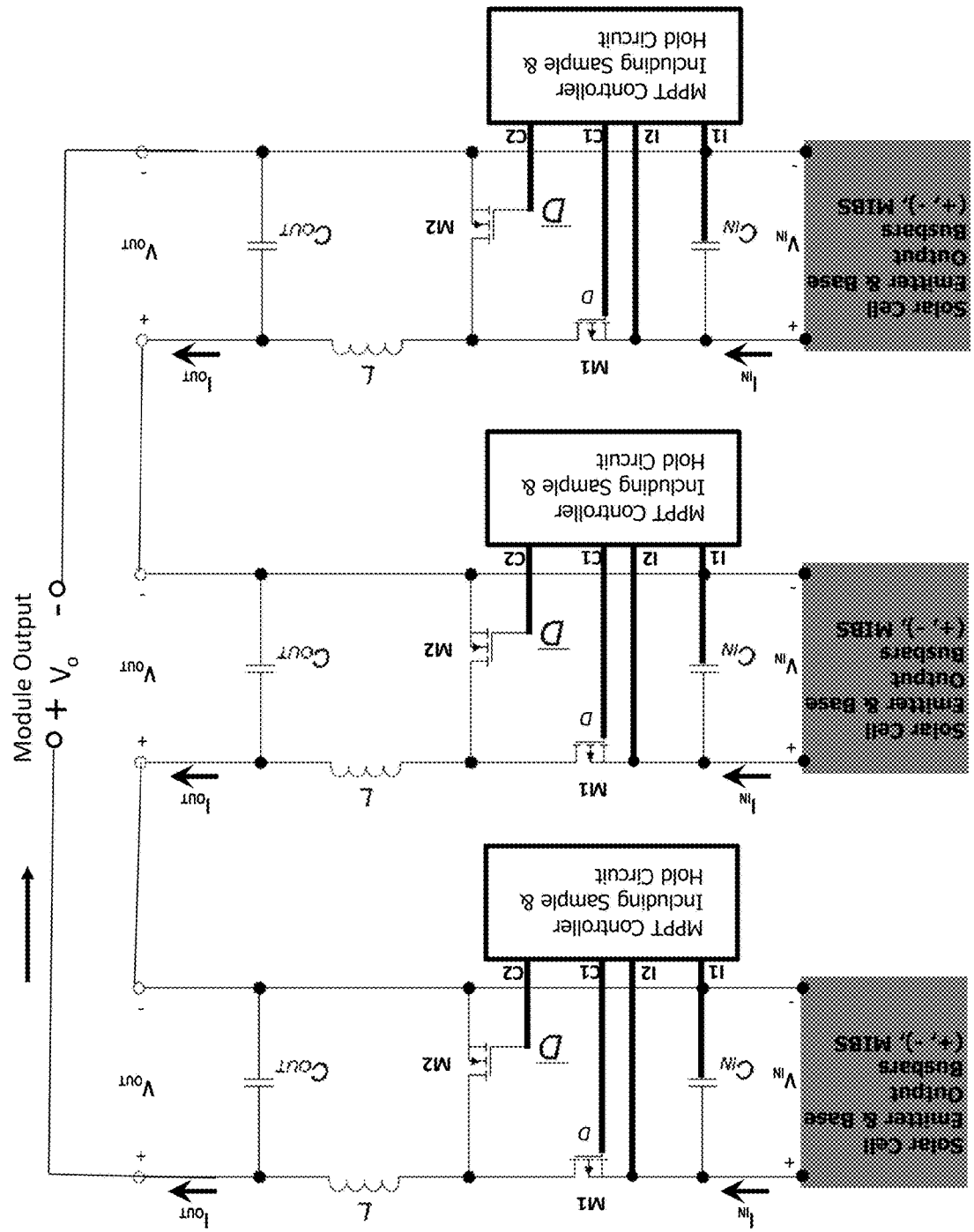

FIG. 36B is a schematic diagram of a plurality of MPPT DC-DC power optimizers connected in series with dedicated inductor and capacitor at the output stage of each series-connected optimizer and monolithically integrated bypass switch distributed on the sub-cells of an isled solar cell, such as that shown in FIG. 36A. Each optimizer shown is used in conjunction with one solar cell or a pair of parallel-connected solar cells and each MPPT DC-DC power optimizer has its own dedicated output-stage inductor L and capacitor $C_{OUT}$.

Figure 37B:
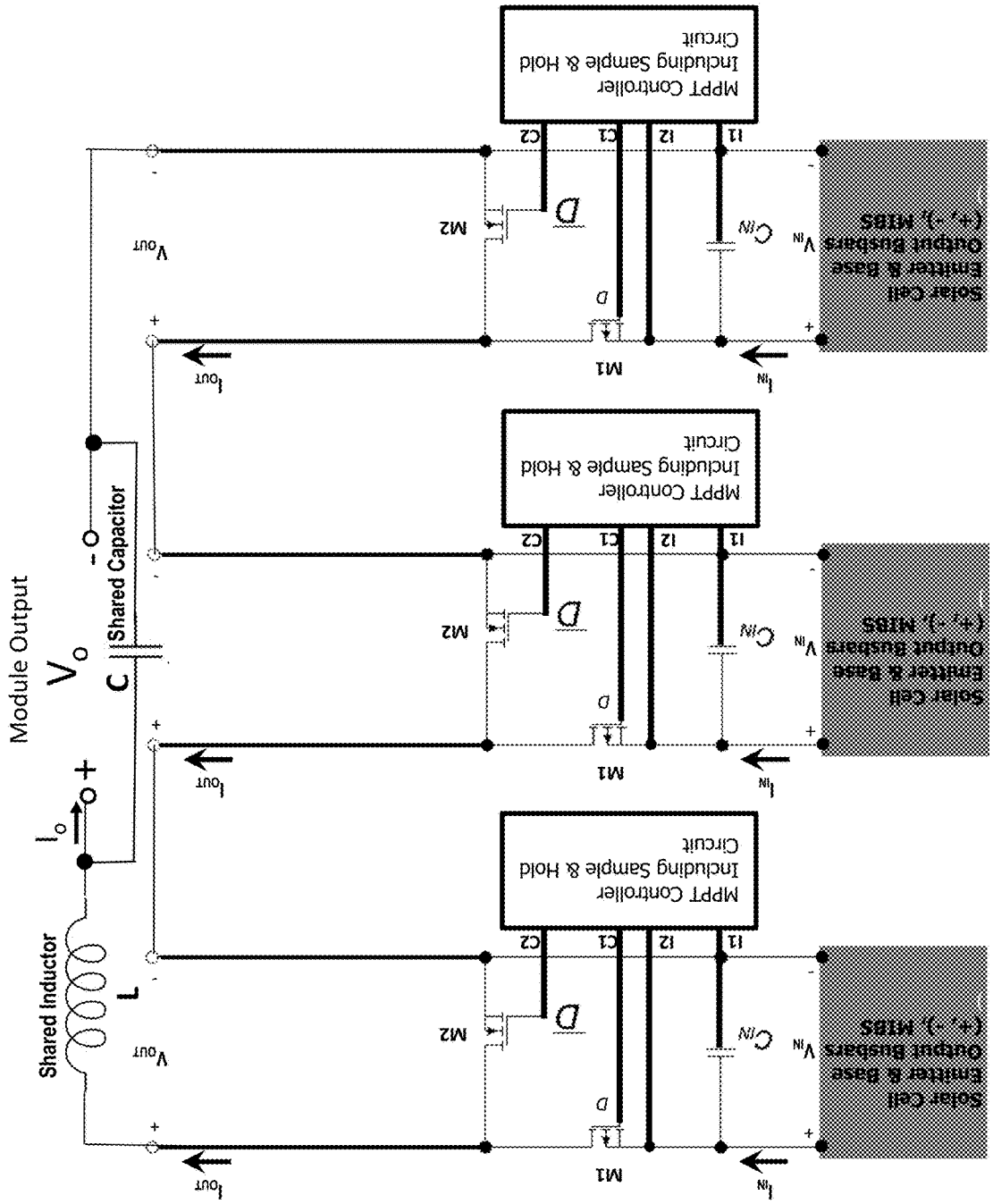

FIG. 37A is a schematic diagram of an MPPT DC-DC buck converter power optimizer without a dedicated output-stage inductor L and capacitor $C_{OUT}$ and having a monolithically-integrated bypass switch (MIBS) associated with the sub-cells of an isled solar cell for distributed shade management. FIG. 37B is a schematic diagram of a plurality of MPPT DC-DC power optimizers connected in series without dedicated inductor and capacitor at the output stage of each series-connected optimizer and monolithically integrated bypass switch distributed on the sub-cells of an isled solar cell, such as that shown in FIG. 37A. Each optimizer shown is used in conjunction with one solar cell or a pair of parallel-connected solar cells and each MPPT DC-DC power optimizer does not have its own dedicated output-stage inductor and capacitor. In other words, the MPPT DC-DC power optimizers (N connected in series) share 1 inductor L and 1 capacitor C at output.

Solar cell module has cells in laminate, cells can be in series or paired in parallel and pairs are connected in series (60 cell module 30 pairs connected in parallel, every pair shares on bypass switch and MMPT buck optimizer, pairing means voltage of module decreased by two and current increased by two).

The disclosed solutions may be used individually or in combination to improved and control solar system power generation and delivery. For example, localized shade management ISIS utilizing a per cell bypass switch the system power harvest. And the system power harvest may be further increased when utilizing localized shade management ISIS in combination with per cell localized MPPT power optimizer. Improving solar system harvest efficiency also improves reliability by reducing solar cell hot spots throughout the system. The embedded remote access switch RAMS electronics for module power control disclosed herein further improves system reliability when a integrated transient voltage suppressor (TVS). RAMS also provides for increased module control and monitoring.

Figure 38:
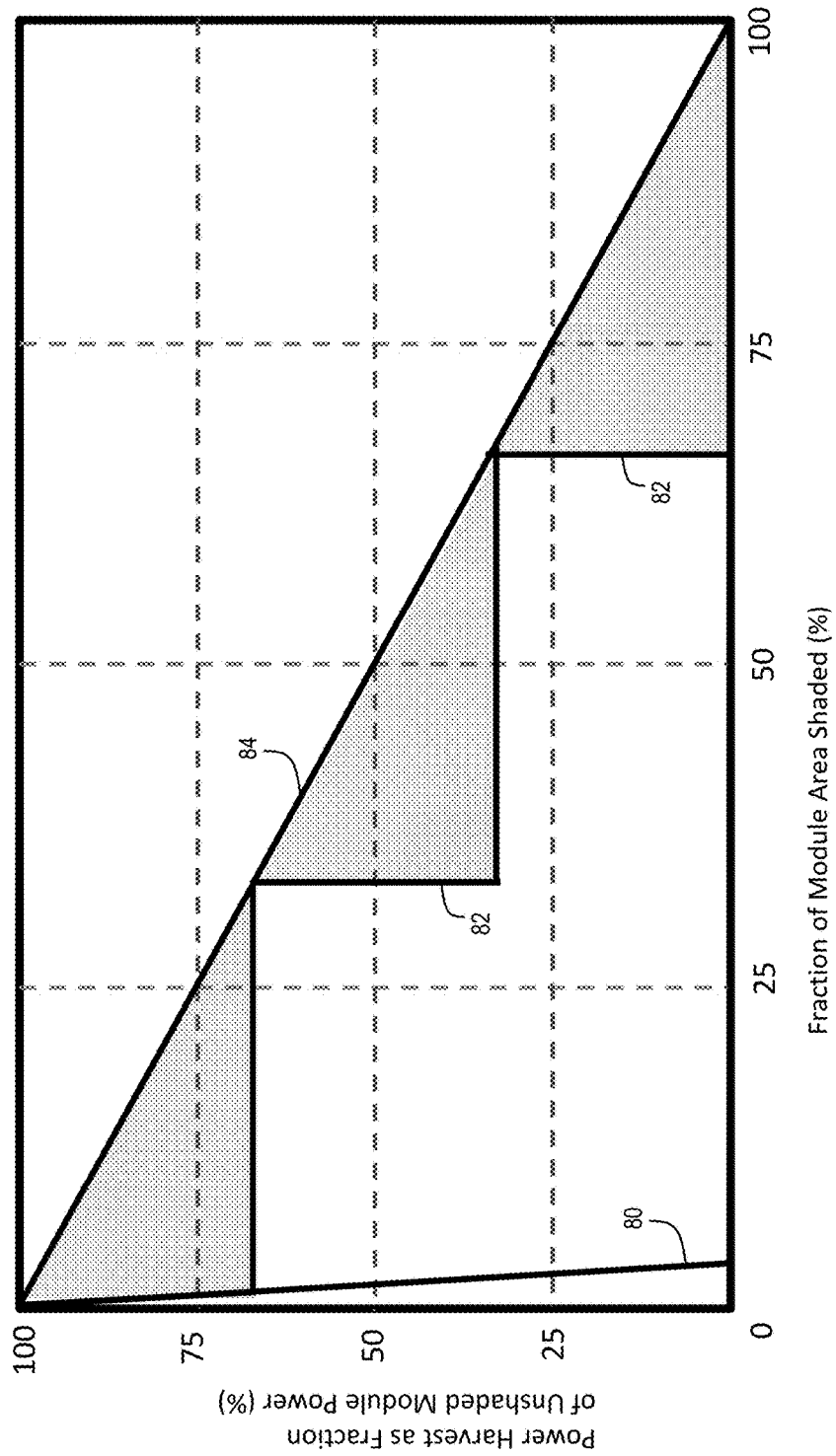
FIG. 38 is a graph showing actual power harvest of 60 cell solar modules having 3 sets of 20 cells connected in series under various shading conditions.

FIG. 38 is a graph showing actual power harvest of 60 cell solar modules having 3 sets of 20 cells connected in series under various shading conditions: power harvest results 80 and 82 show power harvest for a conventional solar cell having a bypass switch corresponding to each series connected string and power harvest results 84 show power harvest for a solar module of the present application and having a localized bypass switch associated with each cell. Power harvest results 80 shows the power harvest for a conventional solar module with series connected cell shade management and random cell shading across the three strings of 20 cells. Note power harvest drops to zero at 5-10% random shading across the three stings in a conventional module as each string is bypassed as a result of shading or partial shading of one cell in the string. In other words, module power harvest may drop to zero as a result of partial shading of three cells (e.g., each cell connected in a different 20 cell series string). Power harvest results 82 show the best case results for a conventional solar module with series connected cell shade management and discrete cell shading contained within an individual 20 cell series string. Note the power harvest drops incrementally in three steps as each series connected string is shunted as a result of individual cell shading. In other words, module power harvest drops incrementally at the series connected level. Thus, the power harvest for a conventional cell with string level shade management is dependent on shade pattern.

Power harvest results 84 shows the power harvest for a solar module having a localized cell level bypass switches associated with each solar cell under both types of shading described above, random and discrete. The power harvest is shown as linear when in reality power harvest drops on a per cell level. Note the results are the same and not string dependent as the localized cell bypass switch contains the shading impact to the individual cell level (as compared to the series connected cell level, e.g. a 20 cell string in a 60 cell module).

Figure 39:
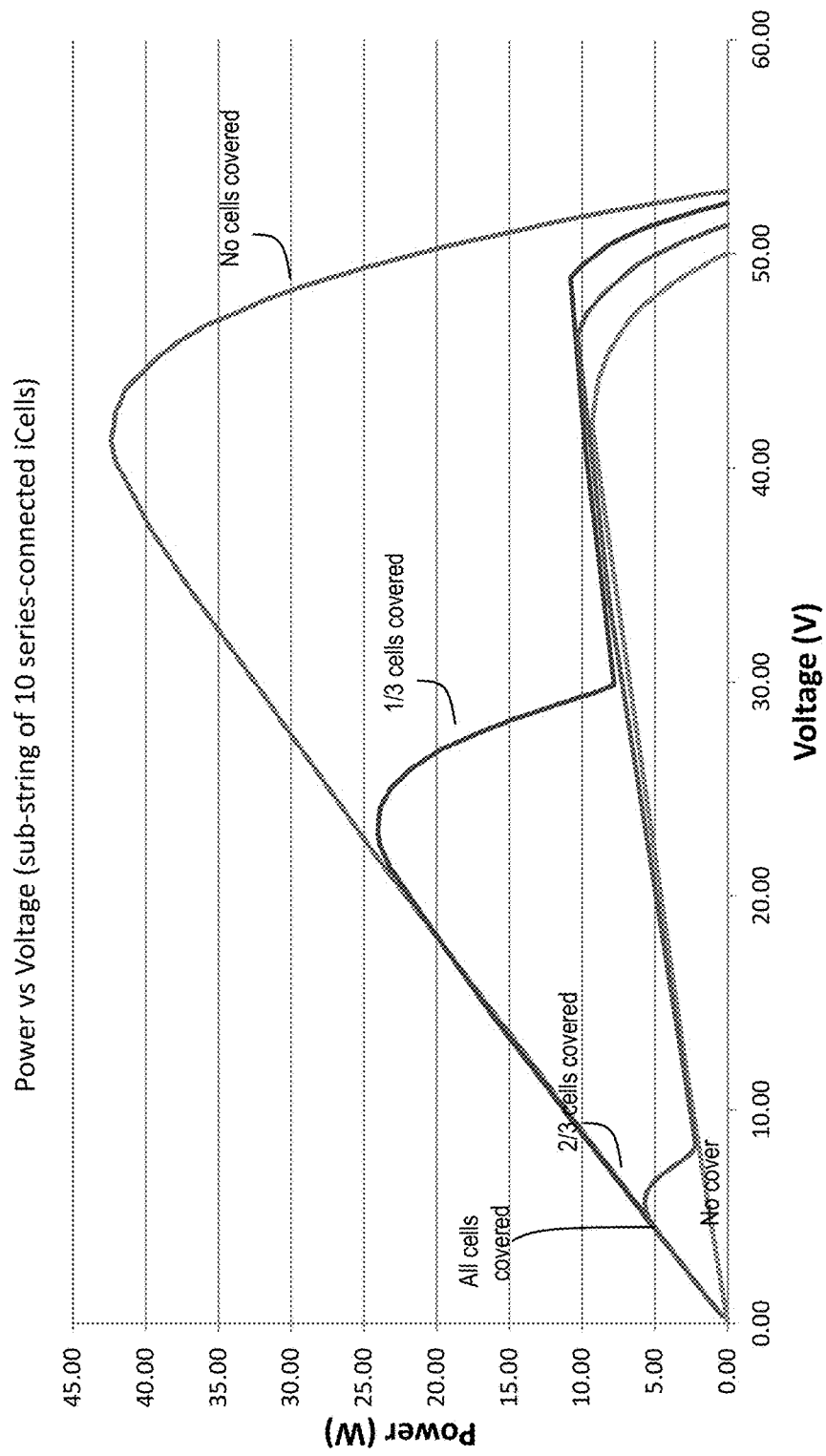
FIG. 39 is a graph showing actual results of the maximum peak power of a solar cell.

FIG. 39 is a graph showing actual results of the maximum peak power of a solar cell across varying shading situations in a localized shade management module (all cells connected in series) having a bypass switch associated with each solar cell. The number of cells are shaded/covered with a cover providing 75% cell screen shading (~25% sunlight illumination) in the following categories: no cells covered, ⅓ of the cells covered (i.e. 10 cells in a 30 cell series connected module), ⅔ of the cells covered, and all cells covered. Conversely, using a conventional solar module having a series connection bypass switch (all cells connected in series and one bypass switch per module) the maximum peak power is similar to all cells covered under the varying shading conditions (no cover would be similar the results shown) shown in FIG. 39.

The disclosed localized and cell level shade management solutions may designed and integrated as reliable and fault tolerant components. Fault tolerant meaning continued system functionality without "hot spots" in the event of component failure (e.g., in the event of a distributed bypass switch failure and the associated cell is shaded)—in other words the system will remain functional and deliver power without compromising long-term module reliability and lifetime even in the unlikely events of bypass switch (e.g., SBR) component failures and/or bypass switch-to-cell interconnection (e.g., SBR-to-cell) failures.

At a first level, distributed bypass switch reliability may be improved by: 1) using reliable bypass switch components (e.g., SBR, schottky diode, P/N junction diode, transistor switch, etc.), 2) improving reliability of component attachment for example using surface mount technology (SMT) without ribbon connection and utilizing small footprint components to minimize CTE mismatch and thus interconnection failure caused by CTE mismatch; 3) designing cell level shade management solutions so that the bypass switch components (and associated MPPT power optimizers if applicable) operate within max current and temperature ratings. In one embodiment, increasing the voltage and particularly decreasing the current of the solar cell itself allows for decreased component size and footprint (e.g., resulting in component size less than 2 mm square). Reducing the current of the cell itself also reduces fault associated with components operating outside of maximum current ratings.

The following bypass switch embodiment is described to provide specific representative bypass switch operating parameters and constraint guidelines. These guidelines may be used to provide exemplary cell efficiency and reliability in light of additional considerations such as cell/module design and costs. Importantly, each of the parameters of the bypass switch may be given varying importance and improvement in one area may result in sacrifice in another. Further, it should be noted the bypass switch constraints and requirements may be modified and improved by reducing the current of the solar cell itself. In one embodiment, the cell level bypass switch may be a surface mount silicon super barrier rectifier (SBR) including, but not limited to, the following operating parameters: 1) a small footprint of 1.47 mm×1.10 mm=1.54 mm$^2$, 0.5 mm thick, 2.35 mg weight (several times smaller than a comparable SBR for a conventional solar cell having a typical voltage and current); 2) operating temperature range of −65° C. to 150° C.; 3) qualified by known industry standards for reliability; 4) design margin for current and temperature, in the range of ~65%; 5) low reverse leakage providing improved stability at higher temperatures; 6) ultra-low Vf (<0.35V) for minimal ohmic losses and no localized hot spots: low max power dissipation with SBR activated under STC; 7) solderable per; 8) lead-free, RoHS compliant, halogen and antimony free; and, 9) excellent low reverse leakage stability at high temperatures.

Fault Tolerance requires continued functionality of the PV module in case of a component or connection failure occurrence, with continued substantial power harvesting without compromising the long-term module reliability. Fault tolerant distributed shade management may be improved by using solar cells with non-destructive "low-voltage" (soft) reverse breakdown, which upon a bypass switch component or connection failure causing an open-mode fault a shaded cell itself serves as a "low-dissipation" bypass switch and passing the module current in reverse breakdown while limiting the power dissipation. The cell power dissipation in this mode may be kept to less than twice the normal cell power generation to prevent reliability failures.

Further, optionally the cell itself may be designed to have a low/soft reverse breakdown voltage when shaded (i.e., lower reverse bias voltage, for example resulting power dissipation of no more than twice the power generation of the cell as a guideline and reference). Note the power dissipation of the bypass diodes of the present application may be as low as 10% of the cell power, for example power dissipation 0.3-0.4 W in a 4 W cell.

However, in the event of a localized bypass switch component or connection failure (e.g., solder joint breakage) the system will continue to function. Consider the following failure modes and results:

Bypass Switch Component Failure—Open: solar cell soft/low reverse breakdown when shaded.

Bypass Switch Connection Failure—Open: solar cell soft/low reverse breakdown when shaded.

Bypass Switch Component Failure—Short: solar cell permanently shorted and bypassed.

Bypass Switch Connection Failure—Short: solar cell permanently shorted and bypassed.

In some instances, scale up voltage and down current to enable use of much smaller/less expensive components (allowing for lamination improvement and reducing component package and module thickness) and reduce dissipation losses associated with bulkier components. Locally at the cell level, reducing size of component reduces dissipation losses (in some instances resulting in a fraction of the dissipation losses). Further, reducing size of MPPT chip improves reliability and practicality.

A solar cell having isled sub-cells and referred to herein as an icell may be used to increase (scale-up) voltage and decrease (scale-down) current.

Physically or regionally isolated isles (i.e., the initial semiconductor substrate partitioned into a plurality of substrate isles supported on a shared continuous backplane) are formed from one initially continuous semiconductor layer or substrate—thus the resulting isles (for instance, trench isolated from one another using trench isolation regions or cuts through the semiconductor substrate) are monolithic—attached to and supported by a continuous backplane (for example a flexible backplane such as an electrically insulating prepreg layer). The completed solar cell (referred to as a master cell or icell) comprises a plurality of monolithically integrated isles/sub-cells/mini-cells, in some instances attached to a flexible backplane (e.g., one made of a prepreg materials, for example having a relatively good Coefficient of Thermal Expansion or CTE match to that of the semiconductor substrate material), providing increased solar cell flexibility and pliability while suppressing or even eliminating micro-crack generation and crack propagation or breakage in the semiconductor substrate layer. Further, a flexible monolithically isled (or monolithically integrated group of isles) cell (also called an icell) provides improved cell planarity and relatively small or negligible cell bow throughout solar cell processing steps such as any optional semiconductor layer thinning etch, texture etch, post-texture clean, PECVD passivation and anti-reflection coating (ARC) processes (and in some processing embodiments also allows for sunny-side-up PECVD processing of the substrates due to mitigation or elimination of thermally-induced cell warpage), and final solar cell metallization. While the solar cells disclosed herein may be used to produce rigid glass-covered PV modules, the structures and methods disclosed herein also enable flexible, lightweight PV modules formed from the monolithic isled master cells (i.e., icells) which substantially decrease or eliminate solar cell microcracking during module lamination and also during PV module operation in the field. These flexible, lightweight PV modules may be used in a variety of markets and applications including, but not limited to, the residential rooftop (including residential Building-Integrated Photovoltaics or BIPV rooftop shingles/tiles), commercial rooftop, ground mount utility-scale power plants, portable and transportable PV power generation, automotive (such as solar PV sunroof), and other specialty applications.

Aspects of the innovations disclosed herein, either individually or in combination, may provide the following advantages among others:

An isled solar cell (icell) enables scaling of the solar cell voltage and current, specifically scaling up the solar cell voltage (in other words increasing the master cell output voltage) and scaling down the solar cell current (in other words decreasing the master cell output current) based on the number (e.g., N×N array) of cell isles/tiles (or sub-cells) which, among numerous other advantages including reduced metallization sheet conductance or thickness requirements (hence, reduced metallization material and process cost), lowers the maximum electrical current rating requirement for associated embedded power electronics components such as the embedded shade management diodes (e.g., lower current rating Schottky or pn junction diodes), or the embedded Maximum-Power-Point Tracking (MPPT) power optimizers (such as embedded MPPT DC-to-DC micro-converters or MPPT DC-to-AC micro-inverters). This may reduce the sizing (e.g., footprint and/or package thickness) and cost of embedded power electronics components such as the bypass switches (bypass switches with higher current ratings typically have higher costs as compared to bypass switches with lower current ratings), and improve the embedded power electronics device (such as the bypass switch used for distributed shade management, or the MPPT power optimizer used for distributed enhanced power/energy harvest from the PV module) performance due to the reduced electrical current (for instance, flowing through the bypass switch when it is activated and forward-biased to protect a shaded solar cell). A lower-rated current (for example, about 1 to 2 A) Schottky barrier diode typically costs much less, can have a much smaller package, and dissipates much less power than a 10 A to 20 A Schottky barrier diode. The embodiments disclosed herein (for instance, using N×N isles for the master cell or icell), with icell electrical interconnection configured to provide higher cell voltage (with a scale-up factor of up to N×N) and lower cell current (with a scale-down factor of up to N×N) can reduce the resulting solar cell current while increasing the solar cell voltage for the same solar cell power in order to enable the use of lower cost, smaller, and less power-dissipating bypass diode. For example, consider a crystalline silicon master cell or icell with a maximum-power-point voltage of $V_{mp} \approx 0.60V$ and maximum-power-point current of $I_{mp} \approx 9.3$ A (with the solar cell producing a maximum-power-point power of $P_{mp} \approx 5.6$ W). A master cell or icell with a 5×5 array of mini-cells (N=5), with all the isles or sub-cells connected in electrical series (S=25), for example using a combination of a first level metal (M1) on the backside of the solar cell and a second level metal (M2) on an electrically insulating backplane layer as described further herein, will result in a modified cell with $V_{mp}=15V$ and $I_{mp}=0.372$ A—in other words, the master cell or icell voltage is scaled up by a factor of 25 and the master cell or icell current is scaled down by the same factor of 25 (compared to the solar cell of the same master cell size but without the icell structures disclosed herein).

Higher conversion-efficiency, embedded/distributed lower cost, and smaller footprint Maximum-Power-Point Tracking (MPPT) power optimizer (DC-to-DC or DC-to-AC) chips with superior performance such as dynamic range response may be embedded within the module laminate and/or integrated directly on the backsides of the solar cells (for instance, on the backplanes of the backplane-attached icells disclosed herein) due to the higher voltage and lower current master cell (icell) made of a plurality of isles or mini-cells. In one embodiment, the icell may use an inexpensive single-chip MPPT power optimizer (DC-to-DC micro-converter or DC-to-AC micro-inverter).

Allows for inexpensive implementation of distributed cell-level integrated shade management an embedded bypass switch connected to each icell, providing higher effective energy yield for the installed PV modules in the field. In one embodiment, this may comprise a monolithically integrated bypass switch (MIBS) formed peripherally around each isle so that during partial shading only the affected/shaded tiles or mini-cells are shunted while the remaining ones produce and deliver electrical power.

The scaled down electrical current of an isled solar cell (an icell)—for instance, decreased by a factor of N×N isles—decreases the required patterned metallization sheet conductance and thickness due to the reduced ohmic losses. In other words, the metallization sheet conductance and thickness requirements are relaxed due to substantially reduced ohmic losses. A thinner solar cell metallization structure has a number of benefits relating to solar cell processing and may provide significant manufacturing cost reduction (for instance, much less metallization material required per cell) as well as reducing thermal and mechanical stresses relating to relatively thick (e.g., 10's of microns for interdigitated back-contact or solar cells) metallization structures and the CTE mismatch between conductive metal and semiconductor material. Usually the metallization materials such as copper or aluminum have much higher CTE compared to the semiconductor materials. For instance, linear CTEs of aluminum, copper, and silver (high-conductivity metals) are about 23.1 ppm/° C., 17 ppm/° C., and 18 ppm/° C., respectively. However, the linear CTE of silicon is around 3 ppm/° C. Therefore, there is a relatively large CTE mismatch between these high-conductivity metallization materials and silicon. These relatively large CTE mismatches between the metallization materials and silicon can cause serious cell manufacturing yield and PV module reliability problems, particularly when using relatively thick metallization structures for solar cells (such as thick plated copper used in the IBC solar cells).

Figure 40:
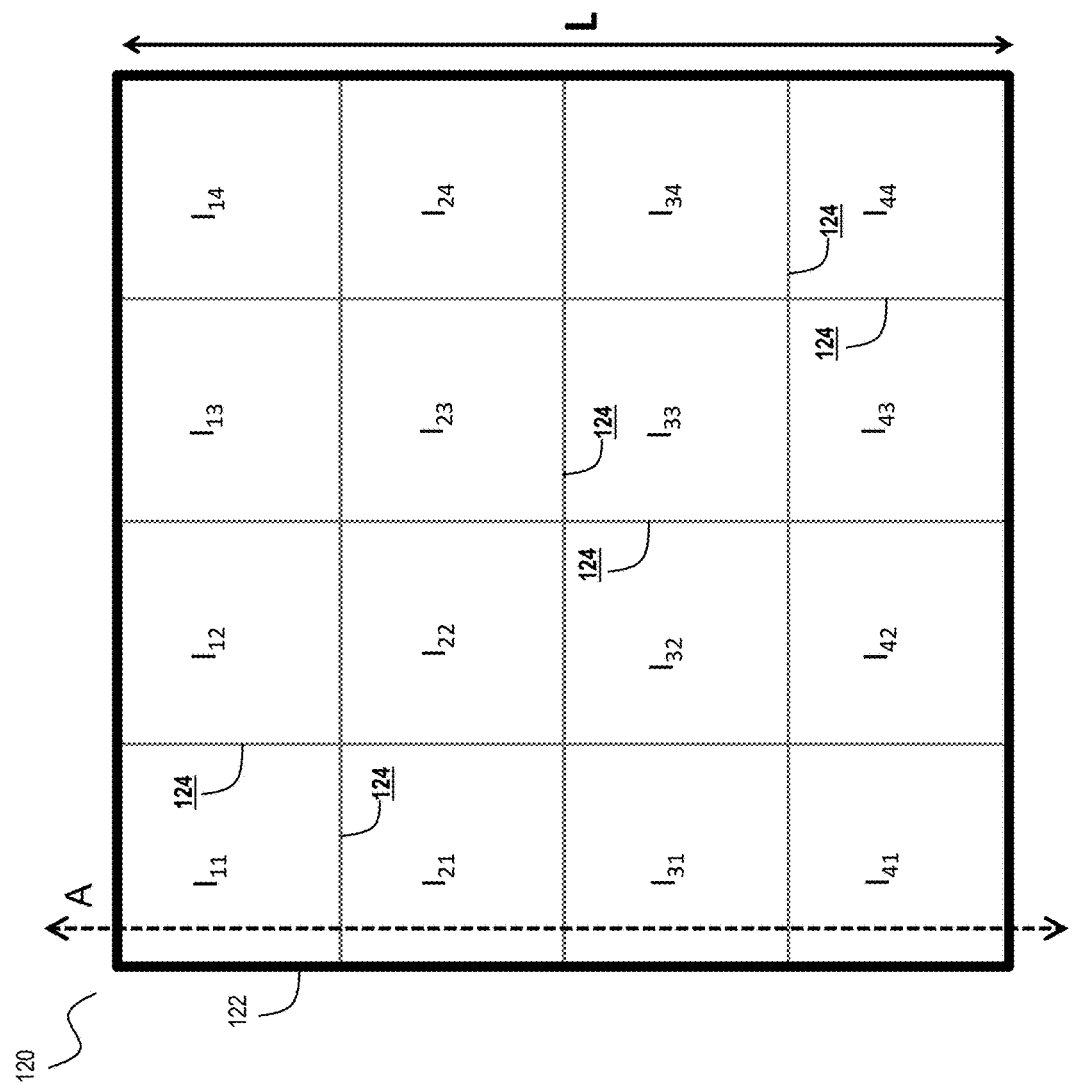
FIG. 40 is a schematic diagram of a top or plan view of a 4×4 uniform isled (tiled) master solar cell or icell.

FIG. 40 is a representative schematic plan view (frontside or sunnyside view) diagram of an icell pattern (shown for square-shaped isles and square-shaped icell) along with uniform-size (equal-size) square-shaped isles for N×N=4×4=16 isles (or sub-cells, mini-cells, tiles). This schematic diagram shows a plurality of isles (shown as 4×4=16 isles) partitioned by trench isolation regions. FIG. 40 is a schematic diagram of a top or plan view of a 4×4 uniform isled (tiled) master solar cell or icell 210 defined by cell peripheral boundary or edge region 122, having a side length L, and comprising sixteen (16) uniform square-shaped isles formed from the same original continuous substrate and identified as $I_{11}$ through $I_{44}$ attached to a continuous backplane on the master cell backside (backplane and solar cell backside not shown). Each isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and in some instances less than or equal to about 100 μm—for instance, in the range of a few up to about 100 μm) shown as trench isolation or isle partitioning borders 124. Main cell (or icell) peripheral boundary or edge region 122 has a total peripheral length of 4L; however, the total icell edge boundary length comprising the peripheral dimensions of all the isles comprises cell peripheral boundary 122 (also referred to as cell outer periphery) and trench isolation borders 124. Thus, for an icell comprising N×N isles or mini-cells in a square-shaped isle embodiment, the total icell edge length is N×cell outer periphery. In the representative example of FIG. 40 showing an icell with 4×4=16 isles, N=4, so total cell edge length is 4×cell outer periphery 4L=16L (hence, this icell has a peripheral dimension which is 4 times larger than that of a conventional solar cell). For a square-shaped master cell or icell with dimensions 156 mm×156 mm, square isle side dimensions are approximately 39 mm×39 mm and each isle or sub-cell has an area of 15.21 cm² per isle.

Figure 41A:
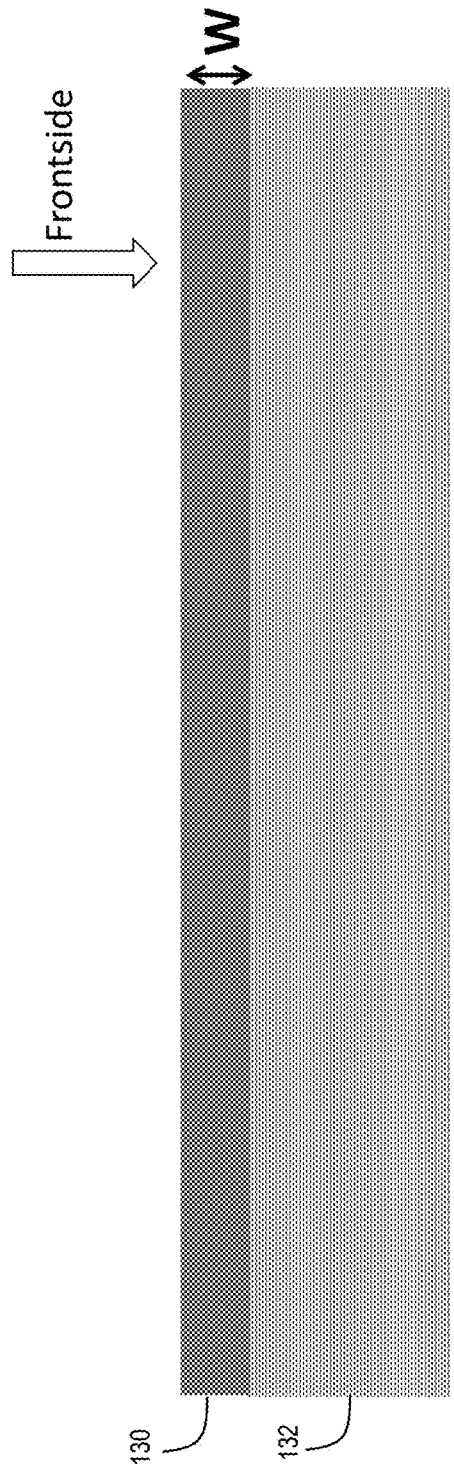
FIGS. 41A and 41B are representative schematic cross-sectional view diagrams of a backplane-attached solar cell during different stages of solar cell processing.
Figure 41B:
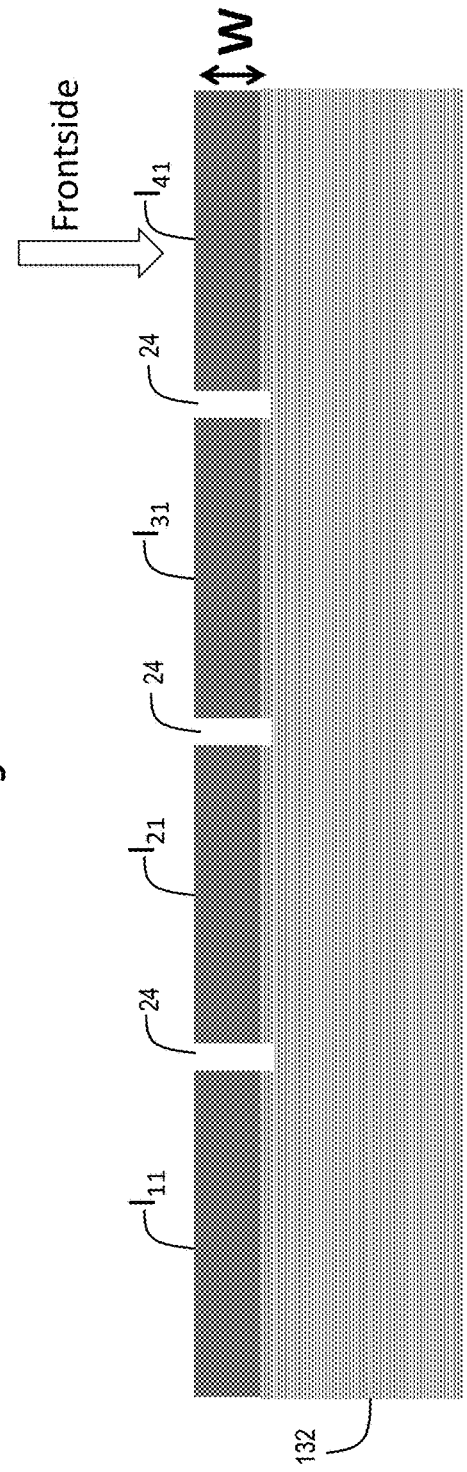

FIGS. 41A and 41B are representative schematic cross-sectional view diagrams of a backplane-attached solar cell during different stages of solar cell processing. FIG. 41A shows the simplified cross-sectional view of the backplane-attached solar cell after processing steps and before formation of the partitioning trench regions. FIG. 41B shows the simplified cross-sectional view of the backplane-attached solar cell after some processing steps and after formation of the partitioning trench regions to define the trench-partitioned isles. FIG. 41B shows the schematic cross-sectional view of the icell of FIG. 40 along the view axis A of FIG. 40 for an icell pattern (shown for square-shaped isles and square-shaped icell), indicating the uniform-size (equal-size) square-shaped isles for N×N=4×4=16 isles (or sub-cells, mini-cells, tiles).

FIGS. 41A and 41B are schematic cross-sectional diagrams of a monolithic master cell semiconductor substrate on a backplane before formation of trench isolation or partitioning regions, and a monolithic isled or tiled solar cell on a backplane formed from a master cell after formation of trench isolation or partitioning regions, respectively. FIG. 41A comprises semiconductor substrate 130 having width (semiconductor layer thickness) W and attached to backplane 132 (e.g., an electrically insulating continuous backplane layer, for instance, a thin flexible sheet of prepreg).

FIG. 41B is a cross-sectional diagram of an isled solar cell (icell)—shown as a cross-sectional diagram along the A axis of the cell of FIG. 40. Shown, FIG. 41B comprises isles or mini-cells $I_{11}$, $I_{21}$, $I_{31}$, and $I_{41}$ each having a trench-partitioned semiconductor layer width (thickness) W and attached to backplane 132. The semiconductor substrate regions of the mini-cells are physically and electrically isolated by an internal peripheral partitioning boundary, trench partitioning borders 124. The semiconductor regions of isles or mini-cells $I_{11}$, $I_{21}$, $I_{31}$, and $I_{41}$ are monolithically formed from the same continuous semiconductor substrate shown in FIG. 41A. The icell of FIG. 41B may be formed from the semiconductor/backplane structure of FIG. 41A by forming internal peripheral partitioning boundaries in the desired mini-cell shapes (e.g., square shaped mini-cells or isles) by trenching through the semiconductor layer to the attached backplane (with the trench-partitioned isles or mini-cells being supported by the continuous backplane). Trench partitioning of the semiconductor substrate to form the isles does not partition the continuous backplane sheet, hence the resulting isles remain supported by and attached to the continuous backplane layer or sheet. Trench partitioning formation process through the initially continuous semiconductor substrate thickness may be performed by, for example, pulsed laser ablation or dicing, mechanical saw dicing, ultrasonic dicing, plasma dicing, water jet dicing, or another suitable process (dicing, cutting, scribing, and trenching may be used interchangeably to refer to the process of trench isolation process to form the plurality of isles or mini-cells or tiles on the continuous backplane). Again, the backplane structure may comprise a combination of a backplane support sheet in conjunction with a patterned metallization structure, with the backplane support sheet providing mechanical support to the semiconductor layer and structural integrity for the resulting icell (either a flexible solar cell using a flexible backplane sheet or a rigid solar cell using a rigid backplane sheet or a semi-flexible solar cell using a semi-flexible backplane sheet). Again, while we may use the term backplane to the combination of the continuous backplane support sheet and patterned metallization structure, more commonly we use the term backplane to refer to the backplane support sheet (for instance, an electrically insulating thin sheet of prepreg) which is attached to the semiconductor substrate backside and supports both the icell semiconductor substrate regions and the overall patterned solar cell metallization structure.

As previously noted, crystalline (both mono-crystalline and multi-crystalline) silicon photovoltaics (PV) modules currently account for over approximately 85% of the overall global solar PV market, and the starting crystalline silicon wafer cost of these crystalline silicon PV modules currently constitutes about 30% to 50% of the total PV module manufacturing cost (with the exact ratio depending on the technology type and various economic factors). And while the primary embodiments provided herein are described as back-contact/back-junction (Inter-digitated Back-Contact or IBC) solar cells, the monolithic isled solar cell (or icell) innovations disclosed herein are extendible and applicable to various other solar cell architectures such as Metallization Wrap-Through (MWT) back-contact solar cells, Semiconductor HeteroJunction (SHJ) solar cells, front-contact/back-junction solar cells, front-contact/front-junction solar cells, Passivated Emitter and Rear Contact (PERC) solar cells, as well as other front-contact/front-junction solar cells, with all of the above-mentioned cell designs using crystalline silicon (for instance, either mono-crystalline silicon or multi-crystalline silicon with final cell silicon layer thickness in the range of a few microns up to about 200 microns), or another crystalline (mono-crystalline or multi-crystalline) semiconductor absorber material (including but not limited to germanium, gallium arsenide, gallium nitride, or other semiconductor materials, or a combination thereof). The monolithic isled solar cell (or icell) innovations disclosed herein are extendible and applicable to compound semiconductor multi junction solar cells.

A key advantage of the disclosed monolithically isled solar cells or icells is that they may be monolithically fabricated during cell processing and easily integrated into existing solar cell fabrication process flows. The isled master cell embodiments disclosed herein may be used in conjunction with numerous backplane-attached solar cell designs, processing methods, and semiconductor substrate materials, including the backplane-attached, back-contact solar cells fabricated using epitaxial silicon lift-off process flow shown in FIG. 12. FIG. 12 shows the schematic diagram of a general back-contact solar cell manufacturing process flow highlighting key processing steps of one such cell fabrication process—a crystalline-silicon solar cell manufacturing process using relatively thin (in the thickness range of a few microns up to about 100 microns) epitaxial silicon lift-off processing which substantially reduces silicon material usage and eliminates several process steps in the traditional crystalline silicon solar cell manufacturing steps to create low-cost, high-efficiency, back-junction/back-contact crystalline silicon solar cells and modules. Specifically, the process flow of FIG. 12 shows the fabrication of backplane-attached crystalline silicon solar cells having backplanes attached to the backsides of the solar cells (for instance, prepreg backplane sheets laminated to the backsides of the solar cells) for solar cells and modules with optional allowances for smart cell and smart module design (i.e., allowing for embedded distributed electronics components for enhanced power harvest from the solar cells and modules), formed using a reusable crystalline (either mono-crystalline or multi-crystalline) silicon template and epitaxial silicon deposition on a seed and release layer of porous silicon, which may utilize and integrate the monolithically isled cell (icell) structures and methods disclosed herein.

The solar cell process flow of FIG. 12 may be used to form monolithic isled solar cells or icells. The process shown in FIG. 12 starts with a reusable (to be reused at least a few times, in some instances between about 10 up to about 100 times) crystalline silicon template, for example a p-type monocrystalline or multi-crystalline silicon wafer, onto which a thin (a fraction of micron up to several microns) sacrificial layer of porous silicon with controlled porosity is formed (for example by an electrochemical etch process for template surface modification in an HF/IPA or HF/acetic acid wet chemistry in the presence of an electrical current). The porous silicon layer may have at least two layers with a lower porosity surface layer and a higher porosity buried layer. The starting material or reusable crystalline silicon template may be a single crystalline (also known as mono-crystalline) silicon wafer, for example formed using crystal growth methods such as float zone (FZ), czochralski (CZ), magnetic stabilized CZ (MCZ), and may further optionally comprise epitaxial layers grown over such silicon wafers. Alternatively, the starting material or reusable crystalline silicon template may be a multi-crystalline silicon wafer, for example formed using either casting or ribbon, and may further optionally comprise epitaxial layers grown over such silicon wafers. The template semiconductor doping type may be either p or n (often relatively heavy p-type doping to facilitate porous silicon formation), and the wafer shape, while most commonly square shaped, may be any geometric or non-geometric shape such as quasi-square (pseudo square), hexagonal, round, etc.

Upon formation of the sacrificial porous silicon layer, which serves both as a high-quality epitaxial seed layer as well as a subsequent separation/lift-off layer for the resulting epitaxial silicon layer, a thin layer (for example a layer thickness in the range of a few microns up to about 100 microns, and in some instances an epitaxial silicon thickness less than approximately 50 microns) of in-situ-doped (for instance, doped with phosphorus to form a n-type epitaxial silicon layer) crystalline (either mono-crystalline or multi-crystalline) silicon is formed on the sacrificial porous silicon layer, also called epitaxial growth. The in-situ-doped crystalline (either mono-crystalline layer on mono-crystalline template or multi-crystalline layer on multi-crystalline template) silicon layer may be formed, for example, by atmospheric-pressure epitaxy using a chemical-vapor deposition or CVD process in ambient comprising a silicon gas such as trichlorosilane or TCS and hydrogen (and the desired dopant gas such as $PH_3$ for n-type phosphorus doping).

After completion of a portion of solar cell processing steps (including in some instances, backside doped emitter formation, backside passivation, doped base and emitter contact regions for subsequent metallization contacts to the base and emitter regions, and solar cell metallization), a rather inexpensive backplane layer may attached to the thin epi layer for permanent cell support and reinforcement as well as to support formation of the high-conductivity cell metallization structure of the solar cell (for instance, using a two-layer metallization structure using a patterned first layer of metallization or M1 on the solar cell backside prior to the backplane attachment and a patterned second layer of metallization or M2 on the backside of the backplane-attached solar cell after the backplane attachment and after the lift-off release of the backplane-attached solar cell from the reusable template). The continuous backplane material may be made of a thin (for instance, with a thickness in the range of about 50 microns to about 250 microns thick), flexible, and electrically insulating polymeric material sheet such as an inexpensive prepreg material commonly used in printed circuit boards which meets cell process integration and reliability requirements. The partially-processed back-contact, back-junction (IBC) backplane-attached solar cell (for instance, with a solar cell area of about 100 mm×100 mm, 125 mm×125 mm, 156 mm×156 mm, 210 mm×210 mm or larger, or solar cell area in the range of about 100 $cm^2$ to 100's of $cm^2$ and even larger) is then separated and lifted off (released) from the reusable template along the mechanically-weakened sacrificial porous silicon layer (for example through a Mechanical Release or MR lift-off process, breaking off the higher porosity porous silicon interface to enable lift-off release) and the template may be conditioned (e.g., cleaned) and re-used multiple times (for instance, between about 10 and 100 times) to reduce the overall solar cell manufacturing cost. The remaining post-lift-off solar cell processing may then be performed on the backplane-attached solar cell, for example first on the solar cell sunny-side (or frontside) which is exposed after being lifted off and released from the template. Solar cell frontside or sunny-side processing may include, for instance, completing frontside texturization (for instance, using an alkaline or acitic texturing), post-texture surface preparation (cleaning), and formation of the frontside passivation and an anti-reflection coating (ARC) using a deposition process. The frontside passivation and ARC layer may be deposited using a Plasma-Enhanced Chemical-Vapor Deposition (PECVD) process and/or another suitable processing method.

The monolithically isled cell (icell) structures and methods disclosed herein may be integrated into device fabrication, such as the exemplary disclosed solar cell fabrication process flow, without substantially altering or adding manufacturing process steps or tools and thus without substantially adding to the cost of manufacturing the solar cell and without substantially altering the main solar cell manufacturing process flow. In fact, the monolithically isled cell (icell) structures and methods disclosed herein can reduce the cost of manufacturing the solar cell, for instance, by reducing the metallization cost (using less metallization material and lower cost metallization process) and/or by improving the solar cell and module manufacturing yield (due to substantial mitigation of solar cell micro-cracks or breakage).

In one embodiment, scribing (also known as trenching or cutting or dicing), of the master cell semiconductor substrate to form the internal isle partitioning trench boundaries and creating the plurality of trench-partitioned isles or mini-cells or sub-cells or tiles may be performed from the frontside or sunnyside (after lift-off release of the backplane-attached epitaxial silicon substrate layer), using a suitable method such as pulsed laser ablation (for instance, pulsed nanoseconds laser scribing) or a mechanical scribing method or a plasma scribing method, through the master cell silicon substrate layer thickness (for example, the epitaxial silicon layer thickness may be in the range of about a few microns up to about 100 µm). Pulsed laser ablation scribing (or another suitable trench scribing method as described before) may be performed such that scribing through the thickness of the semiconductor substrate layer forms relatively narrow (e.g., width of less than 100 microns) trench isolation borders all the way through the entire thickness of the thin silicon layer and essentially stops at/on the backplane (removal and scribing of the continuous backplane material layer being rather small or negligible)—thus monolithically producing fully partitioned monolithic isles (or sub-cells or mini-cells or tiles) supported on a continuous backplane layer. Partitioning trench formation methods to form the plurality of isles and their associated trench partitioning boundaries in a master cell substrate having a thickness in the range of about a few microns to as large as about 200 microns (master cell substrate thickness or width shown as W in FIG. 41) include, for example: pulsed laser scribing (or dicing, or trenching), such as by pulsed nanoseconds laser ablation (using a suitable laser wavelength such as UV, green, IR, etc.); ultrasonic scribing or dicing; mechanical trench formation such as by using a mechanical saw or blade; patterned chemical etching (both wet and plasma etching); screen printing of an etch paste following by etching activation and rinsing of the etch paste residue, or any combination of known or the above mentioned trench formation methods. Pulsed laser ablation processing for trench formation may provide several advantages allowing for the direct patterning of the isle or mini-cell boundaries with relatively high process throughput, enabling formation of relatively narrow trenches (e.g., less than about 100 microns trench width), and without any process consumable (hence, very low process cost). However, irrespective of the trench formation method used to partition the plurality of isles or sub-cells, special care should be taken to reduce or minimize the trench width—for example, it may be desired to make the partitioning trench width less than about 100 microns, in order to make the solar cell area loss due to the icell partitioning trenches a relatively small to negligible fraction of the total icell area (for instance less than about 1% of the total icell area). This will ensure that the loss of icell total-area efficiency due to the partitioning trenches is rather negligible (e.g., less than 1% relative). Pulsed nanoseconds laser ablation processing is capable of high-throughput formation of trenches with trench width well below 100 microns (e.g., about 10 to 60 microns). For example, for a square-shaped icell with the master cell area of 156 mm×156 mm and 4×4=16 isles (or mini-cells) and partitioning trenches with trench width of 50 microns (0.05 mm), for example, formed by pulsed laser ablation trenching, the area fraction R of the total trench planar surface area $A_{trench}$ to the total master cell area (or the icell area $A_{icell}$) can be calculated as follows: $R=A_{trench}/A_{icell}=6 \times 156$ mm×0.05 mm/(156 mm×156 mm) or R=0.00192. Therefore, this represents an area fraction R of 0.00192 or about 0.2%. This is an extremely small area fraction, ensuring negligible loss of total-area icell efficiency as a result of the partitioning trench areas. In reality, the loss of total-area icell efficiency would be smaller than 0.2% relative under these conditions, since the direct and/or diffused sunlight impinging on the trench isolation or partitioning areas can be at least partially and possibly mostly absorbed on the isle semiconductor edge regions and contribute to the photo-generation process.

The monolithic isled (tiled) solar cell fabrication methods and structures described herein are applicable to various semiconductor (for example including but not limited to crystalline silicon, such as thin epitaxial silicon or thin crystalline silicon wafer) solar cells (for example, front contact or back contact solar cells of various designs with cell semiconductor absorber having a thickness in the range of about a few microns up to about 200 microns), including those formed using epitaxial silicon lift-off processing (as described earlier) or those formed using crystalline silicon wafers, such as mono-crystalline (CZ or MCZ or FZ) wafers or multi-crystalline wafers (cast or ribbon-grown wafers).

For back-contact/back-junction square-shaped cells (for example high-efficiency back-contact/back-junction IBC cells formed using either epitaxial silicon lift-off processing or crystalline silicon wafer cells with backplane reinforcement), the master cell isles (also called tiles, pavers, sub-cells, or mini-cells) may be formed (for example, using pulsed nanoseconds laser scribing of crystalline silicon substrate) as an array of N×N square-shaped isles, N×M rectangular-shaped isles, K triangular-shaped isles, or any geometrically shaped isles or combination thereof on the shared master cell (icell) continuous backplane. In the case of solar cells fabricated using epitaxial lift-off processing, the isle partitioning trench formation process may occur immediately after the lift-off release of the partially-processed backplane-attached master cell and before the remaining processing steps such as frontside surface texturing and post-texture surface cleaning, or immediately after frontside texturing and post-texture surface cleaning and before the process(es) to form the front-surface passivation and anti-reflection coating (ARC) layer(s). Performing the process to form the partitioning or isolation trenches (i.e., trenching process) by pulsed laser scribing or another suitable method (such as one of the other methods described earlier including but not limited to mechanical dicing) before the wet etch texture process (to form the solar cell frontside texture for reduced optical reflection losses) has an added advantage of removing any trenching-process-induced silicon edge damage through wet etching and removal of damaged silicon during the wet texture etch process (which also etches several microns of silicon, including any damaged silicon in the partitioning trench sidewalls, during the texture etch process).

In some solar cell processing embodiments, including those representative process flows described in detail herein, no additional separate fabrication process equipment may be needed for the formation of the monolithically isled master cells (icells). In other words, the formation of trench-partitioned mini-cells or isles within each icell may be integrated fairly easily and seamlessly in solar cell fabrication methods. And in some cases, the monolithic isled solar cell (icell) fabrication process may improve the solar cell fabrication process flow through a reduction of solar cell manufacturing cost, for example, by reducing the cost of solar cell metallization, such as, for instance, by eliminating the need for a copper plating process and associated manufacturing equipment and facilities requirements for copper plating.

Figure 43:
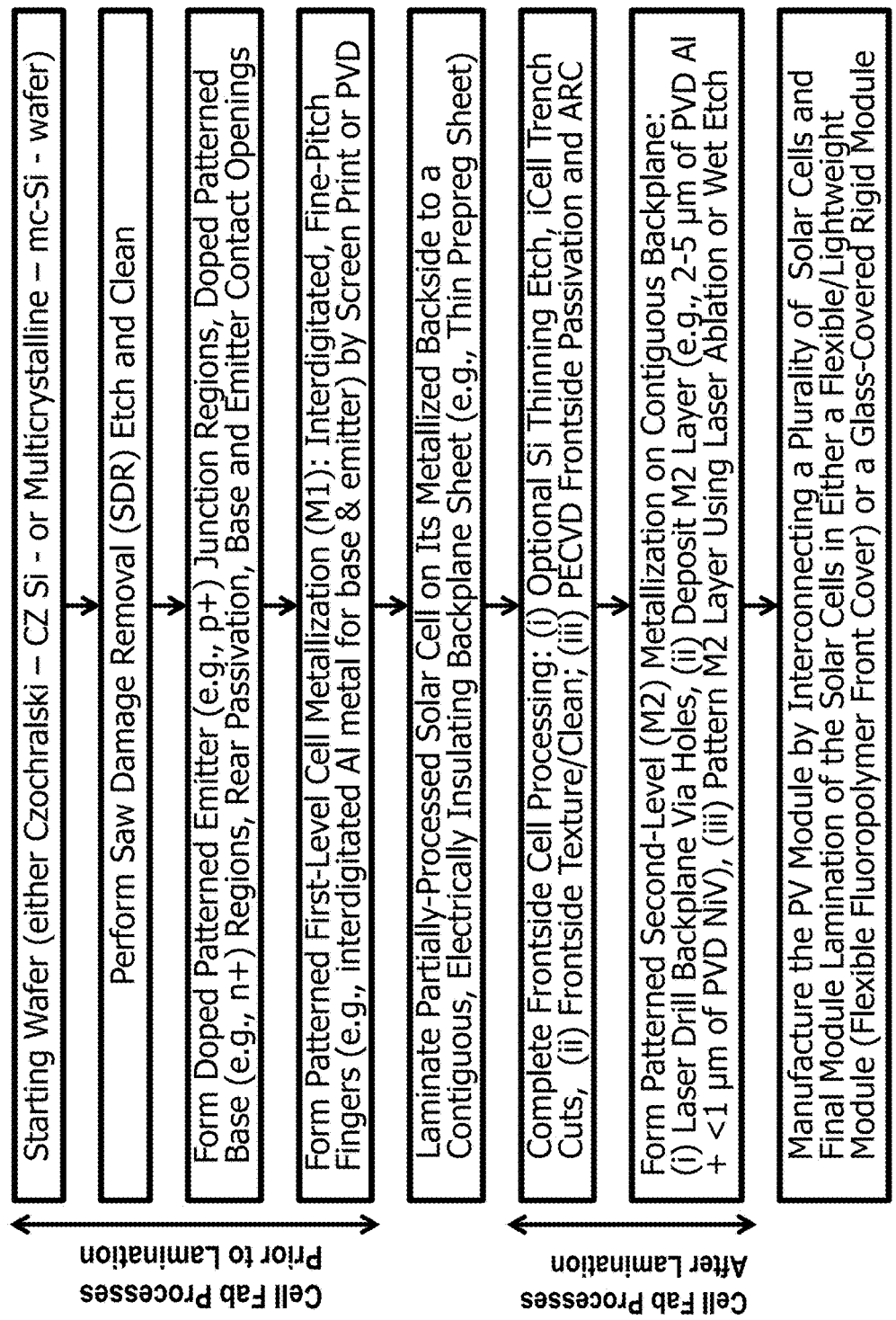
FIG. 43 is a high level solar cell and module fabrication process flow embodiment using starting crystalline (monocrystalline or multi-crystalline) silicon wafers.

FIG. 43 is a representative backplane-attached icell manufacturing process flow based on epitaxial silicon and porous silicon lift-off processing. This process flow is for fabrication of backplane-attached, back-contact/back-junction solar cells (icells) using two patterned layers of solar cell metallization (M1 and M2). This example is shown for a solar cell with selective emitter, i.e., a main patterned field emitter with lighter emitter doping formed using a lighter boron-doped silicate glass (first BSG layer with smaller boron doping deposited by Tool 3), and more heavily-boron-doped emitter contact regions using a more heavily boron-doped silicate glass (second BSG layer with larger boron doping deposited by Tool 5). While this example is shown for an IBC solar cell using a double-BSG selective emitter process, the icell designs are applicable to a wide range of other solar cell structures and process flows, including but not limited to the IBC solar cells without selective emitter (i.e., same emitter boron doping in the field emitter and emitter contact regions). This example is shown for an IBC icell with an n-type base and p-type emitter. However, the polarities can be changed so that the solar cell has p-type base and n-type emitter instead.

Figure 42:
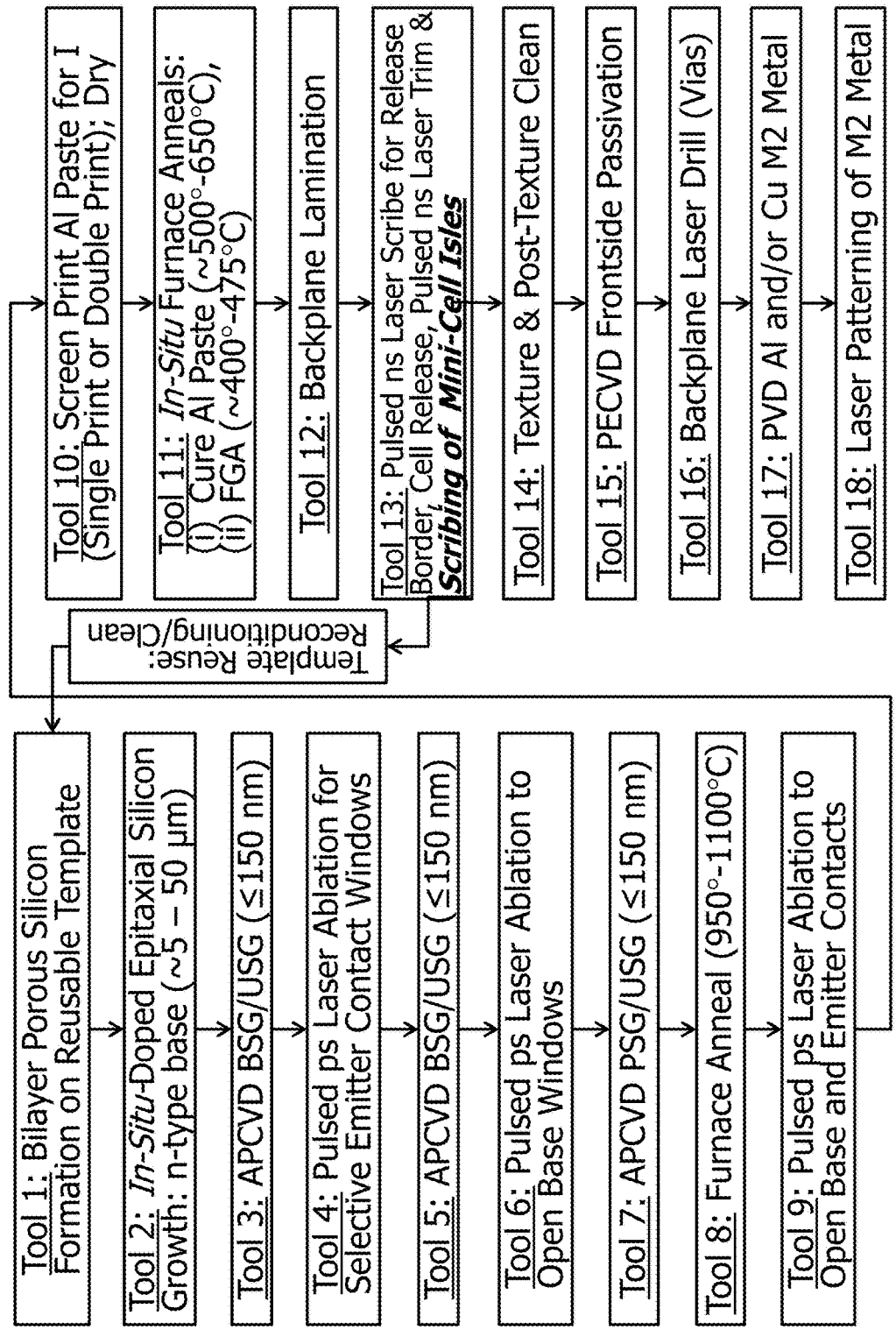
FIG. 42 is a representative backplane-attached icell manufacturing process flow based on epitaxial silicon and porous silicon lift-off processing.

FIG. 42 is a representative manufacturing process flow embodiment for the fabrication of back-contact back-junction crystalline monolithic isled silicon solar cells (icells). Specifically, FIG. 42 provides for the formation of an epitaxial (epi) solar cell, optionally with a monolithically integrated bypass switch (MIBS) pn junction diode, and having a double borosilicate glass (BSG) selective emitter. As shown in this flow, mini-cell trench isolation regions are formed at Tool 13, after cell release border scribe and cell lift-off release and before texturization of the exposed released side (also known as frontside or sunnyside of the resulting icell). Alternatively, the mini-cell trench isolation regions may be formed after texture and post texture clean in Tool 14, and before frontside passivation (shown as PECVD). Performing the pulsed laser scribing before wet etch texture (texture and post texture clean using Tool 14) may have an added advantage of removing any laser-induced scribed silicon edge damage through wet etching and removal of damaged silicon.

A representative process flow for forming a monolithic isled (tiled) back-contact/back-junction (IBC) solar cell using epitaxial silicon lift-off processing may comprise the following fabrication steps: 1) start with reusable crystalline (mono-crystalline or multi-crystalline) silicon template; 2) form porous silicon on template (for example, bilayer porous silicon with a lower porosity surface layer and a higher porosity buried layer using anodic etch in HF/IPA or HF/acetic acid); 3) deposit epitaxial silicon with in-situ doping (for instance, n-type phosphorus doped epitaxial silicon); 4) perform back-contact/back-junction cell processing while the epitaxial silicon substrate resides on its template, including formation of patterned field emitter junction, backside passivation, doped base and emitter contact regions for subsequent metallized solar cell ohmic contacts, and formation of a first metallization layer (also known as M1)—see FIG. 42 for an example of a back-contact/back-junction (IBC) solar cell fabrication process flow comprising a selective emitter process (with more lightly doped field emitter and more heavily doped emitter contact regions) using double-BSG (BSG is boron-doped silicate glass or boron doped silicon oxide layer formed, for instance, by an atmospheric-pressure chemical-vapor deposition or APCVD process) process flow for selective emitter formation (other methods of selective emitter formation may be used instead of double BSG process, for instance, using screen printed dopant pastes); 5) attach or laminate backplane layer or sheet on back-contact cell backside; 6) laser scribe release border (lift off release boundary) around the backplane boundary at least partially into epitaxial silicon layer thickness and then release by a lift-off process (e.g., mechanical release lift-off to separate the backplane-attached epitaxial silicon substrate from the reusable template by breaking off the mechanically weakened higher porosity porous silicon layer); 7) perform the trenching (also called scribing or cutting or dicing) process using pulsed nanoseconds laser ablation (or one of the other suitable trench isolation formation methods as described earlier) from the solar cell sunnyside (opposite the backplane side) to monolithically partition the silicon substrate into the plurality of mini-cells or isles—for instance, into an array of isles comprising 4×4=16 mini-cells (also optionally trim the master cell peripheral boundary, for instance, using pulsed laser cutting, to establish the precise master cell or icell dimensions with well-defined smooth cell boundary edges); 8) proceed with performing the remaining back-end fabrication processes such as: wet silicon etch/texture in alkaline and/or acidic chemistry (this process performs the texturization on the frontside while the chemically-resistant backplane protects the backside of the solar cell from the texturization chemistry), post-texture surface preparation including wet cleaning (this process performs the frontside surface cleaning while the chemically-resistant backplane protects the backside of the solar cell from the wet cleaning chemistry), deposition of the frontside surface passivation and anti-reflection coating (ARC) layer(s), for instance, by Plasma-Enhanced Chemical-Vapor Deposition (PECVD) or a combination of PECVD for ARC deposition (e.g., hydrogenated silicon nitride) with another process such as Atomic Layer Deposition (ALD) for passivation layer deposition (such as a thin sub-30 nm layer of aluminum oxide, amorphous silicon, or amorphous silicon oxide directly on the cleaned, textured silicon surface and underneath the silicon nitride ARC layer—if using a multi-layer frontside passivation/ARC structure, such as a two-layer structure of one of the above-mentioned passivation layers covered by the silicon nitride ARC layer, the entire stack may also be deposited using PECVD using a vacuum-integrated process). The frontside passivation and ARC layer deposition will not only cover the frontside surfaces of the mini-cells or isles, it will also cover the sidewalls of the trench-partitioned isles or mini-cells, hence, substantially improving the passivation and ARC properties of the icell by improving the passivation and light capturing properties of the trench sidewalls as well as the top surfaces of the isles. After completion of the frontside texture/cleaning/passivation and ARC deposition processes, the remaining solar cell fabrication process step involves completion of the second metallization layer (M2) on the backplane-attached solar cell backside. In order to accomplish this task, a plurality of via holes are drilled according to a pre-designed via hole pattern, for instance using laser drilling, into the thin (e.g., 25 microns up to 250 microns backplane thickness), electrically insulating, continuous backplane layer (e.g., a 25 micron to 100 micron thick laminated prepreg sheet). The number of via holes on a solar cell (e.g., 156 mm×156 mm icell) backplane may be on the order of 100's to 1000's. The via holes may have average diagonal hole dimension (e.g., average diameter of each via hole) in the range of 10's of microns to 100's of microns (for instance, about 100 microns to 300 microns). The laser-drilled via holes through the electrically insulating backplane layer are positioned to land on the interdigitated base and emitter metallization fingers (formed by the first level of patterned metallization by screen printing of a metallic paste or by physical-vapor deposition and patterning of a metal layer such as a metal comprising aluminum or aluminum-silicon alloy). These via holes will serve as the interconnection channels or plugs between the first layer of patterned metallization or M1 formed directly on the solar cell backside prior to the backplane attachment/lamination and the second layer of patterned metal or M2 to be formed immediately after formation of the laser-drilled via holes. In some instances for the icells disclosed herein, the second level of patterned metallization M2 may be formed by one of several methods, including but not limited to one or a combination of: (1) Physical-Vapor Deposition or PVD (thermal evaporation and/or electron-beam evaporation and/or plasma sputtering) of an inexpensive high-conductivity metal comprising, for instance, aluminum and/or copper (other metals may also be used) followed by pulsed laser ablation patterning, (2) Physical-Vapor Deposition or PVD (thermal evaporation and/or electron-beam evaporation and/or plasma sputtering) of an inexpensive high-conductivity metal comprising, for instance, aluminum and/or copper (other metals may also be used) followed by metal etch patterning (e.g. screen printing of an etch paste or screen printing of a resist followed by a metal wet etch process and subsequent removal of the resist), (3) Screen printing or stencil printing of a suitable metal paste (such as a paste comprising copper and/or aluminum), (4) Inkjet printing or aerosol printing of a suitable metal paste (such as a paste comprising copper and/or aluminum), (5) Patterned plating of a suitable metal, for instance, copper plating. The patterned second layer of metallization (M2) may also comprise a thin capping layer (for instance, a thin <1 micron capping layer of NiV or Ni formed by plasma sputtering or screen printing or plating) to protect the main patterned M2 (e.g., aluminum and/or copper containing high conductivity metal) and to provide a suitable surface for soldering or conductive adhesive as needed. The back-contact/back-junction (IBC) solar cells described herein may utilize two layers of patterned metallization (M1 and M2), with the first patterned metallization layer M1 forming the interdigitated base and emitter metallization fingers on each mini-cell or isle according to a fine-pitch pattern (for instance, base-emitter M1 finger pitch in the range of about 200 microns to 2 mm, and in some cases in the range of about 500 microns to about 1 mm), and the second patterned layer of metallization M2 forming the final icell metallization and interconnecting the isles or mini-cells according to a pre-specified current and voltage scaling factor. Patterned M2 may be patterned substantially orthogonal or perpendicular to patterned M1 and have a much larger finger-to-finger pitch than patterned M1 fingers. This will substantially facilitate fabrication of patterned M2 according to a low-cost, high-yield manufacturing process. Patterned M2 not only formed the final icell patterned metallization, it also forms the electrically conductive via plugs through the laser-drilled via holes in order to complete the M2-to-M1 interconnections based on desired icell metallization structure.

Figure 5:
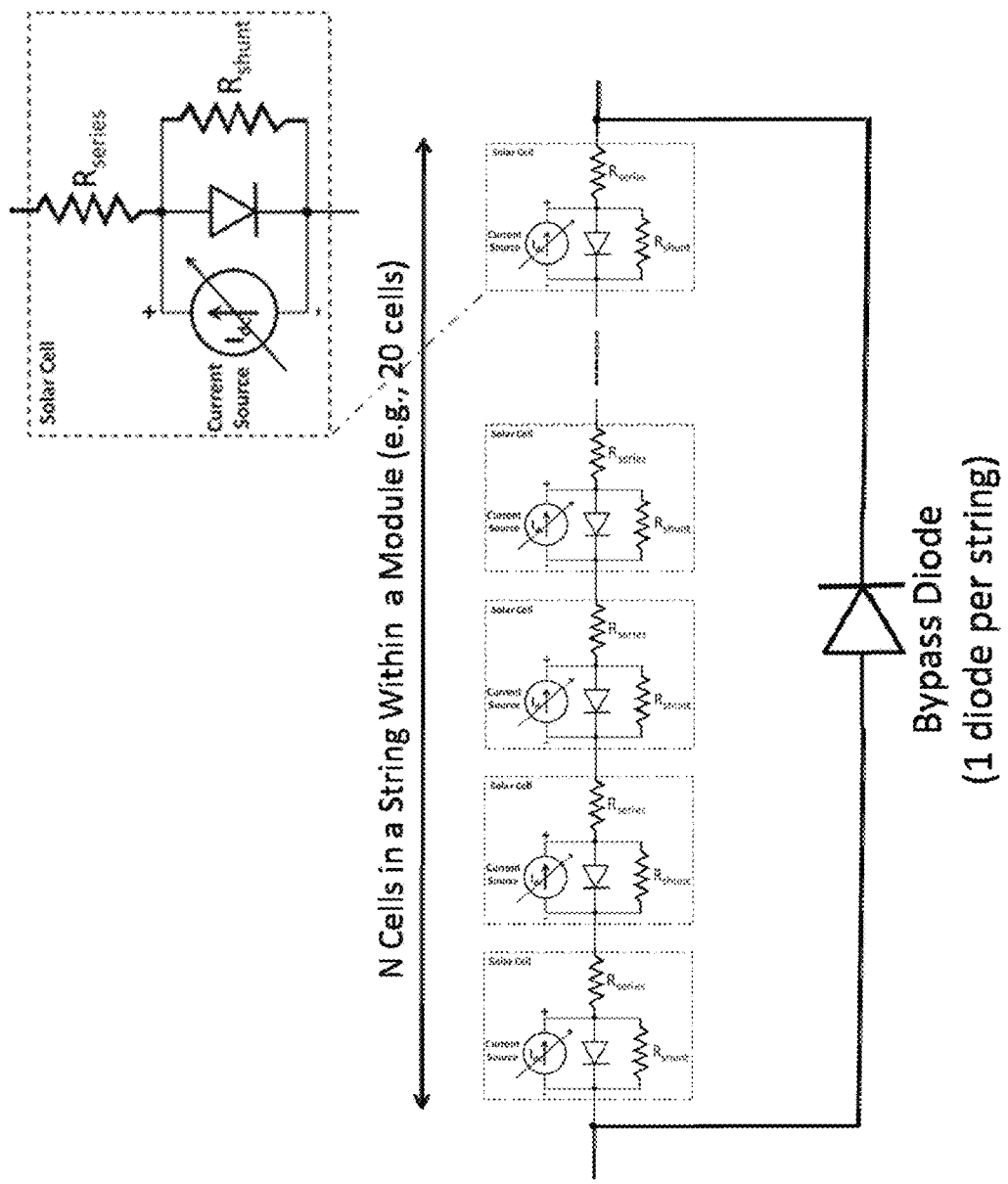
FIG. 5 is a schematic diagram of an external bypass diode used in a module sub-string, with the solar cells shown with their equivalent circuit diagrams.
Figure 6:
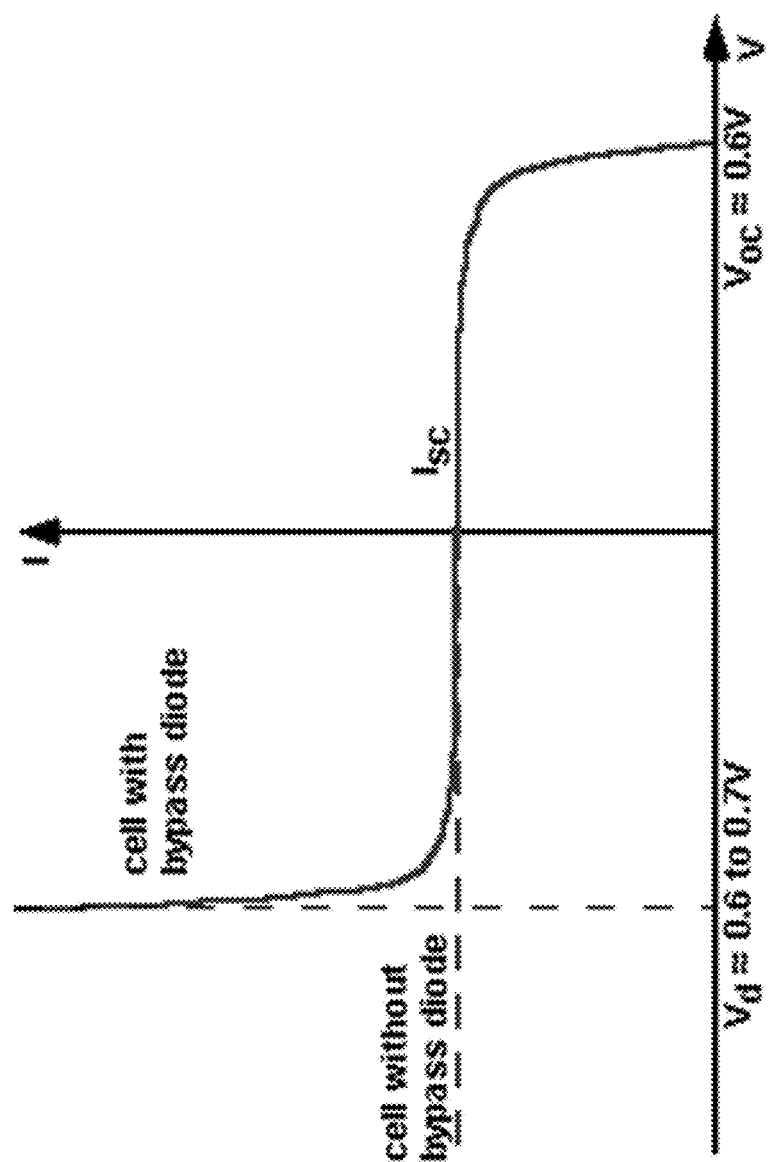
FIG. 6 is a graph showing the current-voltage (I-V) characteristics of a crystalline solar cell with and without a bypass diode.

It is also possible to extend the icell concept so that the second layer of patterned metallization M2 can be used to not only complete the individual master cell (or icell) electrical interconnections, but also monolithically interconnect a plurality of icells sharing the same continuous backplane layer, hence, resulting in a Monolithic Module structure facilitated and enabled by the icells embodiments and with numerous additional benefits. FIG. 5A for epitaxial silicon lift off icell representative embodiment shows the process flow for fabricating monolithic icells with each icell being attached to its own separate pre-cut continuous backplane layer, and each individual backplane attached icell being processed through the entire backend process flow after its backplane lamination. The icells processed using this approach will then be tested and sorted at the end of the process and can be assembled into the PV modules by interconnections of the icells to one another, for instance in electrical series, using tabbing and/or stringing of the cells (also involving soldering and/or conductive adhesives to interconnect the plurality of solar cells to one another as part of PV module assembly), and then completion of the module lamination and final module assembly and testing. With reference to FIG. 5A for epitaxial silicon lift off icell representative embodiment, an alternative embodiment of an icell implementation resulting in a novel monolithic module structure involves attachment or lamination of a plurality of relatively closely-spaced icells (for instance, with the adjacent icell to icell spacing in the range of 50 microns up to about 2 mm, and often in the range of about 100 microns to 1 mm) on their backsides to a larger continuous backplane sheet at the Backplane Lamination (or attachment step) performed by Tool 12. The remaining process steps after Tool 12 are performed concurrently on the plurality of icells sharing a common continuous backplane layer on their backsides (instead of being performed on the individual separate icells, each with their own separate backplane). After completion of the final metallization (patterned second layer of metal M2), the monolithic patterned M2 not only completes the metallization pattern for each icell among the plurality of the icells sharing the larger continuous backplane layer, it also completes electrical interconnections of the plurality of icells to one another according to any desired arrangement, for instance, interconnecting the icells to one another all in series or in a hybrid parallel/series arrangement. This embodiment enables fabrication of icells and the monolithic electrical interconnections among a plurality of icells on a shared continuous backplane layer, hence eliminating the need for subsequent soldering/tabbing/stringing of the icells to one another during the final module assembly. For example, in order to make 6×10=60-cell modules, an array of 6×10=60 icells are attached/laminated on their backsides immediately after completion of the patterned first layer of metal (M1)—after Tool 11 process in FIG. 5A—to a properly sized continuous backplane sheet (e.g., a sheet of prepreg) and the remaining process steps (starting with the backplane lamination/attachment process shown as Tool 12 and through the remaining backend process steps through completion of the second layer of patterned metal M2) are all performed on the large backplane-attached sheet comprising the plurality of (e.g., 6×10=60) icells. In this monolithic module example which comprises 6×10=60 icells, if each icell has dimensions of about 156 mm×156 mm and the spacing between the adjacent icells is about 1 mm, the continuous backplane layer or sheet (e.g., an aramid fiber/resin prepreg sheet with a thickness in the range of about 50 to 100 microns) to be used for attachment/lamination to the backsides of the 6×10 array of icells should have minimum dimensions of about 942 mm×1570 mm (e.g., the sheet may be made somewhat oversized to allow for backplane extensions in the side margins of the monolithic module, for instance, about 1 m×1.6 m backplane sheet dimensions in this 6×10=60 icell monolithic module example). As another example, in order to make 6×12=72-cell modules, an array of 6×12=72 icells are attached/laminated on their backsides immediately after completion of the patterned first layer of metal (M1)—after Tool 11 process in FIG. 5A—to a properly sized continuous backplane sheet (e.g., a sheet of prepreg) and the remaining process steps (starting with the backplane lamination/attachment process shown as Tool 12 and through the remaining backend process steps through completion of the second layer of patterned metal M2) are all performed on the large backplane-attached sheet comprising the plurality of (e.g., 6×12=72) icells. In this monolithic module example which comprises 6×12=72 icells, if each icell has dimensions of about 156 mm×156 mm and the spacing between the adjacent icells is about 1 mm, the continuous backplane layer or sheet (e.g., an aramid fiber/resin prepreg sheet with a thickness in the range of about 50 to 100 microns) to be used for attachment/lamination to the backsides of the 6×12 array of icells should have minimum dimensions of about 942 mm×1884 mm (e.g., the sheet may be made somewhat oversized to allow for backplane extensions in the side margins of the monolithic module, for instance, approximately 1 m×1.9 m backplane sheet dimensions in this 6×12=72 icell monolithic module example). The monolithic interconnections of the plurality of icells on a shared continuous backplane layer using the second layer of patterned metal M2 results in further reduction of the overall solar cell and PV module manufacturing cost as well as improved projected reliability of the PV modules during field operation (due to the elimination of soldered tabs, strings).

The embodiments of this invention can be applied to solar cells using this type of process flow as outlined in the representative process flow of FIG. 5A, as well as many other solar cell designs (as described before) and solar cell fabrication process flows including but not limited to the solar cells fabricated from starting monocrystalline wafers (e.g., Czochralski or CZ, Float Zone or FZ) or multi-crystalline wafers (from cast crystalline bricks or formed by a ribbon pulling process) or epitaxial growth or other substrate fabrication methods. Moreover, icell embodiments may be applied to other semiconductor materials besides silicon as described before, including but not limited to gallium arsenide, germanium, gallium nitride, other compound semiconductors, or a combination thereof.

FIG. 43 is a high level solar cell and module fabrication process flow embodiment using starting crystalline (monocrystalline or multi-crystalline) silicon wafers. FIG. 43 shows a high-level icell process flow for fabrication of backplane-attached back-contact/back-junction (IBC) icells using two layers of metallization: M1 and M2. The first layer or level of patterned cell metallization M1 is formed as essentially the last process step among a plurality of front-end cell fab processes prior to the backplane lamination to the partially processed icell (or a larger continuous backplane attached to a plurality of partially processed icells when fabricating monolithic modules as described earlier). The front-end cell fab processes outlined in the top 4 boxes of FIG. 5B essentially complete the back-contact/back-junction solar cell backside structure through the patterned M1 layer. Patterned M1 is designed to conform to the icell isles (mini-cells) and comprises a fine-pitch interdigitated metallization pattern as described for the epitaxial silicon icell process flow outlined in FIG. 42. In FIG. 43, the fifth box from the top involves attachment or lamination of the backplane layer or sheet to the partially processed icell backside (or to the backsides of a plurality of partially processed icells when making a monolithic module)—this process step is essentially equivalent to the one performed by Tool 12 in FIG. 42 in case of epitaxial silicon lift-off process). In FIG. 43, the sixth and seventh boxes from the top outline the back-end or post-backplane-attachment (also called post-lamination) cell fab processes to complete the remaining frontside (optional silicon wafer thinning etch to form thinner silicon absorber layer if desired, partitioning trenches, texturization, post-texturization cleaning, passivation and ARC) as well as the via holes and second level or layer of patterned metallization M2. The "post-lamination" processes (or the back-end cell fab processes performed after the backplane attachment) outlined in the sixth and seventh boxes of FIG. 43 essentially correspond to the processes performed by Tools 13 through 18 for the epitaxial silicon lift off process flow shown in FIG. 42. The bottom box in FIG. 5B describes the final assembly of the resulting icells into either flexible, lightweight PV modules or into rigid glass-covered PV modules. If the process flow results in a monolithic module comprising a plurality of icells monolithically interconnected together by the patterned M2 (as described earlier for the epitaxial silicon lift off process flow), the remaining PV module fabrication process outlined in the bottom box of FIG. 43 would be simplified since the plurality of the interconnected icells sharing a larger continuous backplane and the patterned M2 metallization for cell-to-cell interconnections are already electrically interconnected and there is no need for tabbing and/or stringing and/or soldering of the solar cells to one another. The resulting monolithic module can be laminated into either a flexible, lightweight PV module (for instance, using a thin flexible fluoropolymer cover sheet such as ETFE or PFE on the frontside instead of rigid/heavy glass cover sheet) or a rigid, glass-covered PV module.

The design of isles or mini-cells (sub-cells) of an icell may include various geometrical shapes such as squares, triangles, rectangles, trapezoids, polygons, honeycomb hexagonal isles, or many other possible shapes and sizes. The shapes and sizes of isles, as well as the number of isles in an icell may be selected to provide optimal attributes for one or a combination of the following considerations: (i) overall crack elimination or mitigation in the master cell (icell); (ii) enhanced pliability and flexibility/bendability of master cell (icell) without crack generation and/or propagation and without loss of solar cell or module performance (power conversion efficiency); (iii) reduced metallization thickness and conductivity requirements (and hence, reduced metallization material consumption and processing cost) by reducing the master cell (icell) current and increasing the icell voltage (through series connection or a hybrid parallel-series connection of the isles in the monolithic icell, resulting in scaling up the voltage and scaling down the current); and (iv) providing relatively optimum combination of electrical voltage and current ranges in the resulting icell to facilitate and enable implementation of inexpensive distributed embedded electronics components on the icells and/or within the laminated PV modules comprising icells, including but not limited to at least one bypass switch (e.g., rectifying pn junction diode or Schottkty barrier diode) per icell, maximum-power-point tracking (MPPT) power optimizers (at least a plurality of MPPT power optimizers embedded in each module, with each MPPT power optimizer dedicated to at least 1 to a plurality of series-connected and/or parallel-connected icells), PV module power switching (with remote control on the power line in the installed PV array in order to switch the PV modules on or off as desired), module status (e.g., power delivery and temperature) during operation of the PV module in the field, etc. For example and as described earlier, in some applications and instances when considered along with other requirements, it may be desired to have smaller (for example triangular shaped) isles near the periphery of the master cell (icell) to reduce crack propagation and/or to improve flexibility/bendability of the resulting icells and flexible, lightweight PV modules.

Partitioning the main/master cell into an array of isles or sub-cells (such as an array of N×N square or pseudo-square shaped or K triangular-shaped or a combination thereof) and interconnecting those isles in electrical series or a hybrid combination of electrical parallel and electrical series reduces the overall master cell current for each isle or mini-cell—for example by a factor of N×N=$N^2$ if all the square-shaped isles are connected in electrical series, or by a factor of K if all the triangular-shaped isles are connected in series. And while the main/master cell or icell has a maximum-power (mp) current of $I_{mp}$, and a maximum-power voltage of $V_{mp}$, each series-connected isle (or sub-groups of isles connected in parallel and then in series) will have a maximum-power current of $I_{mp}/N^2$ (assuming $N^2$ isles connected in series) and a maximum-power voltage of $V_{mp}$ (no change in voltage for the isle). Designing the first and second metallization layer patterns, M1 and M2 respectively, such that the isles on a shared continuous or continuous backplane are connected in electrical series results in a main/master cell or icell with a maximum-power current of $I_{mp}/N^2$ and a maximum power voltage of $N^2 \times V_{mp}$ or a cell (icell) maximum power of $P_{mp}=I_{mp} \times V_{mp}$ (the same maximum power as a master cell without mini-cell partitioning).

Thus, a monolithically isled master cell or icell architecture reduces ohmic losses due to reduced solar cell current and allows for thinner solar cell metallization structure generally and a much thinner M2 layer if applicable or desired. Further, reduced current and increased voltage of the master cell or icell allows for relatively inexpensive, high-efficiency, maximum-power-point-tracking (MPPT) power optimizer electronics to be directly embedded into the PV module and/or integrated on the solar cell backplane.

Assume a main/master cell or icell with S square-shaped or pseudo-square shaped pattern of isles (where S is an integer and assume S=N×N) or P triangular isles (where P is an integer, for example 2 or 4) with each adjacent set of P trench-isolated triangular isles forming a square-shaped sub-group of isles. Each adjacent set of P triangular isles forming a square-shaped sub-group may be connected in electrical parallel and the set of S sub-groups are connected in electrical series. The resulting main cell will have a maximum-power current of $I_{mp}/S$ and a maximum power voltage of $S \times V_{mp}$. In practice, the reduced current and increased voltage of the isles may also allow for a relatively inexpensive, high-efficiency, maximum-power-point-tracking (MPPT) power optimizer electronics to be directly embedded into the PV module and/or integrated on the solar cell backplane. Moreover, the innovative aspects of an icell also enable distributed shade management based on implementation of inexpensive bypass diodes (e.g. pn junction diodes or Schottky diodes) into the module, for instance, one bypass diode embedded with each solar cell prior to the final PV module lamination. In a metallization embodiment, the M1 metallization layer may be a busbarless, fine-pitch (base-to-base pitch in the range of approximately about 200 µm to 2 mm, and more specifically in the range of about 500 µm to 1,500 µm) interdigitated Al and/or Al/Si metal finger pattern (formed by screen printing or PVD and post-PVD patterning) contained within each isle. For each isle, the M1 fingers may be slightly recessed from the partitioning trench isolation edges (for example recessed or offset from the isle trench isolation edges by approximately 50 µm to 100's µm). In other words, the M1 fingers for each isle in the master cell are electrically isolated and physically separated from each other (the M1 pattern corresponding to a particular isle may be referred to herein as an M1 unit cell).

The electrical interconnection configuration of the isles (all series, hybrid parallel-series, or all parallel) may be defined by the M2 pattern design wherein M1 serves as an on-cell contact metallization for all of the master cell isles and M2 provides high-conductivity metallization and electrical interconnection of the isles within the icell or master cell.

Moreover, the enhanced-voltage/reduced-current main/ master solar cell or icell provides for the integration of a relatively inexpensive, high-performance, high-efficiency maximum-power-point-tracking (MPPT) power optimizer electronics embedded within each module and associated with each icell and/or each isle, —thus providing enhanced power and energy harvest capability across a master cell having shaded, partially shaded, and unshaded isles. Similarly, each icell or even each isle within each icell may have its own inexpensive bypass diode (pn junction diode or Schottky barrier diode) in order to provide distributed shade management capability for enhanced solar cell protection and power harvest under shading and partial shading conditions. An all-parallel electrical connection of isles provided by an all-parallel M2 pattern, as compared to all-series or hybrid parallel-series connection, also provides some of the numerous advantages of a monolithically isled solar cell as described above, particularly the increased flexibility and bendability of the resulting icells and PV modules.

In some embodiments, a monolithic isled master cell or icell may integrate monolithically-integrated bypass switch (MIBS) with each icell and/or with each isle in the icell to provide high-performance lightweight, thin-format, flexible, high-efficiency (e.g., greater than 20%) solar modules with distributed shade management—for example a pn junction diode, such as a rim pn junction diode, formed around the periphery of each isle. Alternatively, the MIBS device may be a metal-contact Schottky diode, such as a rim Schottky diode formed around the periphery of each isle made of, for example, an aluminum or aluminum-silicon alloy Schottky contact on n-type silicon. The pn junction MIBS diode pattern may be one of many possible pattern designs. For instance, in one MIBS diode pattern the rim diode p+ emitter region is a continuous closed-loop band sandwiched between (or surrounded by) the n-type base regions.

While standard rigid glass modules (for instance, using copper-plated cells and discrete shade management components) may be used to reduce module manufacturing costs for isled solar cells (icells), further weight and cost reductions may be achieved by incorporating MIBS, eliminating copper plating and the discrete bypass diode components. MIBS integration benefits for a monolithic isled master cell include materials cost reductions combined with substantial manufacturing risk mitigation and higher manufacturing yield due to process simplification (no plating, much reduced cracks) and enhanced overall projected reliability (for example by eliminating the discrete components from cells). Thus, a monolithic isled MIBS integrated master cell module may reduce the weight, reduce the volume/size (and thickness), and increase power density (W/kg) of the module by significant factors—further reducing installed system Balance of System (BOS) costs.

A monolithic isled MIBS integrated master cell module may provide some or all of the following advantages: distributed MIBS shade management without external components; a relatively small average module weight per unit area, for instance, on the order of approximately 1.2 kg/m$^2$ (~0.25 lb/ft$_2$), which may be at least 10× lighter than the standard rigid c-Si modules; module power density of approximately 155 W/kg (~70 W/lb), which is at least 10× higher than the standard rigid c-Si modules; high-efficiency (greater than 20%) lightweight flexible modules for various applications; module shipping weight and volume (per MW shipped) reductions by approximately 10× and 40×, respectively; reduced overall BOS cost, enabling a lower installed PV system cost compared to installed PV system costs using standard rigid c-Si modules; and reduced BOS and miscellaneous costs relating to shipping and handling, labor, mounting hardware, and wiring costs.

MIBS formation may be integrated and performed concurrent with partitioning trench isolation formation processing. If a rim diode design is utilized, the monolithically integrated bypass switch (MIBS) rim may also provide the additional benefit of mitigating or eliminating the generation and/or propagation of micro-cracks in the solar cell during and/or after fabrication of the solar cells.

A full-periphery through-silicon partitioning trench separating and isolating the rim bypass diode from the isles may have, for example, an isolation width in the range of a few microns up to about 100 microns depending on the laser beam diameter (or capability of the trenching process if using a process other than laser trenching) and semiconductor layer thickness. A typical trench isolation width formed by pulsed nanoseconds (ns) laser scribing may be around 20 to 50 microns although the trench isolation width may be smaller. While pulsed laser ablation or scribing is an effective and proven method to form the trench isolation regions, it should be noted that other non-mechanical and mechanical scribing techniques may also be used instead of laser scribing to form the trench isolation regions for all trench formation processing. Alternative non-laser methods include plasma scribing, ultrasonic or acoustic drilling/scribing, water jet drilling/scribing, or other mechanical scribing methods.

Figure 44A:
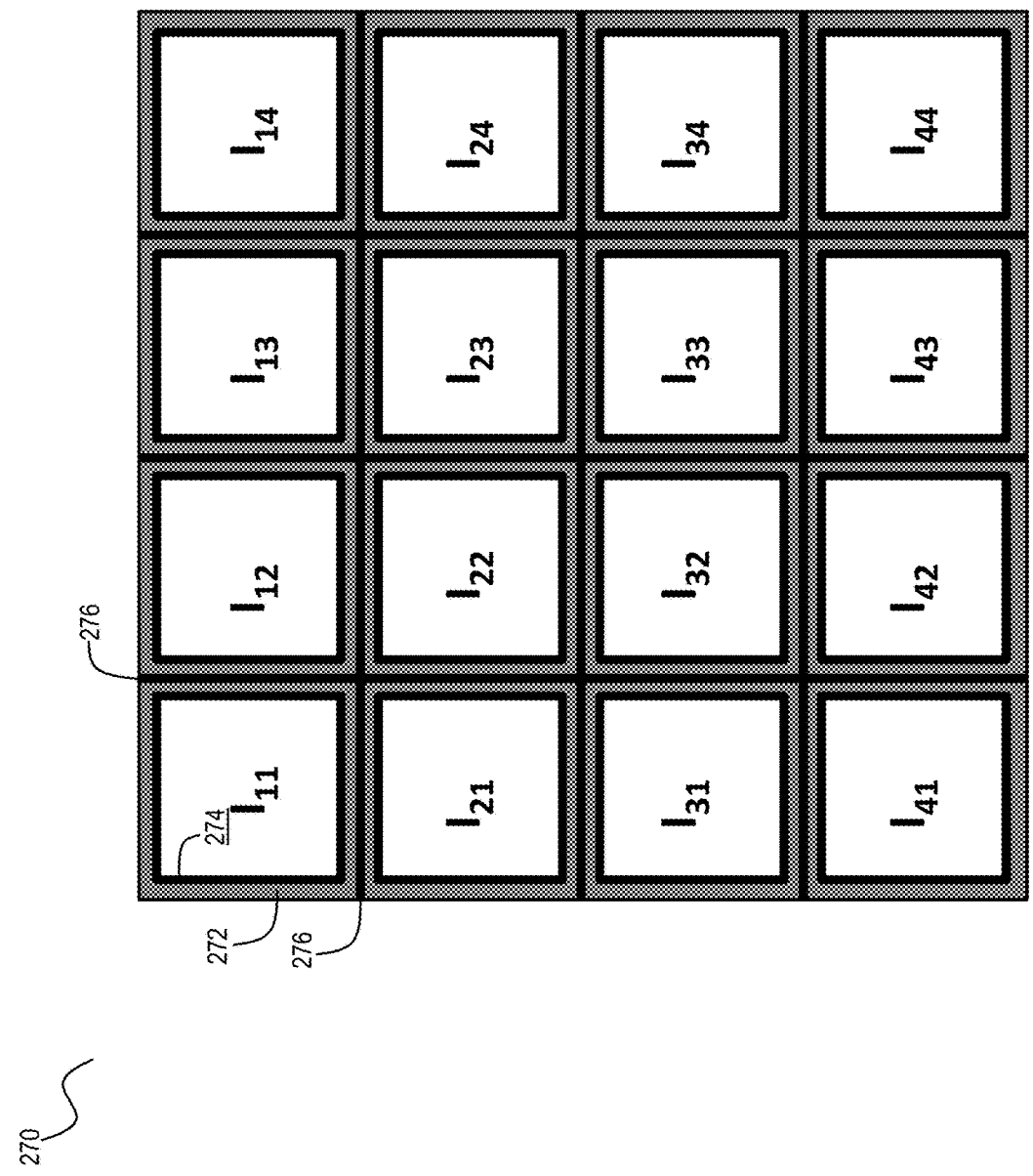
FIG. 44A is a schematic diagram showing a sunnyside view of isled master cell.

FIG. 44A is a schematic diagram showing a sunnyside view of isled master cell with a plurality of isles (example shows 4×4 isles) and monolithically-integrated bypass switch or MIBS devices integrated with the isles. This is an embodiment of MIBS using full-periphery bypass diodes isolated from the solar cells using full-periphery isolation trenches for an icell sharing a continuous backplane.

FIG. 44A is a schematic diagram showing a sunnyside plan view of isled MIBS (Monolithically Integrated Bypass Switch) master cell 270 (icell embodiment shown with 4×4 array of square-shaped isles) with a plurality of full-periphery closed loop MIBS bypass diodes, for example MIBS bypass diode 272 electrically isolated from isle $I_{11}$ by isle partitioning isolation trench 274. Each isle ($I_{11}$ through $I_{44}$)

isolated by full-periphery partitioning trenches (either formed by laser ablation/scribing or scribed by another suitable technique as described above), such as cell isolation trenches 276, to form an icell with a 4×4 array of isles (a solar cell comprising a plurality of mini-cells or isles) sharing a shared continuous backplane and formed from a common originally continuous and subsequently partitioned solar cell semiconductor substrate.

FIG. 44A shows the sunnyside view of the MIBS-enabled solar cell (icell) with mini-cells or isles and full-periphery closed-loop rim diodes (either pn junction diodes or Schottky barrier diodes). Each mini-cell isle $I_{11}$ through $I_{44}$ has a corresponding full periphery isolation trench (276) and full-periphery MIBS rim diode (such as MIBS bypass diode 272 and periphery isolation trench 274 for cell $I_{11}$)—thus each mini cell or isle has a corresponding MIBS rim diode, or in other words there is one MIBS rim diode per isle or mini cell. The isles or mini-cells may be electrically connected in series through the cell metallization pattern design although other connections such as parallel or a hybrid combination of series and parallel are also possible.

As a representative example, FIG. 44A shows a 4×4 array of equally sized and shaped mini-cells and each mini-cell having a corresponding full-periphery closed-loop rim diode. In general, this architecture may use N×N array of mini-cells and corresponding full-periphery closed-loop rim diodes with N being an integer equal to or greater than two to form mini-cell array. And while FIG. 44A shows a symmetrical N×N mini-cell array for a full-square-shaped solar cell, the mini-cell or isle array design may have an asymmetrical array of N×M mini-cells. The mini-cells or isles may be square-shaped (when N=M for a square-shaped master cell) or rectangular (when N is not equal to M and/or the master cell is rectangular instead of square shaped), or various other geometrical shapes.

Further, the mini-cells of a master cell (again, a master cell refers to an array of mini-cells or isles sharing a common continuous backplane and all originating from the same original solar cell semiconductor substrate subsequently partitioned into the plurality of mini-cell or isle regions by partitioning trenches) may optionally have substantially equal areas although this is not required. The semiconductor layers for the array of isles or mini-cells are electrically isolated from each other using partitioning trench isolation formed by a suitable scribing technique such as laser scribing or plasma scribing. Moreover, each mini-cell or isle semiconductor substrate is partitioned and isolated from its corresponding full-periphery closed-loop MIBS diode semiconductor substrate using trench isolation. All the trench isolation regions on the master cell may be formed during the same manufacturing process step, for example using a single laser-scribe process step during the cell fabrication process flow.

Figure 44B:
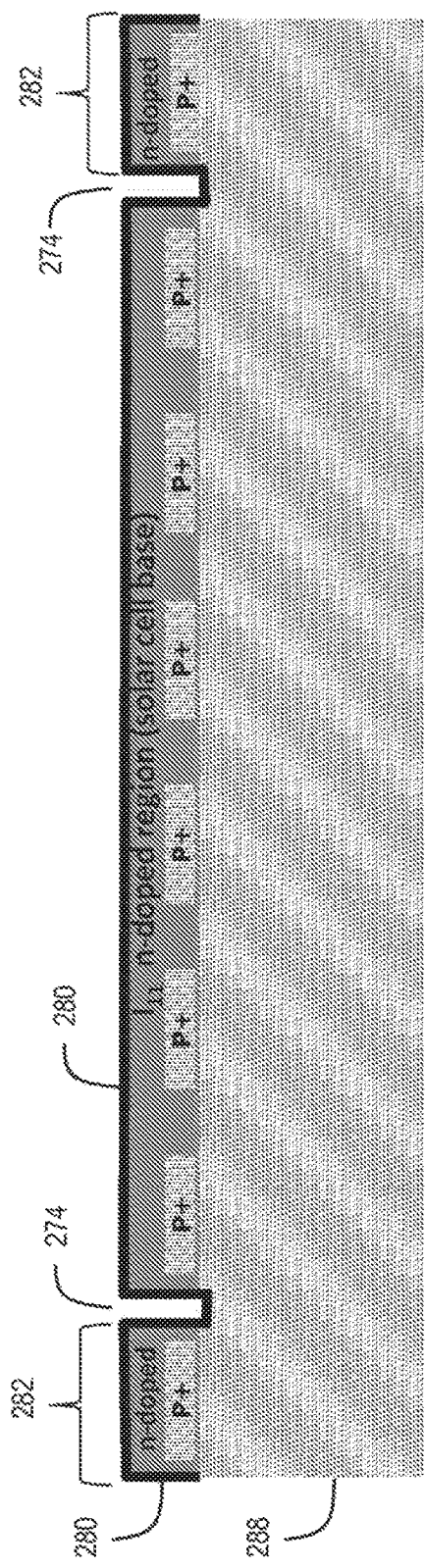
FIGS. 44B and 44C are cross-sectional diagrams detailing MIBS rim or full-periphery diode solar cell embodiments of the back-contact/back-junction solar cell for one isle.
Figure 44C:
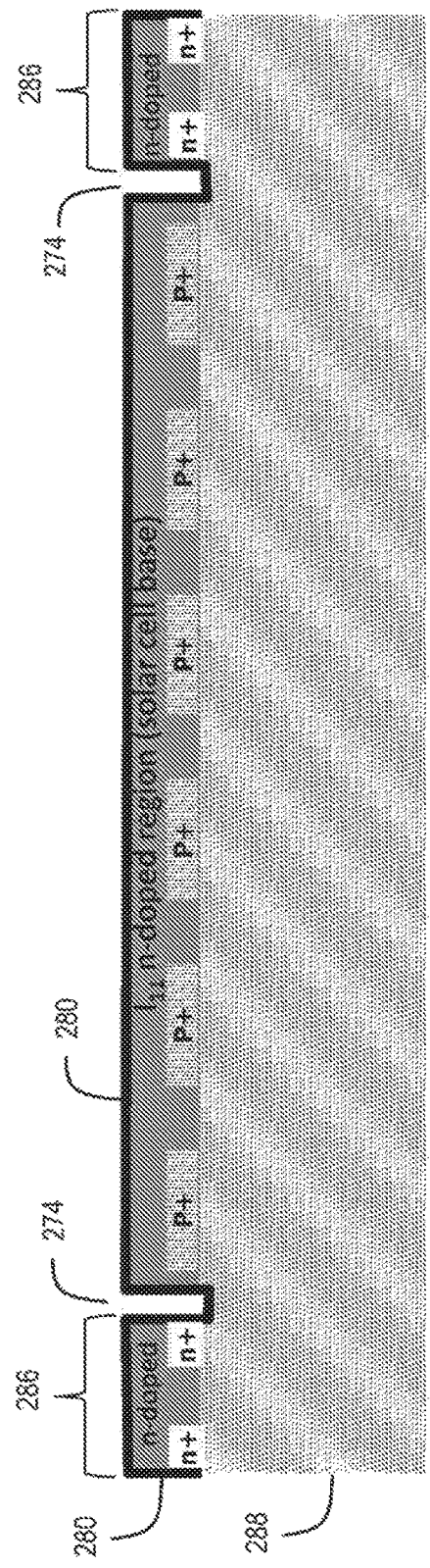

FIGS. 44B and 44C are cross-sectional diagrams detailing MIBS rim or full-periphery diode solar cell embodiments of the back-contact/back-junction solar cell for one isle (or unit cell such as $I_{11}$ in FIG. 44A) on a shared continuous backplane 288 after completion of manufacturing processes to form a MIBS-enabled back-contact/back-junction isled master cell such as that shown in FIG. 44A, including frontside passivation and ARC coating on the textured surface of the solar cell (and MIBS device) shown as passivation/ARC coating layer 280 in the solar cell in the MIBS device. The solar cell isle and MIBS structural details such as the patterned M1 and M2 metallization layers are not shown here. FIG. 44B shows a MIBS implementation using a pn junction peripheral rim diode bypass switch. Trench-isolated MIBS rim pn junction diode region 282 (isolated from isle $I_{11}$ by corresponding isolation trench 274) comprises an n-doped (e.g., phosphorus doped) region and a p+ doped (e.g., heavily boron doped) region and is used as a pn junction diode bypass switch. MIBS rim pn junction diode region 282 may be a full peripheral rim diode, for example with a width in the range of about 200 to 600 microns (smaller or larger dimensions are also possible as described earlier). The MIBS rim diode and solar cell relative dimensions are not shown to scale. In one fabrication embodiment, FIG. 44B shows a backplane-laminated (or backplane-attached) MIBS-enabled solar cell after completion of manufacturing processes for a MIBS-enabled back-contact/back-junction (IBC) solar cell comprising completion of back-contact/back-junction cell processing through patterned first-level metallization or M1 (for example made of screen printed or PVD aluminum or aluminum-silicon alloy or another suitable metal comprising nickel, etc.), backplane lamination, epitaxial silicon lift-off release and separation from a crystalline silicon reusable template (if using an epitaxial silicon lift-off process to form the substrate—this process not applicable when using a starting crystalline silicon wafer), formation of trench isolation regions (e.g., by pulsed laser scribing or cutting) to define the MIBS rim diode border, optional silicon etch, texture and post-texture clean, passivation & ARC deposition (e.g., by PECVD or a combination of ALD and PECVD), and fabrication of the final patterned second-level metal or M2 (along with the conductive via plugs) on the backplane.

As can be seen in FIG. 44B, the process used to form the p+ emitter regions (field emitter regions and/or heavily doped emitter contact regions) of the solar cell may also be used to form p+ junction doping for the MIBS pn junction formation. The patterned M1 metal (not shown), for example made of aluminum or an aluminum alloy such as aluminum with some silicon addition, not only provides the contact metallization or the first-level metallization for the solar cell but also creates metallization contacts (to both the p+ region and the n-type substrate region through n+ doped contact windows) for the MIBS pn junction diode. The n-doped silicon region of the MIBS pn junction diode is formed from the same n-type silicon substrate which also serves as the base region of the solar cell (e.g., from the n-type silicon wafer when using starting n-type crystalline silicon wafers without epitaxy, or from in-situ-doped n-type crystalline silicon layer formed by epitaxial deposition when using epitaxial silicon lift-off processing to form the solar cell and MIBS substrate)—the substrate bulk region doping may also be referred to as the background doping of the substrate. The patterned M1 and M2 metallization structures complete the required monolithic solar cell and MIBS pn junction diode electrical interconnections and also ensure the MIBS diode terminals are properly interconnected to the respective solar cell base and emitter terminals to provide cell-level integrated shade management and continual solar cell protection against shading. As can be seen in FIG. 44B, the sidewall edges and the top surface of the MIBS pn junction diode are also passivated using the same passivation layer(s) and processes used to passivate the sunny-side and edges of the solar cell, passivation/ARC coating layer(s) 280. FIG. 44A does not show some details of the solar cell and MIBS structure such as the patterned M1 and M2 metallization, rear side passivation layer, M1 contact holes, M1-M2 via holes through the backplane, and the n+ doped contact windows for n-type substrate M1 connections in the MIBS device structures.

FIG. 44C shows a MIBS implementation using a peripheral Schottky rim diode bypass switch. Isolated Schottky rim diode bypass switch region 286 (isolated from isle $I_{11}$ by corresponding isolation trench 274) comprises an n-doped region and an inner and outer n+ region and is used as a Schottky diode bypass switch. Schottky rim diode bypass switch region 286 may be a full peripheral rim diode with a width in the range of 200 to 600 microns (this dimension may be chosen to be larger or smaller than this range).

In one fabrication embodiment, FIG. 44C shows a backplane-laminated or backplane-attached MIBS-enabled solar cell after completion of manufacturing processes for the MIBS-enabled back-contact/back-junction isled master cell comprising completion of the back-contact/back-junction cell processing through a patterned first-level metallization or M1 (for example made of a suitable conductor which can serve as both an effective ohmic contact on heavily doped silicon as well as an effective Schottky barrier contact on lightly doped silicon, such as aluminum or aluminum-silicon alloy), backplane lamination, epitaxial silicon lift-off release and separation from a crystalline silicon reusable template when using an epitaxial lift off silicon substrate (this process not applicable or required when using starting crystalline silicon wafers instead of epitaxial lift off substrates), formation of the trench isolation (e.g., by pulsed laser scribing or cutting) to define MIBS rim Schottky diode border, optional silicon thinning etch, texture and post-texture clean, formation of passivation and ARC (e.g., by PECVD or a combination of PECVD with another process such as ALD), and fabrication of a final patterned second-level metal or M2 on the backplane (in conjunction with the conductive M1-M2 via plugs).

As can be seen in FIG. 44C, the n-type silicon substrate also used as the base region of the solar cell (for instance formed through in-situ-doped epitaxial deposition when using epitaxial lift off processing, or from a starting n-type crystalline silicon wafer when not using epitaxial lift off processing) is also used as the n-type silicon substrate region for the MIBS Schottky diode. The M1 metal (not shown), for example made of aluminum or a suitable aluminum alloy such as aluminum with some silicon addition, not only makes the M1 ohmic contact metallization for the solar cell (for both base region through n+ doped contact openings and emitter contact region through p+ doped contact openings of the solar cell), but also creates the metallization contacts for the MIBS Schottky diode (both the non-ohmic Schottky barrier contact on the lightly doped n-type silicon substrate region and the ohmic contact to n-type silicon through heavily doped n+ doped regions). The lightly doped n-type silicon substrate region of the MIBS diode is from the same n-type substrate used for the solar cell and serving as its base region (e.g., the n-type substrate may be formed by in-situ-doped n-type epitaxial silicon deposition when using epitaxial silicon lift-off processing, or from a starting n-type crystalline silicon wafer when not using epitaxial silicon lift off processing). The heavily doped n+ diffusion doping of the n-type silicon region for the MIBS Schottky diode ohmic contacts to the n-type silicon substrate may be formed at the same time and using the same process also used for producing the heavily doped n+ doped base contact regions for the solar cell (in preparation for the subsequent patterned M1 metallization). The combination of patterned M1 and M2 metallization structures complete the solar cell and MIBS Schottky diode electrical interconnections and ensure the MIBS diode terminals are properly connected to the solar cell terminals to provide cell-level integrated shade management and solar cell protection. As can be seen FIG. 44C, the sidewall edges and the top surface of the MIBS Schottky diode are also passivated using the same passivation and ARC layer(s) and process(es) used to form the passivation and ARC layer(s) on the sunny-side and edges of the solar cell—note passivation/ARC coating layer(s) 280. Again, FIG. 44C does not show some structural details of the solar cell structure including but not limited to the patterned M1 and M2 metallization layers.

The monolithically isled solar cells, and optionally MIBS embodiments, disclosed herein employ trench isolation in conjunction with a shared backplane substrate to establish partitioning and electrical isolation between the semiconductor substrate regions (isles) and also optionally for the MIBS device and adjacent isles or solar cell region. One method to create the trench isolation regions is pulsed (such as pulsed nanoseconds) laser scribing. Below is a summary of key considerations and laser attributes for using a laser scribing process to form the trench isolation regions which partition and electrically isolate substrate region(s).

Pulsed laser scribing for trench isolation formation may use a pulsed nanoseconds (ns) laser source at a suitable wavelength (e.g., green, or infrared or another suitable wavelength to ablate the semiconductor layer with relatively good selectivity to cut through the semiconductor substrate layer with respect to the backplane material) commonly used and proven for scribing and cutting through silicon. The laser source may have a flat-top (also known as top-hat) or a non-flat-top (e.g., Gaussian) laser beam profile. It's possible to use a pulsed laser source wavelength which is highly absorptive in silicon but can partially or fully transmit through the backplane (hence, cut through the semiconductor layer without substantially removing the backplane material after the through-semiconductor layer laser cutting is complete and the beam reaches the backplane sheet). For instance, we may use a pulsed nanoseconds IR or green laser beam which may effectively cut through the silicon substrate layer and partially transmit through the backplane material (hence, removing little to negligible amount of backplane material during the trench isolation cut).

The pulsed laser beam diameter and other properties of the pulsed nanoseconds laser source may be chosen such that the isolation scribe width is in the range of a few microns up to 10's of microns as a width much larger than about 100 microns would be rather excessive and result in unnecessary waste of precious silicon substrate area and some reduction of the total-area efficiency of the solar cells and modules. Thus, it is beneficial to minimize the trench isolation areas as compared to the highly desirable solar cell area. In practice, pulsed nanoseconds laser cutting can produce trench isolation regions with width in the desirable range of about 20 microns up to about 60 microns. For instance, for a 156 mm×156 mm solar cell, a trench isolation width of 30 microns corresponds to an area ratio of 0.077% for the trench isolation area as a fraction of the cell area. This represents a rather negligible area compared to the solar cell area, in other words, this small ratio provides negligible waste of solar cell area and ensures negligible loss of total-area solar cell and module efficiency.

Pulsed nanoseconds (ns) laser scribing or cutting to form trench isolation may be performed immediately after the backplane lamination process when using starting crystalline silicon wafers to fabricate the solar cells (and in the case of solar cells using epitaxial silicon lift-off processing, after completion of the backplane lamination process and subsequent lift-off release of the laminated cell from the reusable template and after or before pulsed laser trimming of the solar cell) in a back-contact/back-junction solar cell fabrication process as described herein. In the case of solar cells fabricated using epitaxial silicon lift-off processing, the trench isolation scribing or cutting process may optionally use the same pulsed laser tool and source used for pre-release scribing of the epitaxial silicon layer to define the lift-off release boundary and/or used for post-release trimming of the laminated solar cell. Thus, no additional laser process tool may be needed in order to form the trench isolation regions.

Pulsed nanoseconds (ns) laser scribing to form trench isolation may also be used to partition the isles and define the fully isolated MIBS rim diode region outside an isolated solar cell island surrounded by and defined by the rim. Alternatively, the pulsed ns laser scribing process may form other designs of the MIBS diode, such as in a multiple MIBS diode island design as well as and many other possible MIBS pattern designs.

Pulsed laser scribing may be used to cut through the thin (such as sub-200 microns and more particularly sub-100 microns) silicon substrate layer (from the sunny side) and substantially stop on the backplane material sheet. If desired and/or required, a simple real-time in-situ laser scribe process end-pointing, such as using reflectance monitoring, may be used for process control and endpointing to minimize trenching or material removal in the backplane sheet while enabling complete through-semiconductor-layer laser cut.

The sidewalls of the solar cell and the MIBS rim diode regions may be subsequently wet etched (for instance, as part of the solar cell sunny-side wet etch/texture process), post-texture cleaned, and passivated (by deposition of the passivation and ARC layer) during the remaining solar cell fabrication process steps.

The MIBS diode may be a pn junction diode used as the MIBS bypass device or shade management switch. A pn junction MIBS diode fabrication process to produce a MIBS-enabled solar cell of may have the following, among others, attributes and benefits:

In some solar cell processing designs, there may be essentially no change (or minimal change) to the main solar cell fabrication process flow to implement MIBS (for example a back-junction/back-contact crystalline silicon solar cell fabrication using either crystalline silicon starting wafers or epitaxial silicon and porous silicon/lift-off processing in conjunction with a reusable crystalline silicon template, and an electrically insulating backplane). Thus, there may be essentially no added processing cost to implement MIBS along with the solar cells (icells) disclosed herein.

In a back-contact/back-junction epitaxial silicon lift-off cell process, following the completion of the on-template cell processing involving most of the back-contact, back-junction cell process steps, the following processes may be performed (provided as an example of various possible process flows): (i) backplane lamination to the solar cell backside; (ii) pre-release trench scribe (for example using a pulsed nanoseconds laser scribe tool or alternatively using another scribing tool such as plasma scribe) of the thin epitaxial silicon substrate to define the epitaxial silicon lift-off release boundary; (iii) mechanical lift-off release of the backplane-supported cell and its detachment from the reusable crystalline silicon template; (iv) laser trim (for example using a pulsed nanoseconds laser source) of the backplane-laminated cell for precision trim and to establish the final desired dimensions for the solar cell in conjunction with its associated MIBS; (v) pulsed nanoseconds laser scribing (or plasma scribing or another suitable scribing technique) on the sunny-side of the solar cell to form the trench isolation region(s) and to define the inner solar cell island(s) and the peripheral rim diode(s) regions, this step providing the isles and corresponding MIBS regions; (vi) and, subsequent cell processing such as sunny-side texture and post-texture clean followed by additional cell process steps such as PECVD sunny-side passivation and anti-reflection coating (ARC) layer deposition and final cell metallization including patterned second level metallization if applicable. When using starting crystalline silicon wafer instead of epitaxial silicon lift-off processing, the process flow is fairly similar to the flow described above, except that there is no reusable template, porous silicon, epitaxial silicon, or release process. In the process flow described above for the solar cells made using epitaxial silicon lift-off processing, the trench isolation scribing process and tool may be essentially the same as the process and tool used for pre-release trench scribe and/or the post-release precision trim of the backplane-laminated solar cell and MIBS substrate.

The laser scribed trench isolation process may be performed (for example using a pulsed nanoseconds laser source) to create complete through-semiconductor trench(es) within the semiconductor layer through the entire thickness of the crystalline silicon layer and substantially stopping at the backplane—thus forming the electrically isolated n-type silicon rim region for the MIBS diode and the n-type silicon island region for solar cell assuming an n-type base and p+ emitter solar cell (a common doping type for a back-contact/back-junction IBC solar cell).

In an all-series-connected cell, an M2 cell metallization design which results in sufficiently low or negligible ohmic losses should be used due to the current flow on lateral M2 connectors between the adjacent series-connected columns. Lateral M2 jumpers or connectors (which may be formed in conjunction with the patterned M2 layer) are used to interconnect the adjacent columns of icell in electrical series.

Figure 45:
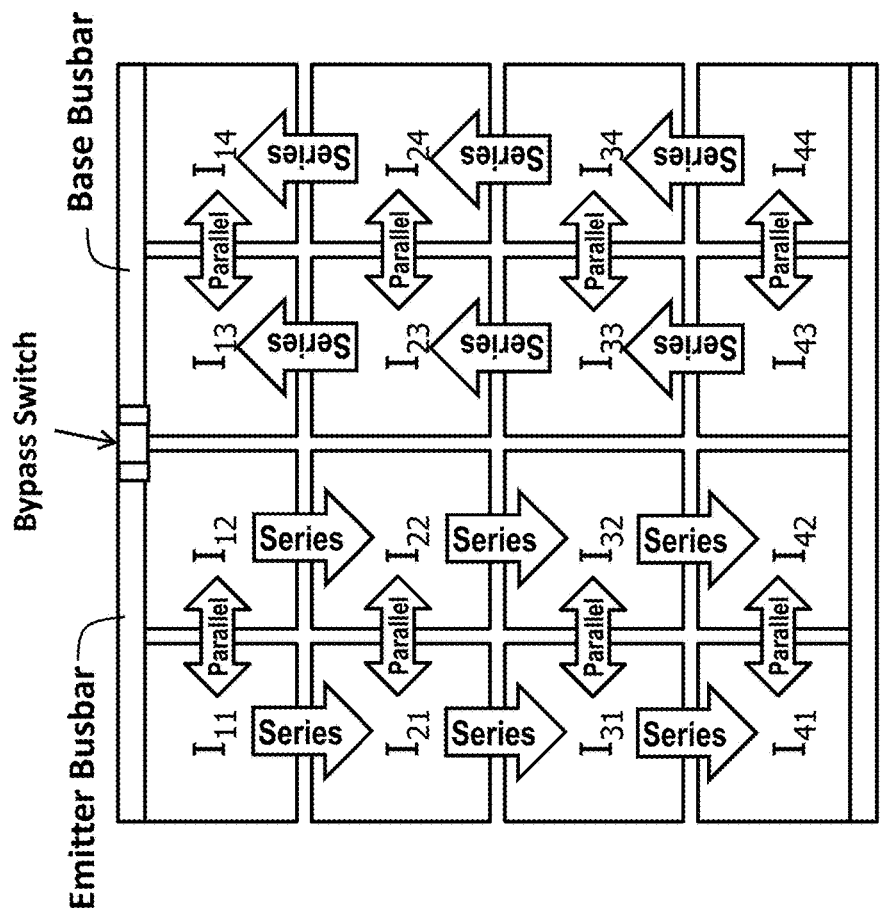
FIG. 45 is a top view of an icell having a 4×4 array of sub-cells connected in a 2×8 hybrid parallel design.
Figure 46:
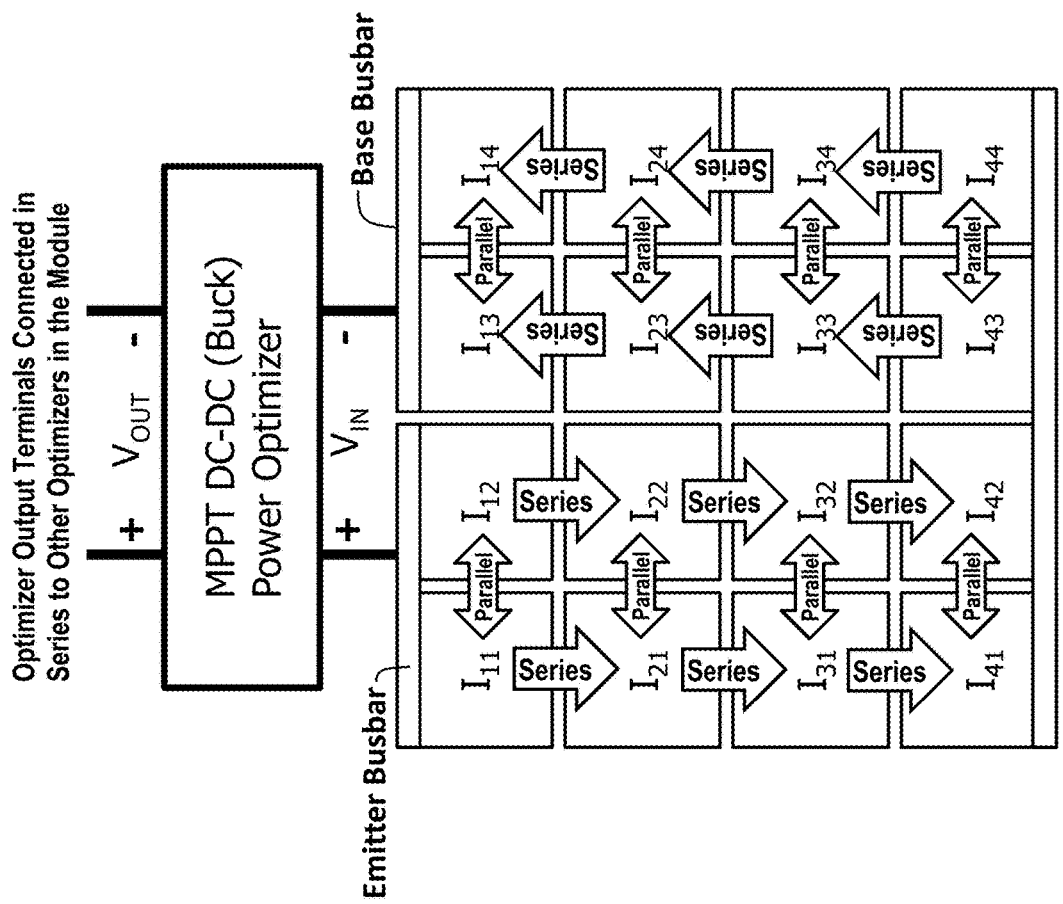
FIG. 46 shows the icell of FIG. 45 utilizing an MPPT DC-DC buck converter.

FIG. 45 is a top view of an icell having a 4×4 array of sub-cells connected in a 2×8 hybrid parallel design. As noted, the disclosed solar cell results in much less current which allows for the use of inexpensive (≤$0.01/$W_p$) shade-management switch (bypass switch) as well as inexpensive, high-efficiency or high power transfer efficiency (e.g., >98%) MPPT DC-DC buck converter/power optimizer. FIG. 46 shows the icell of FIG. 45 utilizing an MPPT DC-DC buck converter/power optimizer in accordance with the disclosed subject, thus providing for low-cost, distributed, embedded smart module power electronics solutions.

Figure 47:
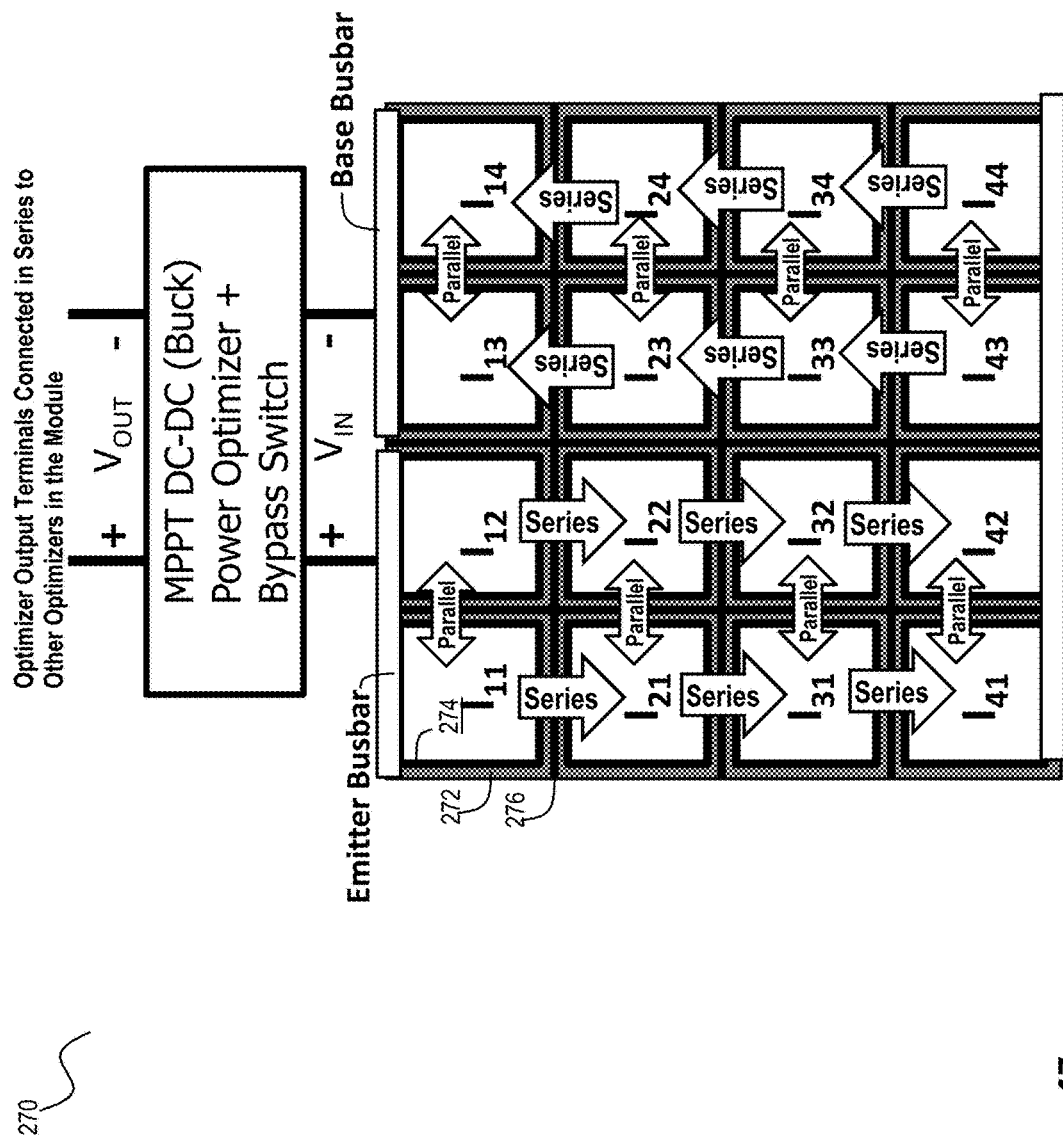
FIG. 47 shows the cell of FIG. 44A—the sunnyside view of the MIBS-enabled solar cell (icell) with mini-cells or isles and full-periphery closed-loop rim diodes (either pn junction diodes or Schottky barrier diodes)—utilizing an MPPT DC-DC buck converter.

FIG. 47 shows the cell of FIG. 44A—the sunnyside view of the MIBS-enabled solar cell (icell) with mini-cells or isles and full-periphery closed-loop rim diodes (either pn junction diodes or Schottky barrier diodes)—utilizing an MPPT DC-DC buck converter power optimizer in accordance with the disclosed subject. The solar cell of FIG. 47 is a exemplary embodiment of an icell with distributed MIBS.

Considerations relating to combination of iCell and Discrete Bypass Switch vs. Combination of iCell and Distributed MIBS vs. combination of iCell and Discrete Bypass Switch and Distributed MIBS for Distributed Shade Management are described in detail below. Distributed shade management for PV modules with iCells may use one of the following:

A discrete bypass switch (e.g., a Schottky Barrier Rectifier or SBR) with each iCell (across busbars)

Distributed MIBS with each iCell (e.g., a monolithically integrated SBR with each isle or sub-cell)

A combination of both 1 and 2 above: distributed MIBS and a discrete bypass diode with each iCell.

When only using a discrete bypass switch with iCell, the power dissipation of the bypassed shaded iCell is the power dissipation of the forward-biased bypass switch. For instance, when using a 2×8HPS iCell with $I_{mp}$=1.16 A with an SBR with $V_f$=0.35 V: Shaded iCell Power Dissipation=1.16 A×0.35 V=0.406 W. This power dissipation for shaded iCell is about 8% of the unshaded iCell power generation, hence, a relatively small power dissipation when the bypass diode is activated for a shaded cell.

When only using distributed MIBS with iCell, the power dissipation of the fully bypassed shaded iCell is the power dissipation of the forward-biased MIBS devices. For instance, when using a 2×8HPS iCell with $I_{mp}$=1.16 A with distributed MIBS SBRs, each with $V_f$=0.35 V: Shaded iCell Power Dissipation=1.16 A×0.35 V×8=0.406 W=3.25 W. This power dissipation for shaded iCell+MIBS is about 62% of the unshaded iCell power generation The combination of iCell, distributed MIBS (i.e., a bypass switch such as Schottky Barrier Rectifier, SBR, per isle or sub-cell in the iCell), and one discrete bypass switch (e.g., an SBR) may provide advantages in some instances when compared to using either only a discrete bypass switch or only distributed MIBS per iCell in terms of reliability and fault tolerance of the cells and module. For example, with distributed MIBS, there are no soldered junctions and no external discrete component to fail. The distributed MIBS diodes may be made monolithically with and have the same reliability as the iCell. Discrete bypass switch provides a lower power dissipation for fully shaded/bypassed iCell while the distributed MIBS provides true fault tolerance (in case of a discrete bypass switch failure in iCell). The combination of iCell and Discrete Bypass Switch and Distributed MIBS for Distributed Shade Management combination provides truly fault-tolerant and high-performance distributed PV module shaded management, providing the combination of overall PV system reliability, fault tolerance, low-power-dissipation shade management, and enhanced power harvesting capability.

Combination of iCell, Distributed MIBS, and MPPT DC-DC Power Optimizer vs. combination of iCell, Discrete Shade Management Bypass Switch, and MPPT DC-DC Power Optimizer for Enhanced Power Harvesting of PV Modules.

The distributed MPPT DC-DC (Buck) Power Optimizers (e.g., one MPPT power optimizer per cell or per group of electrically interconnected cells) can be implemented with the solar cells (e.g., iCells) in a solar module in one of several possible configurations as outlined below:

Option 1: MPPT DC-DC Power Optimizer without either an input-stage or an output-stage bypass switch in the optimizer circuit connected to an iCell (without distributed MIBS)—in some instances, may be considered a poor option as there is no distributed shade management capability for a fully shaded cell.

Option 2: MPPT DC-DC Power Optimizer with either an input-stage or an output-stage bypass switch (e.g., an SBR) within the optimizer circuit, connected to an iCell (without distributed MIBS).

Option 3: MPPT DC-DC Power Optimizer without either an input-stage or an output-stage bypass switch within the optimizer circuit, connected to an iCell with distributed MIBS.

Option 4: MPPT DC-DC Power Optimizer with either an input-stage or an output-stage bypass switch within the optimizer circuit, connected to an iCell with distributed MIBS—in some instances, may be considered the most desirable option: it provides distributed MPPT power harvest, shade management, fault tolerance.

When a solar cell (e.g., iCell) is shaded relatively uniformly and the reduced solar irradiance is relatively uniform over the entire iCell area (i.e., all the sub-cells or isles in the iCell can produce substantially similar electrical power or current levels), all the above-mentioned Options 1 through 4 produce similar power harvesting from the affected (shaded) iCell.

When only a fraction of a solar cell (e.g., iCell) is shaded, for instance, affecting a subset of the sub-cells within the iCell while the remaining sub-cells are not shaded and receive full solar irradiance, Options 3 and 4 (those with iCell with distributed MIBS) result in higher power harvest than Options 1 and 2 (those with iCell without distributed MIBS). Options 3 and 4 harvest the power generated by the unshaded/unaffected series-connected isles (minus the power dissipation of the shaded series-connected isles due to MIBS activation).

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A solar photovoltaic module for electric power generation, said module comprising:

a plurality of backplane-attached, back-contact solar cells embedded within a laminate said plurality of solar cells arranged to form at least one string of electrically interconnected solar cells within said laminate, each of said plurality of solar cells having a positive lead and a negative lead;

a plurality of power optimizer packages, wherein each of said plurality of solar cells includes at least one corresponding power optimizer package electrically connected to each of said plurality of solar cells and embedded within said laminate, said at least one corresponding power optimizer package electrically connected to said positive lead and said negative lead and powered with said at least one of said plurality of solar cells, said at least one corresponding power optimizer package having a pass-through circuit with a transistor switch, and said at least one corresponding power optimizer package having a switching circuit with a local maximum-power-point tracking (MPPT) optimizer electrically interconnected to said pass-through circuit, said at least one corresponding power optimizer package configured to operate in at least a non-switching pass-through mode using said pass-through circuit with said transistor switch closed and a switching mode with local maximum-power-point tracking (MPPT); and a plurality of bypass switches, which each of said plurality of solar cells includes at least one bypass switch mounted on a backside of an electrically insulating backplane and electrically interconnected to said corresponding at least one power optimizer package.

2. The solar photovoltaic module of claim 1, wherein said local maximum-power-point tracking (MPPT) optimizer is a Maximum-Power-Point-Tracking (MPPT) DC-to-DC converter circuit.

3. The solar photovoltaic module of claim 1, wherein said local maximum-power-point tracking (MPPT) optimizer is a Maximum-Power-Point-Tracking (MPPT) DC-to-DC buck converter circuit.

4. The solar photovoltaic module of claim 1, wherein said local maximum-power-point tracking (MPPT) optimizer is a Maximum-Power-Point-Tracking (MPPT) DC-to-DC buck-boost converter circuit.

5. The solar photovoltaic module of claim 1, wherein said at least one bypass switch is a discrete Schottky Barrier Rectifiers (SBRs).

6. The solar photovoltaic module of claim 1, wherein said at least one bypass switch is a discrete pn junction diode.

7. The solar photovoltaic module of claim 1, wherein said at least one bypass switch is a discrete transistor switch.

8. The solar photovoltaic module of claim 1, wherein said at least one bypass switch comprises at least one monolithically integrated bypass switch.

9. The solar photovoltaic module of claim 8, wherein said monolithically integrated bypass switch is a Schottky Barrier Rectifier (SBR).

10. The solar photovoltaic module of claim 8, wherein said monolithically integrated bypass switch is a pn junction diode.

11. The solar photovoltaic module of claim 8, wherein said monolithically integrated bypass switch is a transistor switch.

12. The solar photovoltaic module of claim 1, wherein said plurality of solar cells are monolithically isled solar cells (iCells), each of said solar cells comprising a plurality of sub-cells electrically interconnected together to provide said solar cell power with a combination of scaled-up voltage and scaled-down current.

13. The solar photovoltaic module of claim 12, wherein said scaled-up voltage for each of said solar cells is in the range of approximately 2 V to 15 V.

14. The solar photovoltaic module of claim 12, wherein said scaled-up voltage for each of said solar cells is in the range of approximately 2.5 V to 6 V.

15. The solar photovoltaic module of claim 1, wherein said at least one bypass switch is connected to output terminals of said power optimizer package.

16. The solar photovoltaic module of claim 1, wherein said at least one bypass switch is to input terminals of said power optimizer package.

17. The solar photovoltaic module of claim 12, wherein each of said plurality of solar cells further comprises a plurality of monolithically integrated bypass switches manufactured with and electrically connected to each of said plurality of solar cells.

18. The solar photovoltaic module of claim 14, each of said plurality of power optimizers further comprises one bypass switch connected to input terminals.

19. The solar photovoltaic module of claim 14, each of said plurality of power optimizers further comprises one bypass switch connected to output terminals.

20. The solar photovoltaic module of claim 2, wherein said Maximum-Power-Point-Tracking (MPPT) DC-to-DC converter circuit comprises a combination of an inductor and a capacitor for energy storage and filtering of switching ripples at its output stage.

21. The solar photovoltaic module of claim 2, wherein a plurality of said Maximum-Power-Point-Tracking (MPPT) DC-to-DC converter circuits are connected in electrical series to form a series-connected string of power optimizers and share a combination of an inductor and a capacitor for energy storage and filtering of switching ripples at the output stage of said series-connected string of power optimizers.

22. The solar photovoltaic module of claim 1, wherein said module is a monolithic module.

23. The solar photovoltaic module of claim 1, further comprising at least one remote-access module switch (RAMS) power electronic circuit having a gate switch embedded within said module laminate, electrically interconnected to and powered with said at least one string of electrically interconnected solar cells, serving as a remote-controlled module power delivery gate switch.

24. The solar photovoltaic module of claim 1, wherein said power optimizer package is a monolithic silicon CMOS integrated circuit.

25. The solar photovoltaic module of claim 1, wherein each of said plurality of solar cells has a dedicated power optimizer attached to it.

26. The solar photovoltaic module of claim 1, wherein a power optimizer is attached to a parallel-connected plurality of solar cells.

27. The solar photovoltaic module of claim 1, wherein operation in said switching mode with local maximum-power-point tracking (MPPT) comprises a proportionality algorithm based on measurements of the open-circuit voltages of said solar cells.

28. The solar photovoltaic module of claim 1, wherein operation in said switching mode with local maximum-power-point tracking (MPPT) comprises a proportionality algorithm based on measurements of the short-circuit currents of said solar cells.

29. The solar photovoltaic module of claim 1, wherein each of said power optimizer package comprises a DC-to-DC buck converter without an inductor.

30. The solar photovoltaic module of claim 1, wherein said switching mode operates at a fixed switching frequency selected in the range of about 300 KHz to 10 MHz.

31. A solar photovoltaic system, comprising:
a plurality of electrically interconnected modules for electric power generation, each of said modules comprising:
a plurality of backplane-attached, back-contact solar cells embedded within a laminate, said plurality of solar cells arranged to form at least one string of electrically interconnected solar cells within said laminate, each of said plurality of solar cells having a positive lead and a negative lead;
a plurality of power optimizer packages, wherein each of said plurality of solar cells includes at least one corresponding power optimizer package mounted on a backside of an electrically insulating backplane, electrically connected to each of said plurality of solar cells and embedded within said laminate, said at least one corresponding power optimizer package electrically connected to said positive lead and said negative lead and powered with said at least one of said plurality of solar cells, said at least one corresponding power optimizer package having a pass-through circuit with a transistor switch, and said at least one corresponding power optimizer package having a switching circuit with a local maximum-power-point tracking (MPPT) optimizer connected to said pass-through circuit, said at least one corresponding power optimizer package configured to operate in at least a non-switching pass-through mode using said pass-through circuit with said transistor switch closed and a switching mode with local maximum-power-point tracking (MPPT); and a power conversion unit with maximum-power-point tracking (MPPT) connected to and receiving power from said plurality of electrically interconnected module laminates.

32. The solar photovoltaic system of claim 31, wherein each of said plurality of solar cells further includes:

at least one metallization layer arranged on said backside of said electrically insulating backplane; and an insulating layer arranged on a side of said at least one metallization layer opposite said electrically insulating backplane, wherein said at least one corresponding power optimizer package is mounted on said insulating layer.

33. The solar photovoltaic module of claim 1, wherein each of said plurality of solar cells further includes:

at least one metallization layer arranged on said backside of said electrically insulating backplane; and an insulating layer arranged on a side of said at least one metallization layer opposite said electrically insulating backplane, wherein said at least one bypass switch is mounted on said insulating layer.

* * * * *